US010678127B2

(12) United States Patent
Boriskin et al.

(10) Patent No.: US 10,678,127 B2
(45) Date of Patent: Jun. 9, 2020

(54) PHOTOLITHOGRAPHY DEVICE FOR GENERATING PATTERN ON A PHOTORESIST SUBSTRATE

(71) Applicant: InterDigital CE Patent Holdings, SAS, Paris (FR)

(72) Inventors: Artem Boriskin, Cesson-Sevigne (FR); Laurent Blonde, Cesson-Sevigne (FR)

(73) Assignee: InterDigital CE Patent Holdings, SAS, Paris (FR)

( * ) Notice: Subject to any disclaimer, the term of this patent is extended or adjusted under 35 U.S.C. 154(b) by 0 days.

(21) Appl. No.: 16/341,942

(22) PCT Filed: Oct. 20, 2017

(86) PCT No.: PCT/EP2017/076881
§ 371 (c)(1),
(2) Date: Apr. 15, 2019

(87) PCT Pub. No.: WO2018/073427
PCT Pub. Date: Apr. 26, 2018

(65) Prior Publication Data
US 2019/0243233 A1    Aug. 8, 2019

(30) Foreign Application Priority Data

Oct. 21, 2016    (EP) .................... 16306385

(51) Int. Cl.
*G03F 1/50*    (2012.01)
*G03F 7/20*    (2006.01)
(Continued)

(52) U.S. Cl.
CPC ............ *G03F 1/50* (2013.01); *G03F 1/60* (2013.01); *G03F 7/7035* (2013.01); *B82Y 10/00* (2013.01)

(58) Field of Classification Search
CPC ... B82Y 10/00; G02B 27/4222; G03F 1/0046; G03F 1/0061; G03F 1/0084; G03F 1/50; G03F 1/60; G03F 7/7035
(Continued)

(56) References Cited

U.S. PATENT DOCUMENTS 6,569,575 B1    5/2003    Biebuyck et al.
6,753,131 B1    6/2004    Rogers et al.
(Continued)

FOREIGN PATENT DOCUMENTS

EP    1398656 A1    3/2004
JP    2005141075 A    6/2005
KR    2012111288 A    10/2012

OTHER PUBLICATIONS

Stafeev et al, "Near-field diffraction of laser light by dielectric corner step," (Proc. of SPIE vol. 9031 90311A-1) (Year: 2014).*
(Continued)

*Primary Examiner* — Colin W Kreutzer
(74) *Attorney, Agent, or Firm* — Invention Mine LLC

(57) ABSTRACT

In one embodiment of the disclosure, it is proposed a photolithography device for generating structure on a photoresist substrate, the photolithography device comprising a light illumination unit and a photomask. The photomask is remarkable in that it comprises at least one layer of dielectric material and a medium having a refractive index lower than that of said dielectric material, wherein a surface of said at least one layer of dielectric material has at least one abrupt change of level forming a step, and wherein at least a base and lateral part of said surface, with respect to said step and a propagation direction of an electromagnetic wave from said light illumination unit, is in contact with said medium.

13 Claims, 44 Drawing Sheets

(51) Int. Cl.
    *G03F 1/60* (2012.01)
    *B82Y 10/00* (2011.01)

(58) Field of Classification Search
    USPC .......................................... 355/67, 78; 430/5
    See application file for complete search history.

(56) References Cited

U.S. PATENT DOCUMENTS

| | | | |
|---|---|---|---|
| 7,541,115 | B1 | 6/2009 | Volk et al. |
| 8,052,908 | B2 | 11/2011 | Peckerar et al. |
| 2009/0068597 | A1* | 3/2009 | Shiraishi ............... G03B 27/32 430/311 |
| 2015/0177619 | A1 | 6/2015 | Kobrin et al. |
| 2016/0147138 | A1 | 5/2016 | Shih et al. |
| 2016/0187788 | A1* | 6/2016 | Onose ..................... G03F 7/7035 355/67 |
| 2016/0259253 | A1 | 9/2016 | Luo et al. |
| 2018/0354844 | A1* | 12/2018 | Drazic ..................... G02B 6/32 |
| 2019/0101700 | A1* | 4/2019 | Boriskin ................. G02B 27/56 |
| 2019/0101769 | A1* | 4/2019 | Boriskin ................. G02B 27/56 |

OTHER PUBLICATIONS

Venugopal et al., "Advances in Micro/Nana Electromechanical Systems and Fabrication Technologies" Chapter 8, Nanolithography Intech Press (2013).

Kim et al., "Fabrication of Palsmonic Nanodiscs by Photonic Nanojet Lithography" Applied Physics Express vol. 5, 025201 (Jan. 19, 2012).

Kushwaha et al., "Controlling Shaping of Photonic Nanaojets Using Core Shell Microspheres" International Conferencence on Optics and Photonics, Proceedings of SPIE vol. 9654, 96541H (2015).

Timoschenko, "Scanning Nanaojet Lithograph and Microsope" Proceedings of SPIE vol. 6937, 69373R (2007).

Xie et al., "Nanoscale Materials Patterning and Engineering by Atomic Force Microsopy Nanolithography" Material Science and Engineering R54 I-48 (Nov. 28, 2006).

Wu et al., "A Deep Sub-Wavelength Process for the Formation of Highly Uniform Arrays of Nanoholes and Nanopillars". Nanotechnology 18, 2007, 485302 (Oct. 20, 2007).

Heifetz et al., "Photonic Nanojets" Journal of Computational and Theoretical Nanoscience_vol. 6 pp. 1979,1992 (Sep. 1, 2009).

Cheung et al., "Fabrication of Nanopillars by Nanosphere Lithography", Nanotechnology 17:5, pp. 1339-1343 (Mar. 14, 2006).

Mohsemi, "Photonic Jet and its Applications in Nano-Photonics" Frontiers in Optics/Laser Science (2015).

Voison, "New generation lithography by Nanoprinting assisted by UC: study and development of materials and methods for microelectronic application" PhD Thesis, Universete Joseph Fourier, Grenoble FR (Nov. 23, 2007).

Geintz et al., "Modelling Spatially Located Photonic Nanojets from Phase Diffraction Gratings" Journal of Applied Physics 119, 153101 (Apr. 18, 2016).

Xu et al., "Photonic Nanojet Lens: Design, Fabrication and Characterization" Nanotechnology 27, 165302 (Mar. 4, 2016).

Kotlyar et al., "Photonic Nanojets Generated Using Square Profile Microsteps" Applied Optics vol. 54 No. 24 pp. 5322-5329 (Aug. 12, 2014).

Voison, "New generation lithography by Nanoprinting assisted by UC: study and development of materials and methods for microelectronic application" Abstract PhD Thesis, Universete Joseph Fourier, Grenoble FR (Nov. 23, 2007).

\* cited by examiner (a)            (b)

(b)

(c)

(d)

(e)

(a)

(b)

(c)

(d)

(e)

(f)

(a)

(b)

PHOTOLITHOGRAPHY DEVICE FOR GENERATING PATTERN ON A PHOTORESIST SUBSTRATE

This application claims the benefit, under 35 U.S.C. § 365 of International Application PCT/EP2017/076,881, filed Oct. 20, 2017, which was published in accordance with PCT Article 21(2) on ember Apr. 26, 2018, in English and which further claims the benefit of priority application EP16306385.2, filed on Oct. 21, 2016.

TECHNICAL FIELD

The present disclosure relates to microfabrication techniques and, more particularly, to a high-resolution nanojet-based photolithography technique.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

The photolithography technique/process is a manufacturing technique that enables to transfer a geometric pattern from a photomask to a photoresist substrate (usually a light sensitive polymer substrate), when the photomask is illuminated by a light illumination unit (i.e. when the photomask is exposed to light illumination unit). Such technique/process is widely used in the semiconductor industry especially for the fabrication of integrated circuits.

In order to design more complex and smaller integrated circuits (as they are dedicated to be used in more and more compact electronic device such as tablet, mobile phone, and so on), a natural trend in the semiconductor industry is to improve the photolithography technique/process in order to be able to transfer a geometric pattern at very small scale (i.e. even at Nano metric scale).

Resolution of the photolithography process, i.e. the smallest feature of the geometric pattern that can be created on a photoresist substrate, is determined by the resolving capability of the photoresist and by the optical resolution of the imaging system. The latter is determined by the wavelength of the imaging light ($\lambda$) and the numerical aperture (NA) of the projection lens. For a refractive or reflective type optical projection unit, it typically does not exceed one wavelength of the incident light in the host medium. The resolution can be improved by decreasing the wavelength or increasing the numerical aperture. The latter is possible for contact printing (with a mask put in direct contact with the photoresist substrate), however, it leads to mask degradation and thus should preferably be avoided. Aiming at increasing the resolution, several techniques have been proposed.

For example, in the book entitled "*Advances in Micro/Nano Electromechanical Systems and Fabrication Technologies*", the chapter 8, entitled "*Nanolithography*", written by Gunasekaran Venugopal and Sang-Jae Kim, describes and compares several techniques for manufacturing integrated circuit comprising nano-geometric patterns. The document US 2016/0147138 depicts a particular photomask used in a particular lithography technique (the EUVL (which stands for Extreme Ultraviolet Litography)). Another technique for manufacturing integrated circuit comprising nano-geometric patterns is described in the article entitled "*Nanoscale materials patterning and engineering by atomic force microscopy nanolithography*" by X. N. Xie, H. J. Chung, C. H. Sow, and A. T. S. Wee.

In order to design more complex nano-geometric patterns on a photoresist substrate, a technique described in the document US2016/0259253 is proposed based on near-field focusing due to the surface plasmon phenomenon. This technique enables a super resolution order of a fraction of the incident wavelength. However, this technique relies on the use of a multi-layer metal-dielectric mask, whose fabrication cost and complexity may not be acceptable for some applications.

Another technique named the nanosphere photolithography (NSP) technique (introduced in the article entitled "*A deep sub-wavelength process for the formation of highly uniform arrays of nanoholes and nanopillars*" by W. Wu et al., published in Nanotechnology 18, 2007) provides a cost-effective solution for fabrication of nanostructures with feature dimensions below 100 nm. This technique exploits nanojet beams produced by dielectric spheres (as detailed in the article entitled "*Photonic nanojets*" by A. Heifetz et al. The use of a monolayer of nano- (or micro-) spheres deposited on top of an optically sensitive material (i.e. photoresist) enables one to achieve a highly selective exposure of the photoresist layer. When exposure under UV light, the hot spot size produced by nanojet microspheres is about a half wavelength in the photoresist material. In such a way, microstructures with features size order of 100 nm can be fabricated. Hence, nanosphere lithography (NSL) is an economical technique for generating single-layer hexagonally close packed or similar patterns of nanoscale features (see for example the article entitled "*Fabrication of nanopillars by nanosphere lithography*" by Cheung et al. in Nanotechnology 2006). Another example of application of nanosphere lithography is depicted in FIG. 2 of the article entitled "*Photon nanojet lens: design, fabrication and characterization*" by Chen Xu et al., published in Nanotechnology 27 (2016).

Even if the nanosphere photolithography (NSP) technique is effective in terms of cost and throughput capacity, it may suffer from the following drawbacks:
- it has a poor reproducibility caused by certain difficulties with a precise positioning of microspheres,
- Fabrication tolerance caused by the imperfection of the microsphere shape, size, and positioning,
- Limited diversity of microstructure shapes that can be fabricated (for the moment, it is limited to simple geometries, like circular nanoholes, nanorings, and nanopillars).

Hence, there is a need to provide an alternative technique to the nanosphere photolithography technique that may overcome some of these limitations.

SUMMARY OF THE DISCLOSURE

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In one embodiment of the disclosure, it is proposed a photolithography device for generating structure on a photoresist substrate, the photolithography device comprising a light illumination unit, a photomask. The photomask is remarkable in that it comprises at least one layer of dielectric material and a medium having a refractive index lower than that of said dielectric material, wherein a surface of said at least one layer of dielectric material has at least one abrupt change of level forming a step, and wherein at least a base and lateral part of said surface with respect to said step is in contact with said medium.

In a preferred embodiment, the photomask is remarkable in that said step is formed by an edge of at least one cavity made in said at least one layer of dielectric material, and said cavity is at least partly filled in with said medium.

In a preferred embodiment, the photomask is remarkable in that said at least one cavity is a through-hole in said at least one layer of dielectric material.

In a preferred embodiment, the photomask is remarkable in that said at least one cavity belongs to at least one set of at least two cavities.

In a preferred embodiment, the photomask is remarkable in that said at least one cavity is targeted to be cylindrical or cone-shaped.

In a preferred embodiment, the photomask is remarkable in that said step is formed by an edge of at least one groove made in said at least one layer of dielectric material, and said groove is at least partly filled in with said medium.

In a preferred embodiment, the photomask is remarkable in that a height H of said step is targeted to be such that $$H > \frac{\lambda_1}{2},$$

where $\lambda_1$ is a wavelength of said electromagnetic waves in said dielectric material.

In a preferred embodiment, the photomask is remarkable in that it also comprises at least one layer forming a substrate (110) abutting said layer of dielectric material.

In a preferred embodiment, the photomask is remarkable in that said dielectric material belongs to the group comprising:
 glass;
 plastic;
 a polymer material.

In a preferred embodiment, the photolithography device is remarkable in that it also comprises an optical projection unit for guiding light coming from said light illumination unit.

In a preferred embodiment, the photolithography device is remarkable in that the optical projection unit comprises a set of lenses and/or mirrors.

Hence, in one embodiment of the disclosure, it is used an optical projection unit similar to the one disclosed in the article entitled "*Photonic Jet and its Applications in Nano-Photonics*" by Hooman Mohseni, published in Frontiers in Optics/Laser Science 2015.

In another embodiment of the disclosure, it is proposed to change/substitute the mask used in optical lithography processes described in the PhD Thesis entitled "*Lithographie de nouvelle génération par nanoimpression assistée par UV: étude et développement de matériaux et procédés pour l'application microélectronique*" by a photomask according to the present disclosure. Hence, several embodiments of the disclosure can be derived from the examples described in such PhD Thesis.

In one embodiment of the disclosure, the light illumination unit can be chosen to deliver specific electromagnetic wavelength such as ultra-violet. For example, such electromagnetic wavelength may be 365 nm or 405 nm. The former value (i.e. 365 nm) is used in simulations reported in FIG. 39. In principle, shorter wavelength values are also possible, subject for the mask material properties (some material become non-transparent at these wavelengths).

In one embodiment of the disclosure, it is proposed a photolithography device for generating a structure (or a pattern) on a photoresist substrate. The photolithography device comprises a light illumination unit, a photomask. The photolithography device is remarkable in that in that the photomask comprises at least one layer of a dielectric material comprising at least partially a first element, said first element having a first refractive index value, said first element comprising at least partially a second element, said second element having a second refractive index value greater than said first index value, and wherein said second element comprises at least a base surface, defined with respect to an arrival direction of an electromagnetic wave from said light illumination unit, and wherein said at least a base surface comprises at least two opposite edge line segments whose shape and associated base angles between said at least a base surface and a lateral surface of said second element, in a vertical plane with respect to said at least a base surface, control a shape of at least one focused beam.

In a preferred embodiment, the photolithography device is remarkable in that said second element is targeted to have a geometric shape belonging to a group comprising:
 a cylinder;
 a prism;
 a cone;
and wherein said geometric shape has an arbitrary cross section.

In a preferred embodiment, the photolithography device is remarkable in that said geometric shape is oblique and/or truncated and/or comprises a rounded top surface.

In a preferred embodiment, the photolithography device is remarkable in that a distance between said at least two opposite edge line segments has a minimum length of at least $\lambda_2/2$, where $\lambda_2$ is a wavelength of said electromagnetic wave in a material of said second element.

In a preferred embodiment, the photolithography device is remarkable in that an edge line of said at least a base surface comprises at least two opposite edge line segments that can be approximated by straight or curved convex lines, each line having a length of at least $\lambda_2/2$, where $\lambda_2$ is a wavelength of said electromagnetic wave in a material of said second element.

In a preferred embodiment, the photolithography device is remarkable in that said dielectric material has a third refractive index value which is equal to said second refractive index.

In a preferred embodiment, the photolithography device is remarkable in that said first element comprises at least a first base surface, defined with respect to an arrival direction of said electromagnetic wave, and a first lateral surface connected with said at least one layer of a dielectric material, and wherein a minimum distance between each of the edge line segments of an edge of said at least a base surface, and said first lateral surface is equal to at least $\lambda_1/2$ where $\lambda_1$ is a wavelength of said electromagnetic wave in said first element.

In a preferred embodiment, the photolithography device is remarkable in that said first element is targeted to have a geometric shape belonging to a group comprising:
a cylinder;
a prism;
a cone;
and wherein said geometric shape of said first element has an arbitrary cross section.

In a preferred embodiment, the photolithography device is remarkable in that said dielectric material belongs to the group comprising:
glass;
plastic;
a polymer material.

In a preferred embodiment, the photolithography device is remarkable in that said first element is a cavity formed in said at least one dielectric layer.

In a preferred embodiment, the photolithography device is remarkable in that a size and/or a shape of said first element further controls a shape of said at least one focused beam.

In a preferred embodiment, the photolithography device is remarkable in that it further comprises an optical projection unit, and said optical projection unit comprises a set of lenses and/or mirrors.

BRIEF DESCRIPTION OF THE DRAWINGS

The above and other aspects of the invention will become more apparent by the following detailed description of exemplary embodiments thereof with reference to the attached drawings in which:

FIG. 4(a) shows a side view of the dielectric layer 112. FIGS. 4(b) and 4(c) respectively show top views in case of a step with a straight (FIG. 4(b)) and curved (FIG. 4(c)) edge lines;

Figure 22:
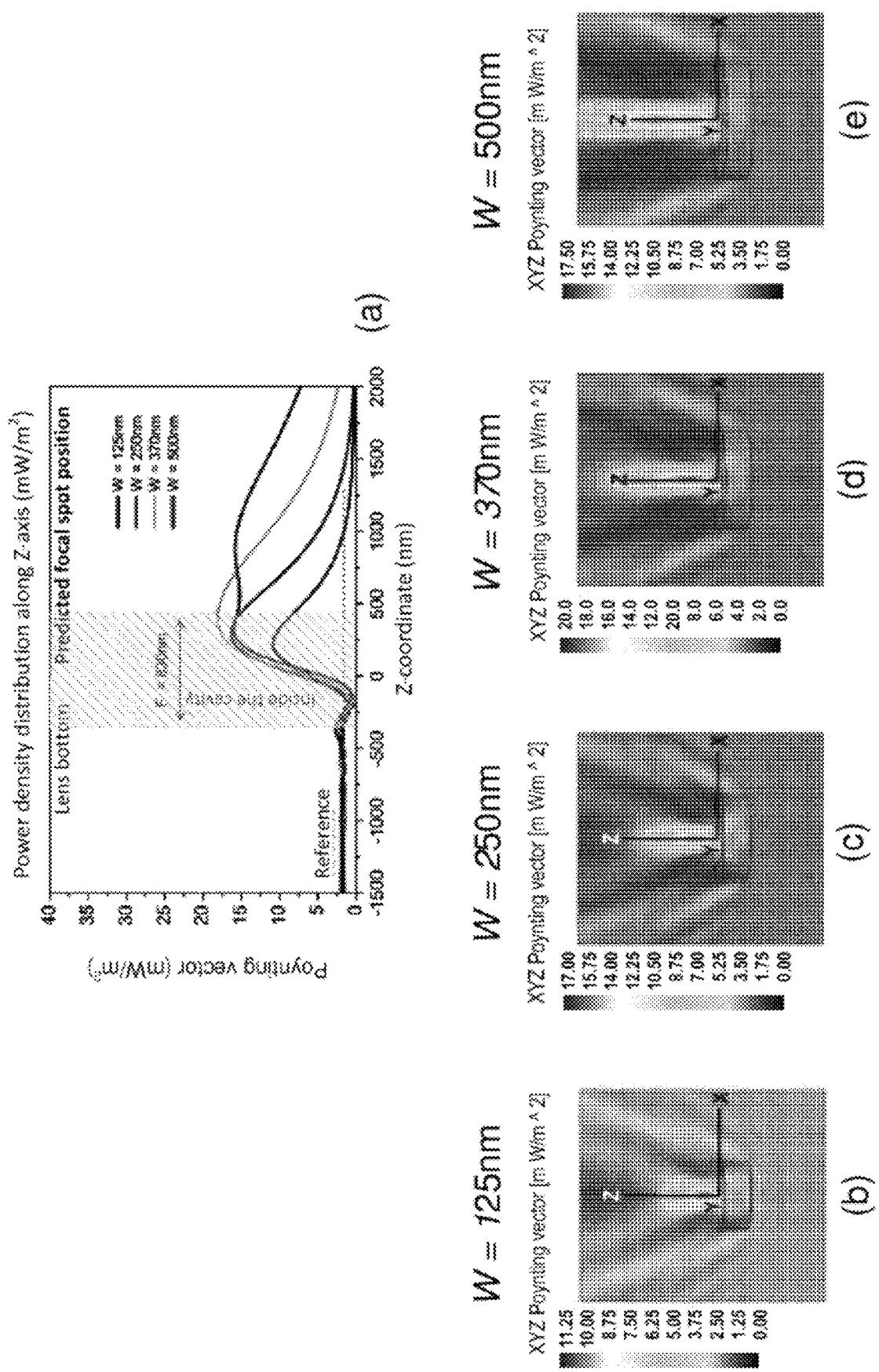
Figure 23:
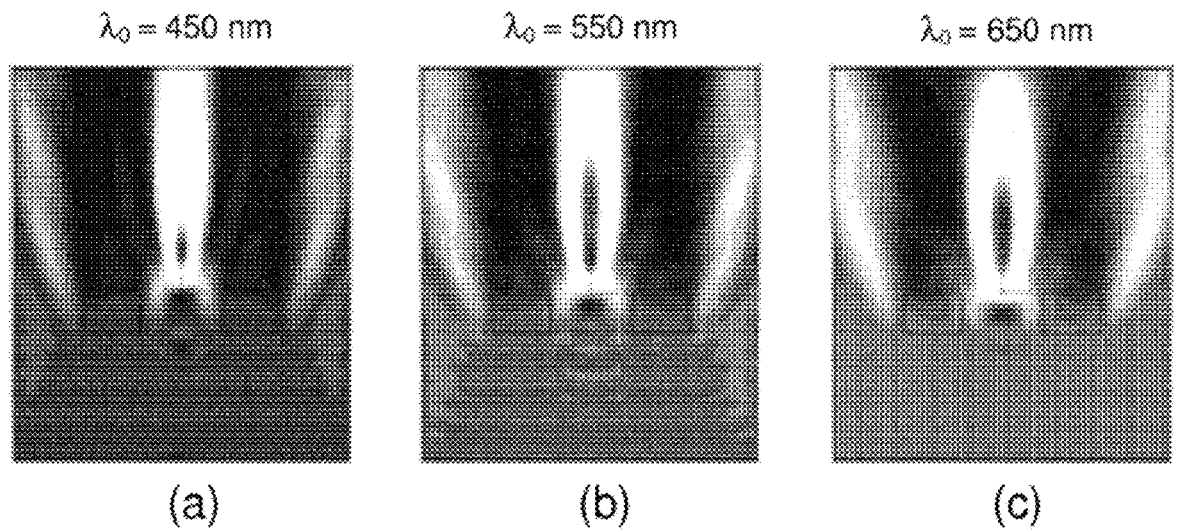
Figure 24:
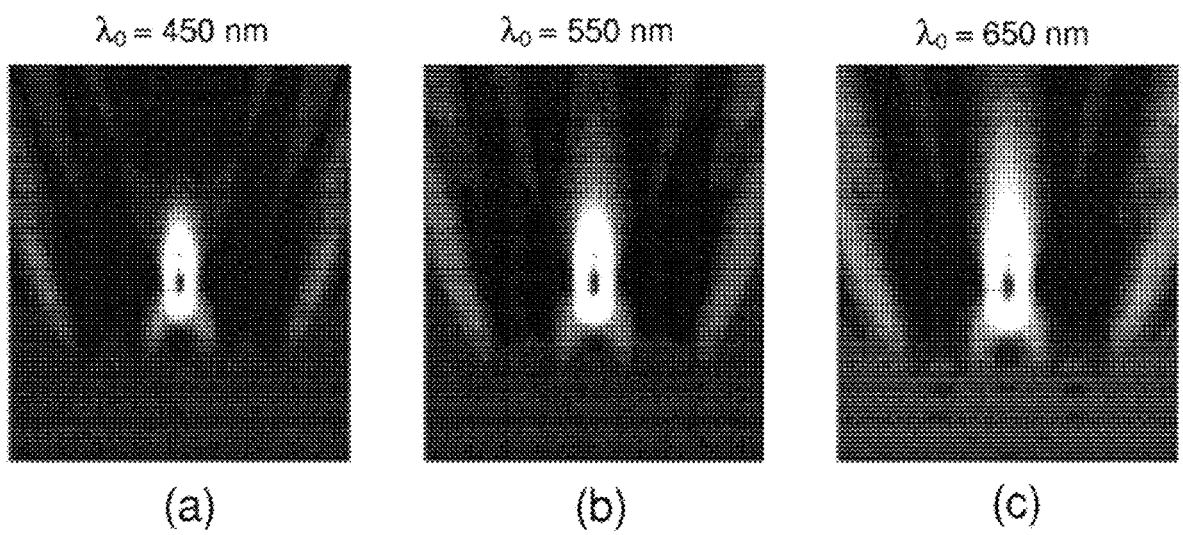
Figure 25:
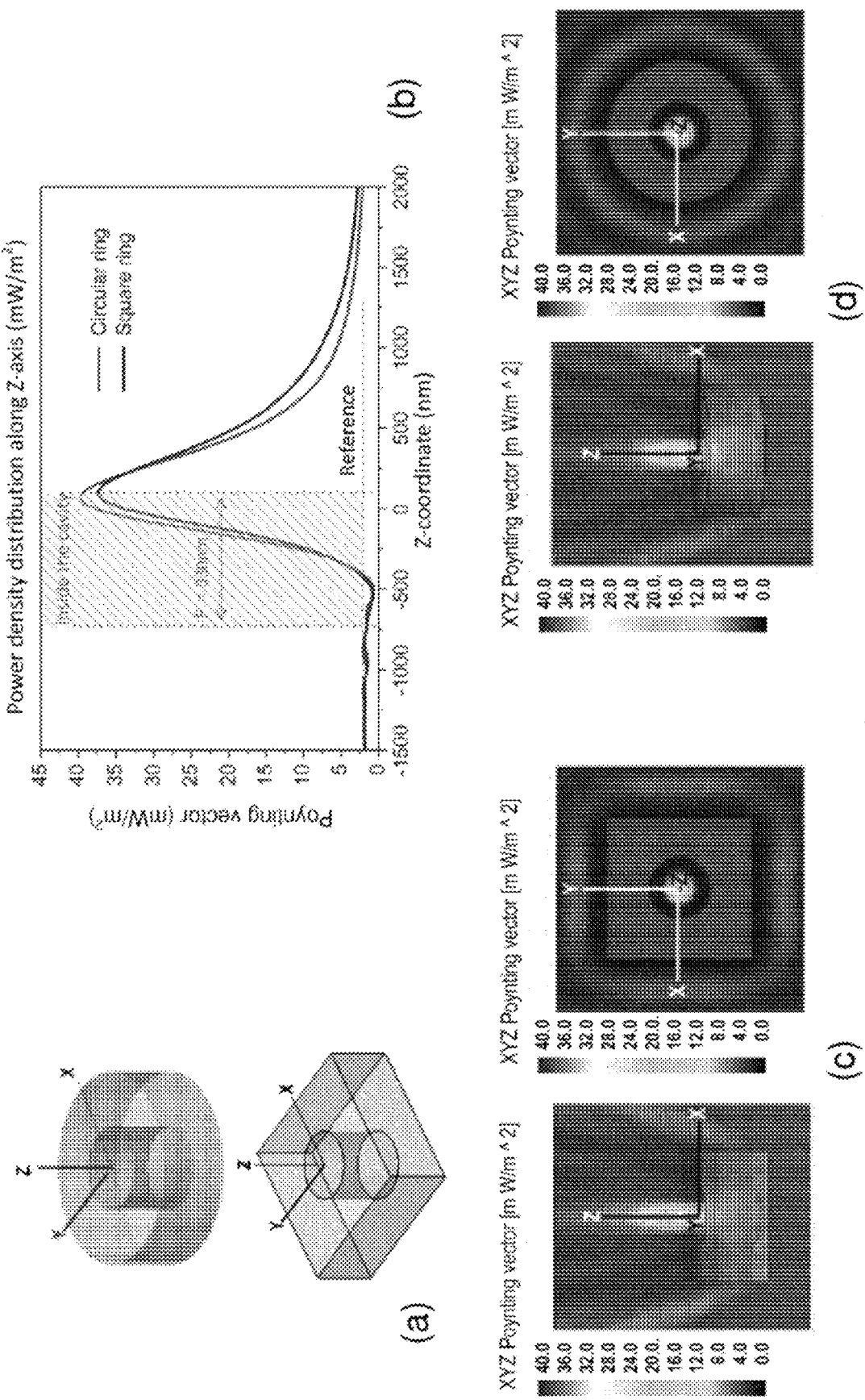
Figure 26:
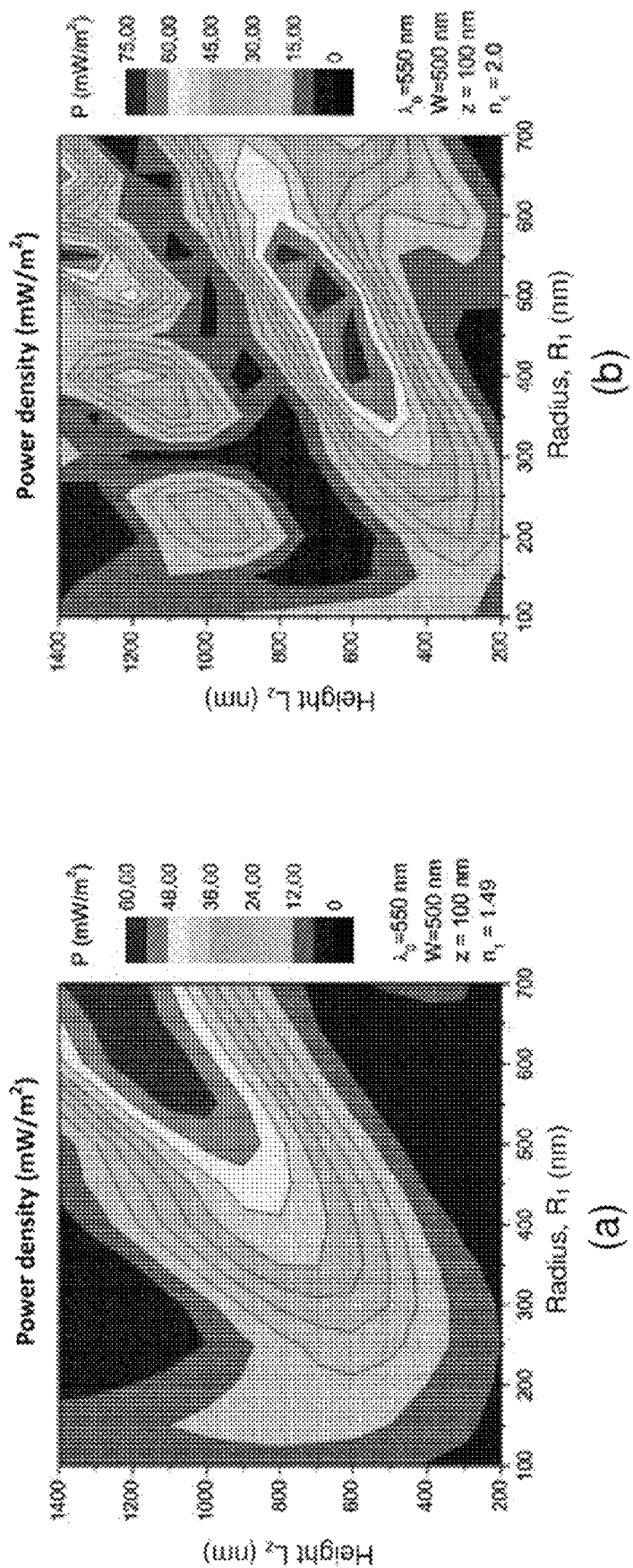
Figure 27:
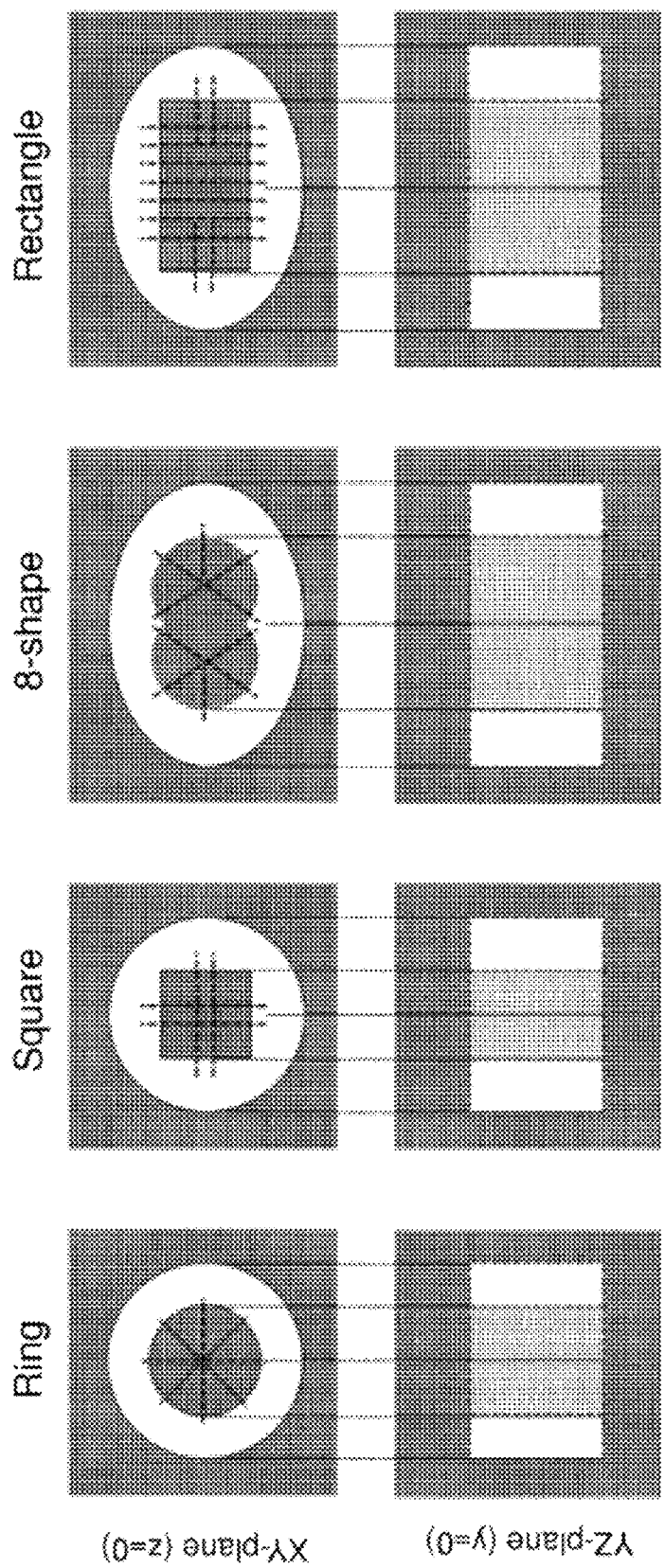
Figure 28:
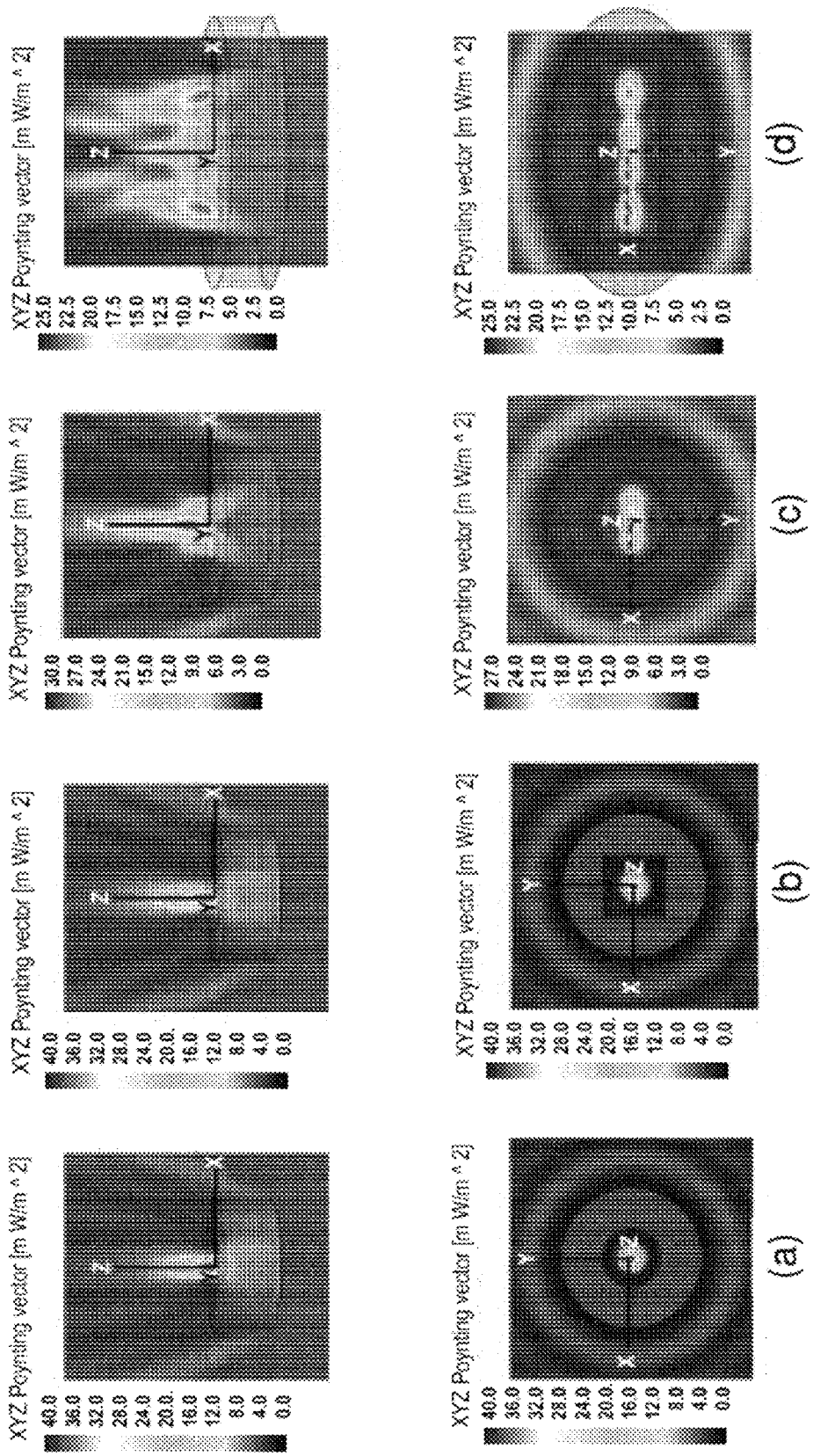
Figure 29:
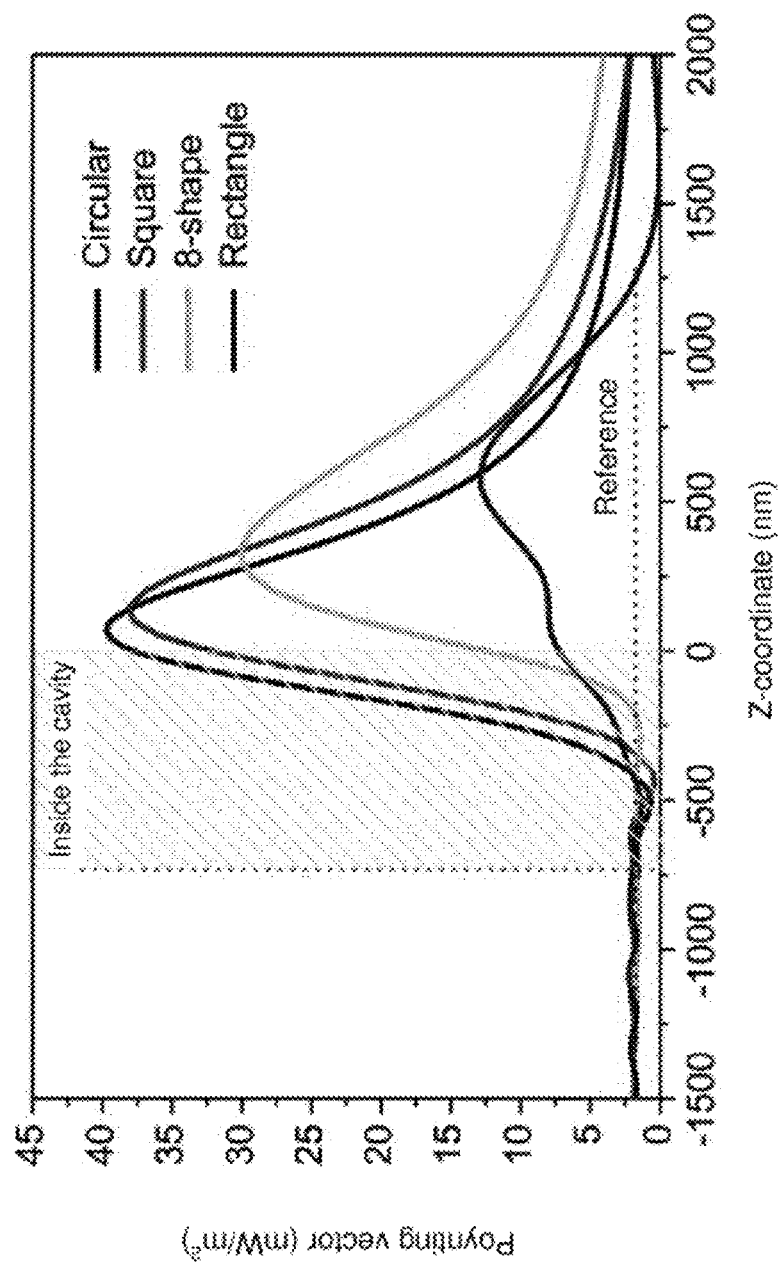
Figure 31:
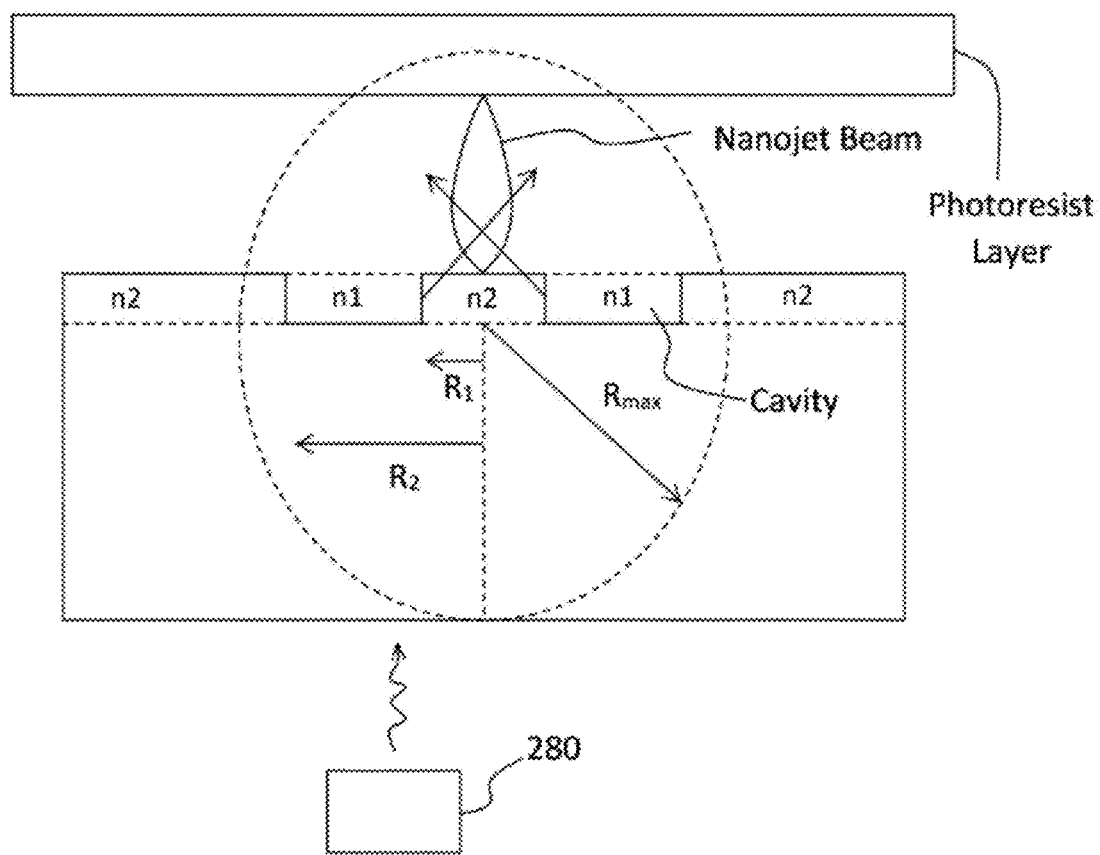
Figure 32:
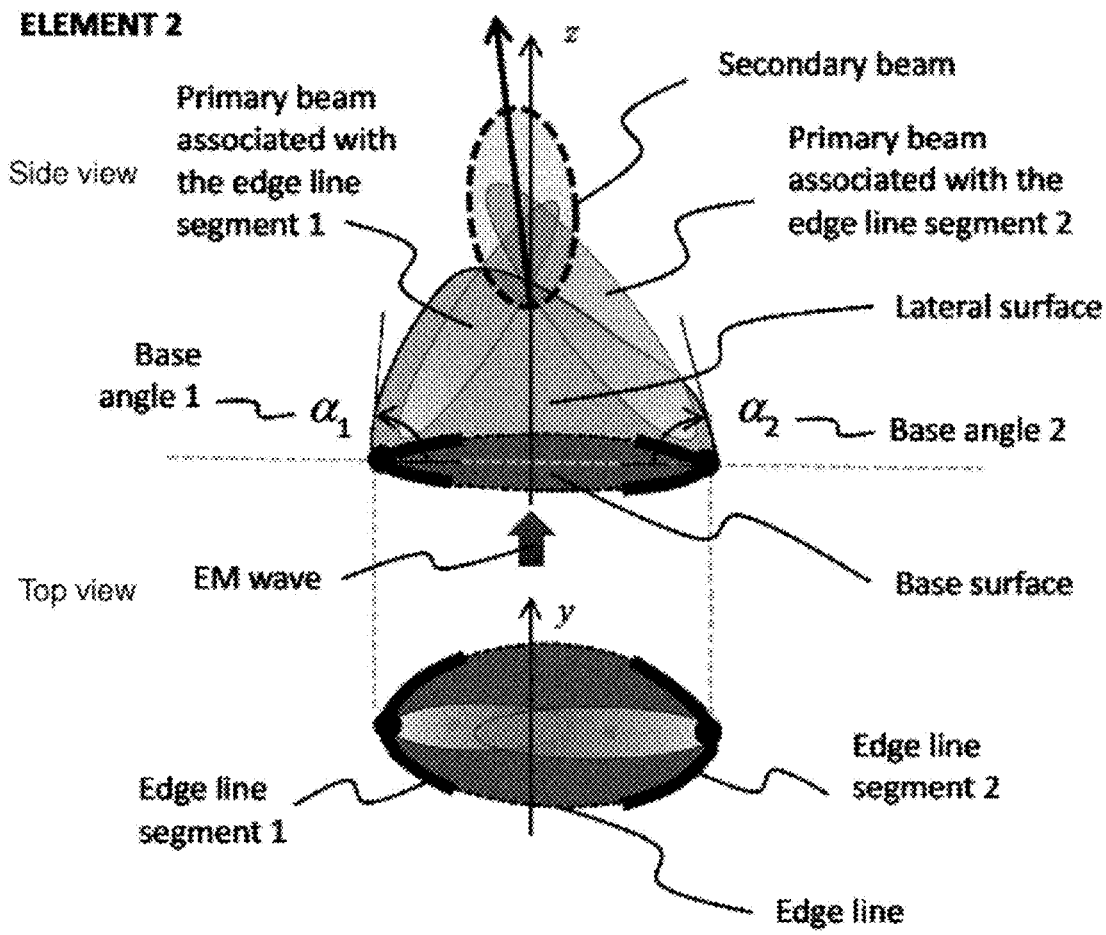
Figure 33:
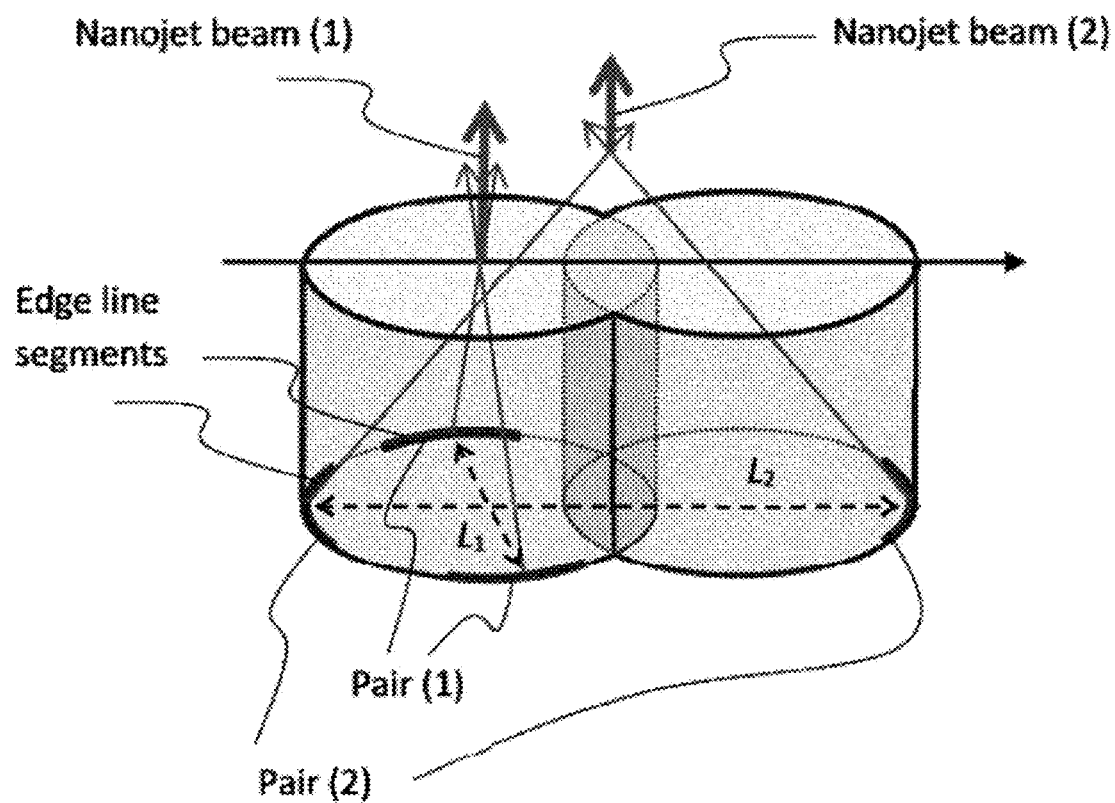
Figure 34:
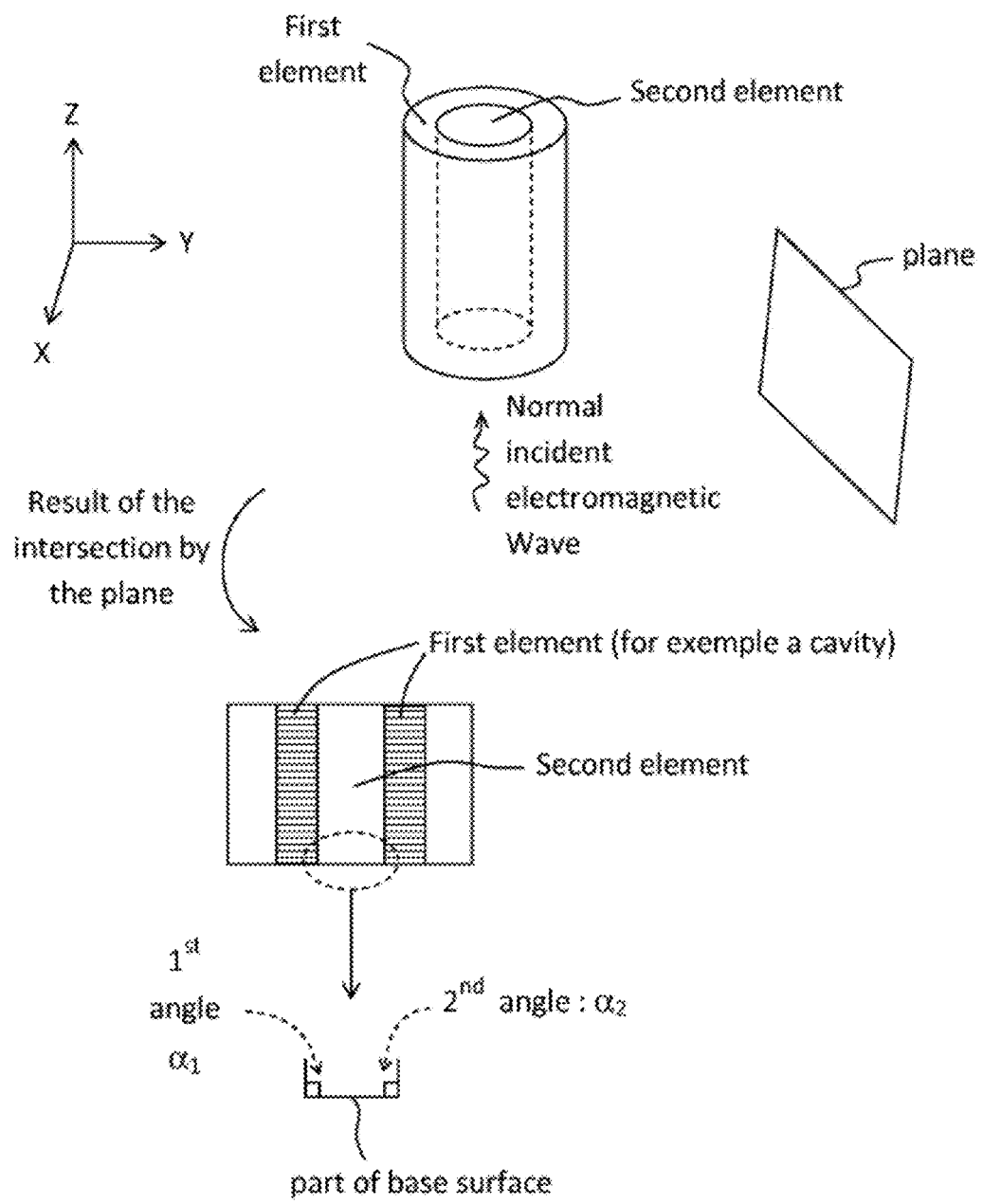
Figure 35:
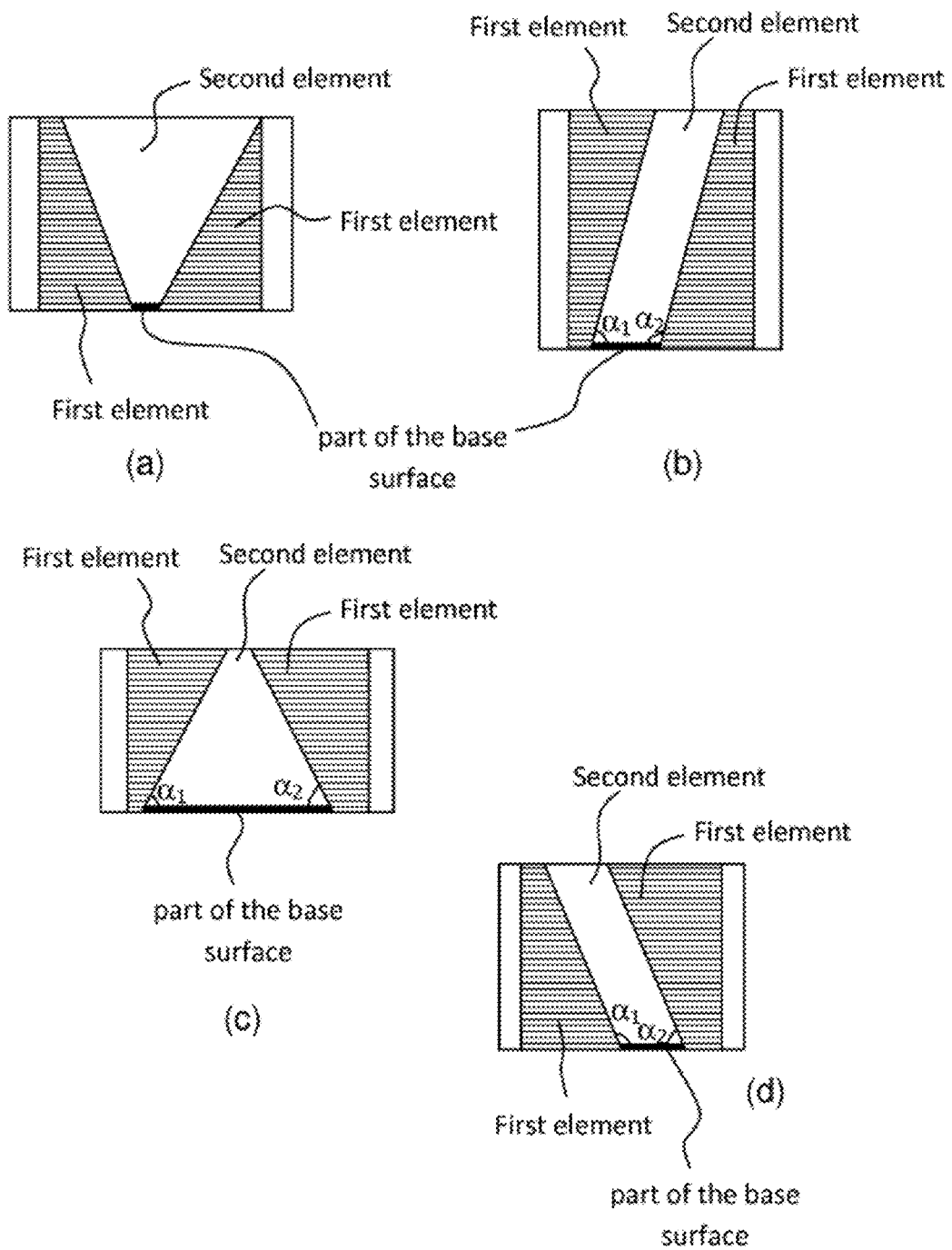
Figure 36:
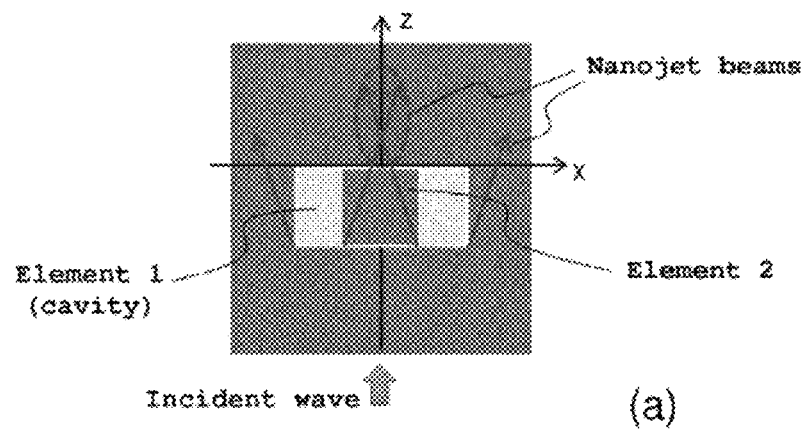
Figure 36:
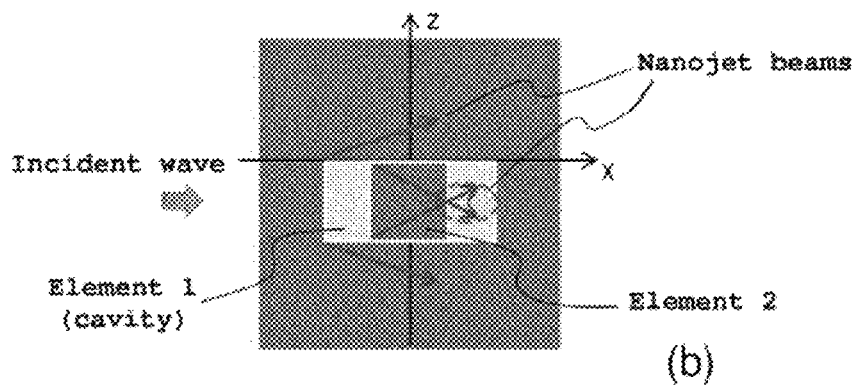
Figure 36:
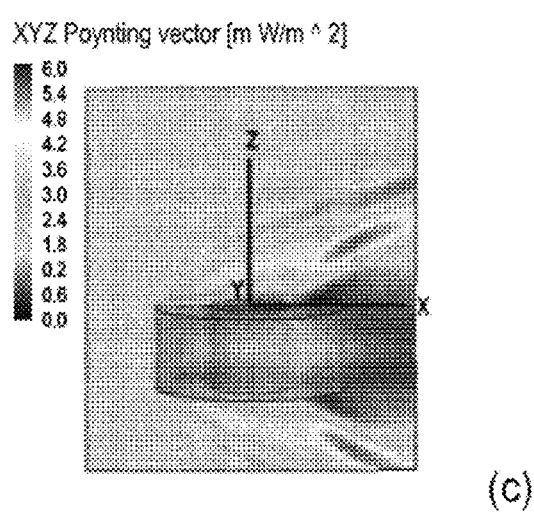
Figure 38:
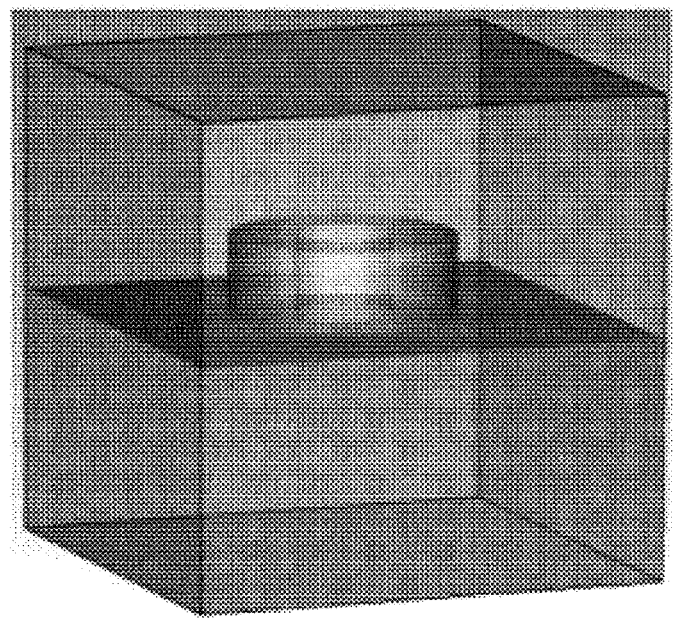
Figure 38:
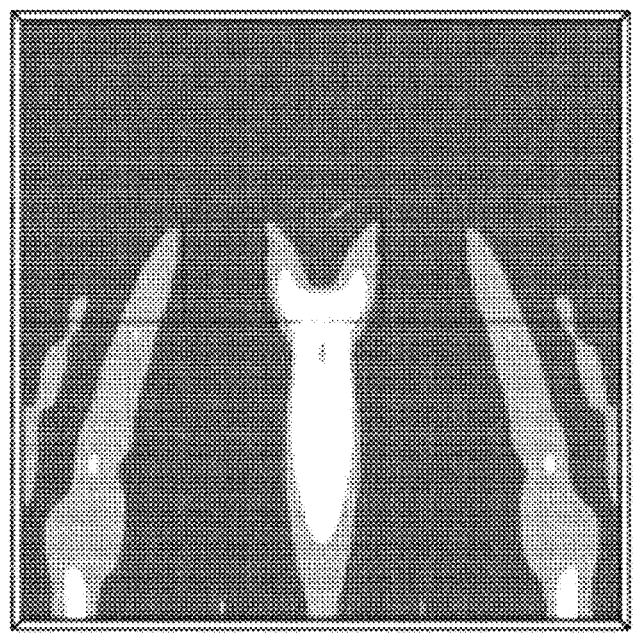
Figure 38:
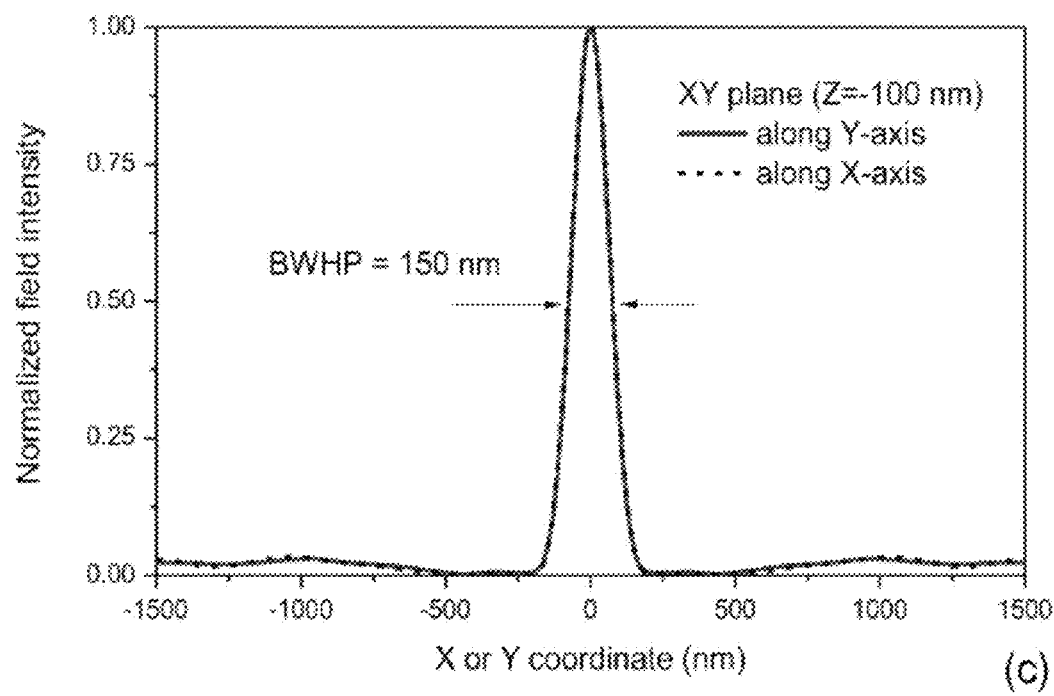
Figure 38:
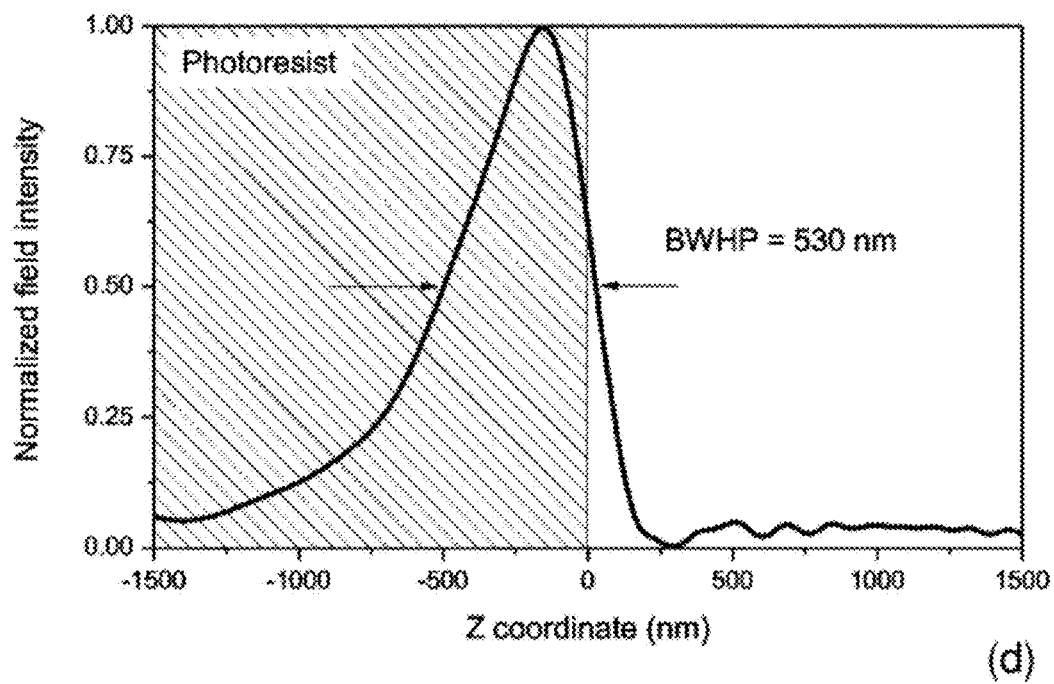
Figure 39:
Figure 39:
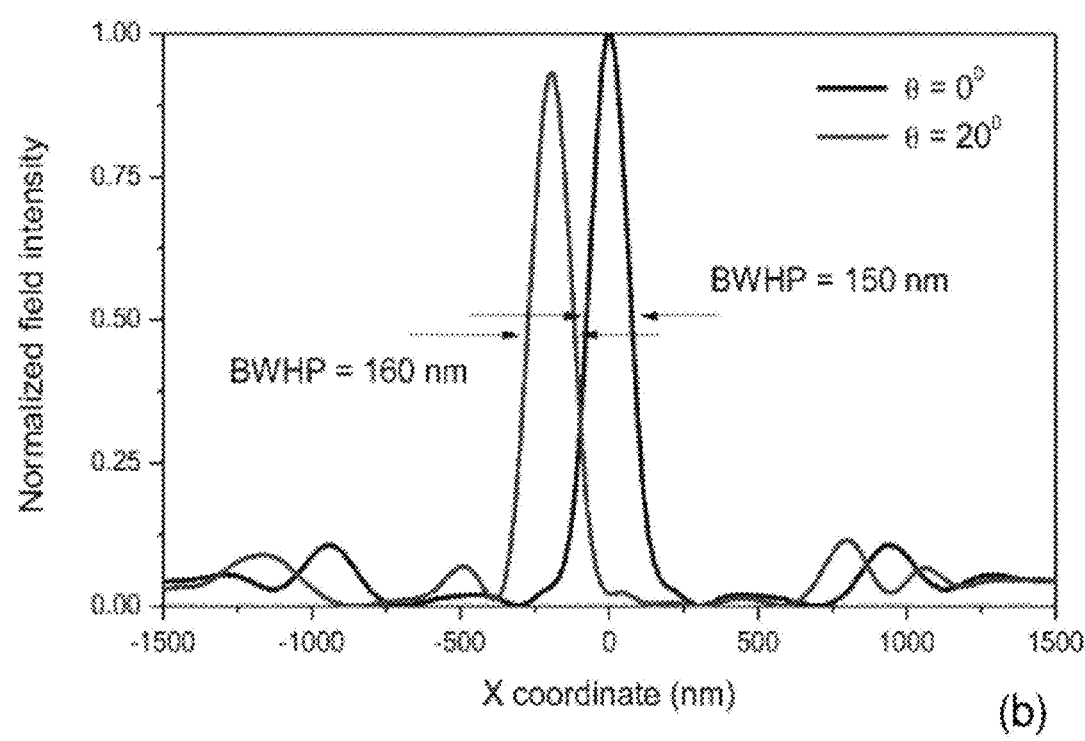

FIG. 22 presents different power density distributions for the ring-type nanojet element, according to one embodiment of the disclosure, with dimensions $R_1$=370 nm, $L_z$=370 nm, refraction indexes ($n_1$=1, $n_2$=1.49), and variable width of the ring illuminated by a unit amplitude plane wave with $\lambda_0$=550 nm: (a) along z-axis, (b-e) in xz-plane for W=125, 250, 370, and 500 nm, respectively;

FIGS. 23 (a)-(c) present different normalized power density distributions in the xz-plane for the ring-type nanojet element with dimensions $R_1$=370 nm, $L_z$=370 nm, W=500 nm, refraction indexes ($n_1$=1, $n_2$=1.49), and variable ring width illuminated by a unit-amplitude plane wave: (a) $\lambda_0$=450 nm, (b) $\lambda_0$=550 nm, (c) $\lambda_0$=650 nm;

FIGS. 24 (a)-(c) presents, for the same wavelength of FIG. 23, different normalized power density distributions in the xz-plane for the ring-type nanojet element with dimensions $R_1$=370 nm, $L_z$=740 nm, W=500 nm and refraction indexes ($n_1$=1, $n_2$=1.49) illuminated by a unit-amplitude plane wave: (a) $\lambda_0$=450 nm, (b) $\lambda_0$=550 nm, (c) $\lambda_0$=650 nm;

FIG. 25 presents (a) a geometry of the ring-type nanojet element with circular and square rings, (b) the power density distribution along z-axis for the ring-type nanojet elements with circular and rectangular cross-sections and dimension of $L_z$=740 nm, $R_1$=370 nm, $L_x$=$L_y$=2($R_1$+W) illuminated by a unit-amplitude plane wave with $\lambda_0$=550 nm, (c,d) power density distributions for both elements in the xz-plane;

FIG. 26 discloses the contour plots of the power density in a fixed point (0,0,100 nm) located close to the ring-type element top surface versus element core radius and height. The element has a fixed width is of the ring W=500 nm and is illuminated by a unit-amplitude plane wave. The refraction indexes of the media: (a) $n_1$=1, $n_2$=1.49, (b) $n_1$=2.0;

FIG. 27 presents different topologies of the exemplary ring-type nanojet elements;

FIGS. 28 (a) to (d) present power density distribution in xz and xy-planes for the ring-type nanojet elements ($L_z$=740 nm, W=500 nm, $n_1$=1, $n_2$=1.49) with different cross-sections of the core cylinder illuminated by a unit-amplitude plane wave $\lambda_0$=550 nm: (a) circle: $R_1$=370 nm, (b) square: $L_x$=$L_y$=2$R_1$, (c) 8-shape: $R_1$=370 nm with a distance between the centers d=$R_1$, (d) rectangle: $L_x$=8$R_1$, $L_y$=2$R_1$;

FIG. 29 presents different power density distribution along z-axis (x=y=0) for the ring-type nanojet elements with different cross-sections of the core cylinder presented in FIG. 28;

FIGS. 30(a)-(d) present different power density distributions along xz and yz-axis for the ring-type nanojet elements with different cross-sections presented in FIG. 27;

FIG. 31 presents a use of a nanojet focusing element according to one embodiment of the disclosure;

FIG. 32 presents two different views of a second element according to one embodiment of the disclosure;

FIG. 33 presents a second element according to one embodiment of the disclosure whose base edge line comprises (at least) two pairs of opposite edge line segments contributing to creation of (at least) two nanojet beams;

FIG. 34 presents the intersection of a part of the device according to the disclosure by a plane that is parallel to the propagation direction of an incident electromagnetic wave (and more precisely in that case with a normal incident electromagnetic wave with regards to the bottom of dielectric layer);

FIGS. 35 (a)-(d) present different resulting intersections of a part of the device according to the disclosure, by a plane that is parallel to the propagation of an electromagnetic wave (and more precisely in that case with a normal incident electromagnetic magnetic wave with regards to the bottom of dielectric layer);

FIG. 36 presents schematic drawings of the nanojet beams produced by a device (or ring-type nanojet element), according to one embodiment of the disclosure, that is illuminated by a unit-amplitude plane wave: (a) which is incident from below, along z-axis, (b) which is incident from left, along x-axis. The arrows from the first element indicate the nanojet beams. FIG. 36(c) presents the power density distribution in xz-plane when the device according to one embodiment of the disclosure (i.e. comprising the ring structure) is illuminated from the left (along x axis);

FIGS. 37(a)-(c) present some examples of NJ microstructures (top view): (a) ring-type, (b) curved strips, (c) grid, (d) regular or periodic grooves;

FIG. 38(a) present a CAD model of a hollow ring-type NJ element having a form of a double-layer circular cylinder (R1=300 nm, R2=700 nm, H=500 nm) created in glass plate (n1=1.5 nm) placed on top of a photoresist layer (n2=1.7), FIG. 38(b) presents a normalized field intensity in YZ-plane when illuminated by a plane wave ($\lambda_0$=365 nm) from above, FIG. 38(c) presents a normalized field intensity distribution along X and Y axes at Z=−100 nm, and FIG. 38(d) presents a normalized field intensity distribution along Z-axis;

FIG. 39 presents (a) a normalized field intensity in XZ-plane for the ring-type NJ microlens illuminated by a plane wave ($\lambda$=365 nm) under 20° if defined with respect to the vertical axis, and (b) a normalized field intensity distribution along X-axis at Y=0 nm, Z=−100 nm for two different incident angles of the plane wave. Parameters of the structure are the same as in FIG. 38.

Figure 40:
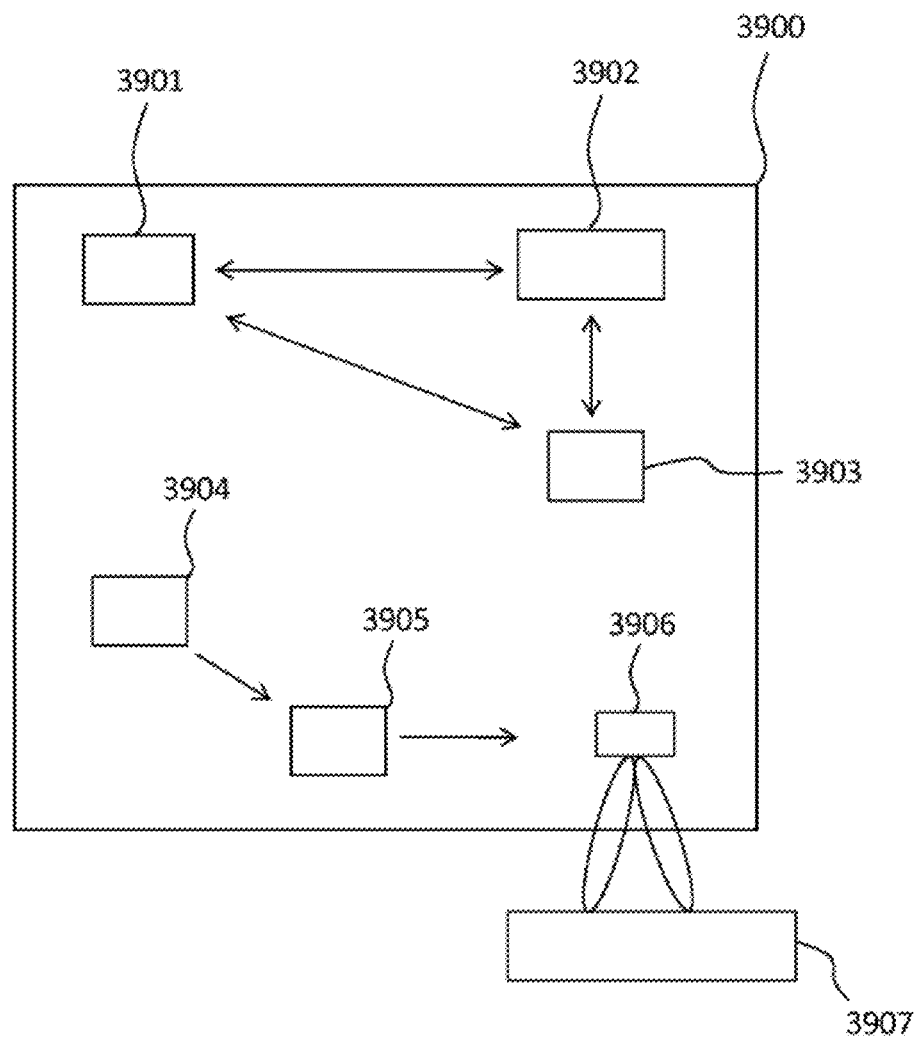
Figure 41:
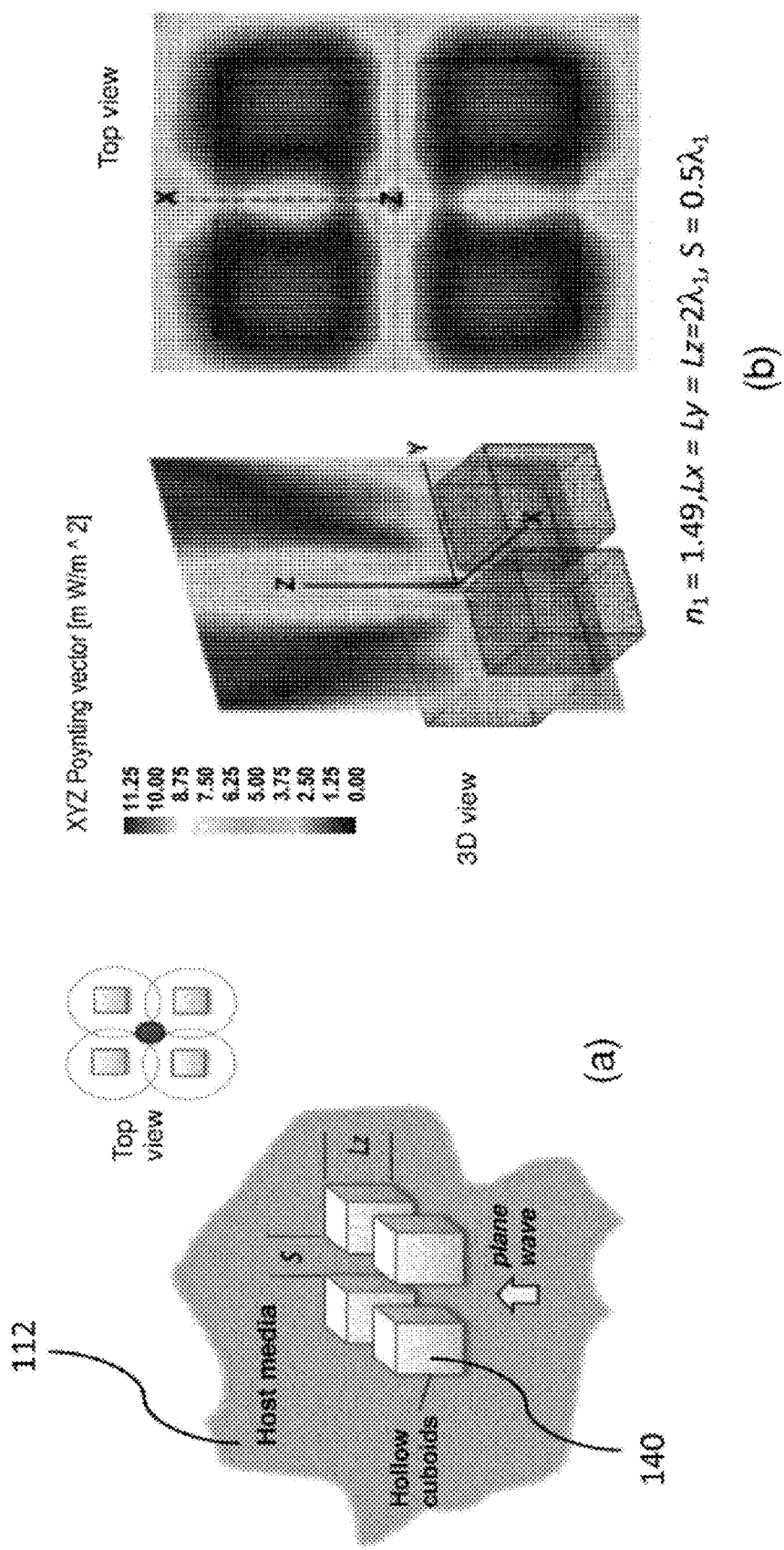
Figure 42:
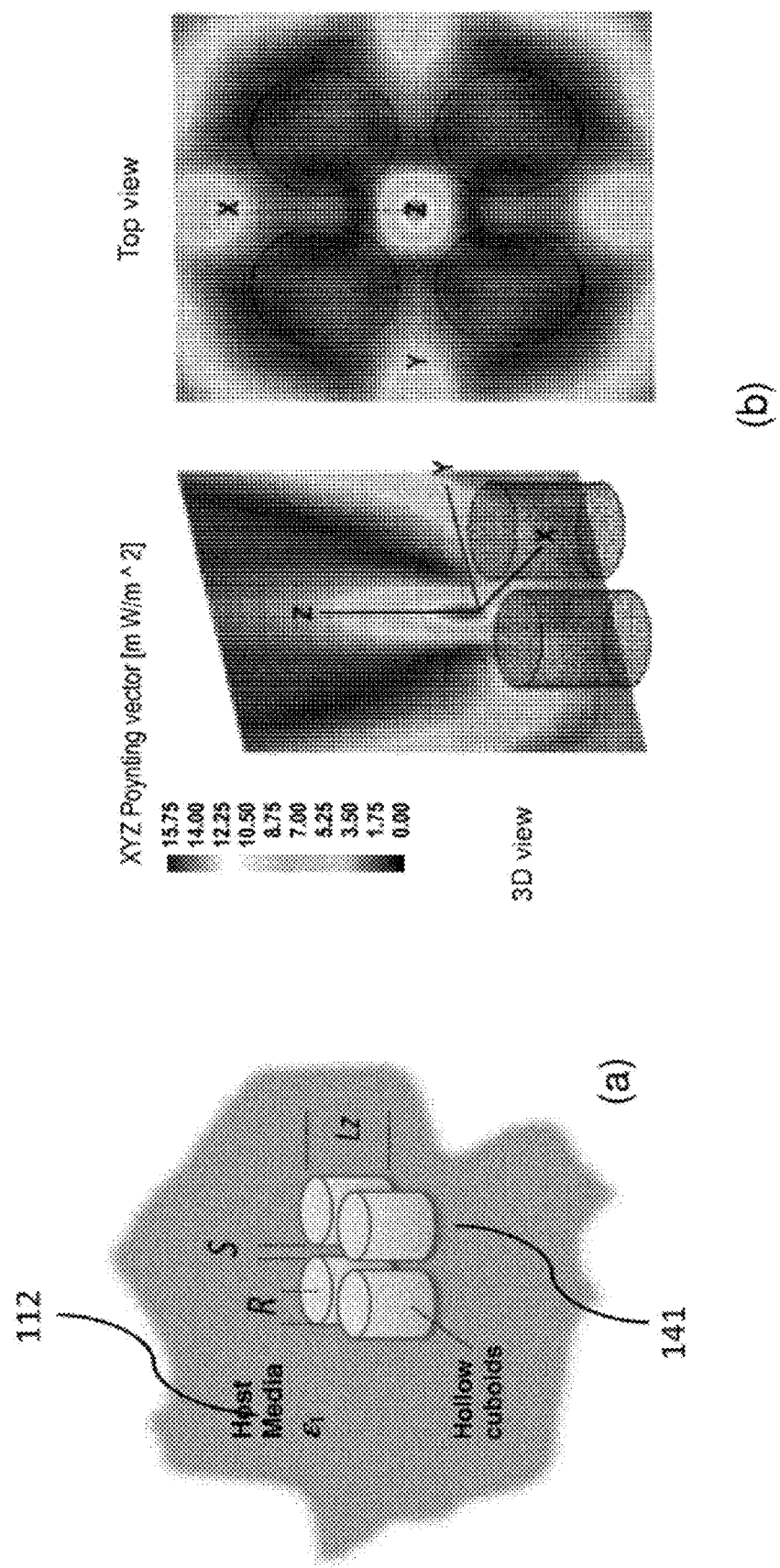
Figure 43:
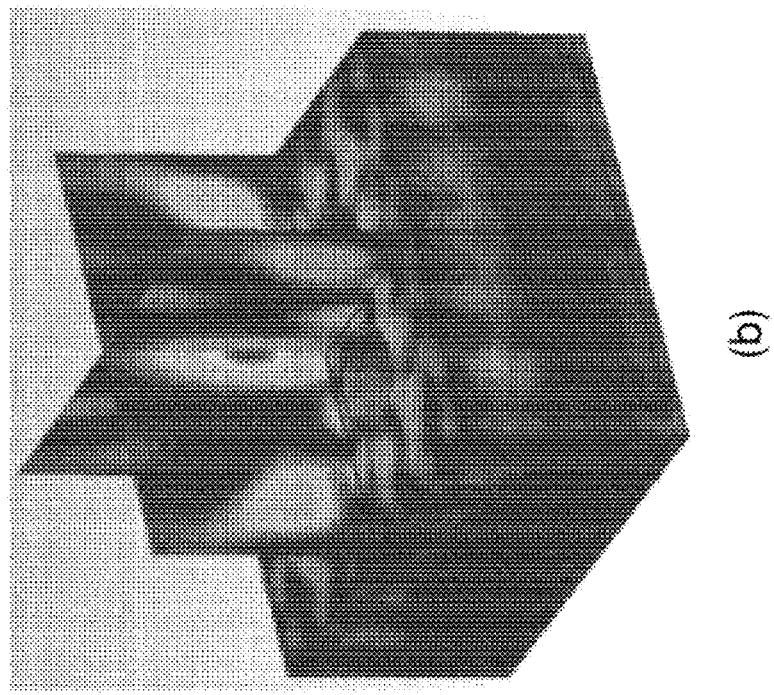
Figure 43:
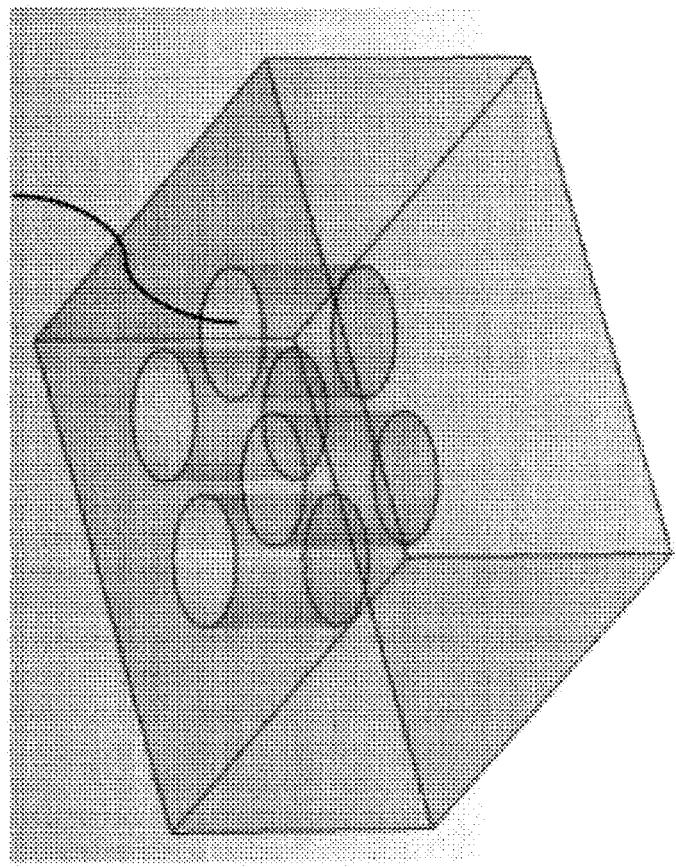
Figure 44:
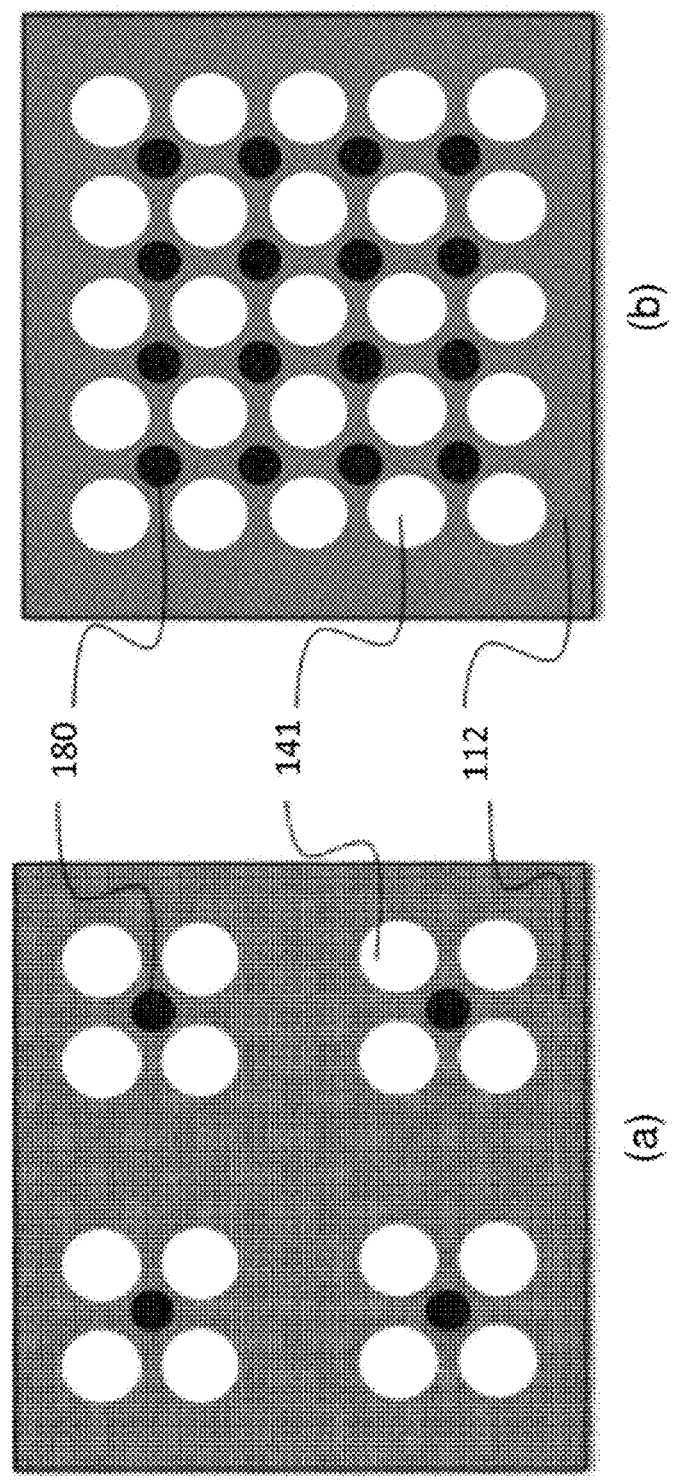

FIG. 40 presents an example of a photolithography device according to one embodiment of the disclosure;

FIG. 41 illustrates a specific embodiment of the present disclosure, according to which the focusing component is based on a 2×2 planar array of identical hollow cuboid-shaped cavities embedded in a host medium;

FIG. 42 illustrates an alternate embodiment, in which the hollow cuboid-shaped cavities of FIG. 41 are replaced with hollow circular cylinders, oriented along the plane wave propagation direction;

FIG. 43 illustrates yet another embodiment, in which a 2×2 array of hollow circular cylinders is created at the boundary of the dielectric medium and free space;

FIG. 44 provides two additional exemplary embodiments based on single-periodic (FIG. 44a) and double-periodic (FIG. 44b) arrays of hollow cylinders embedded in a host medium.

DETAILED DESCRIPTION

Figure 1:
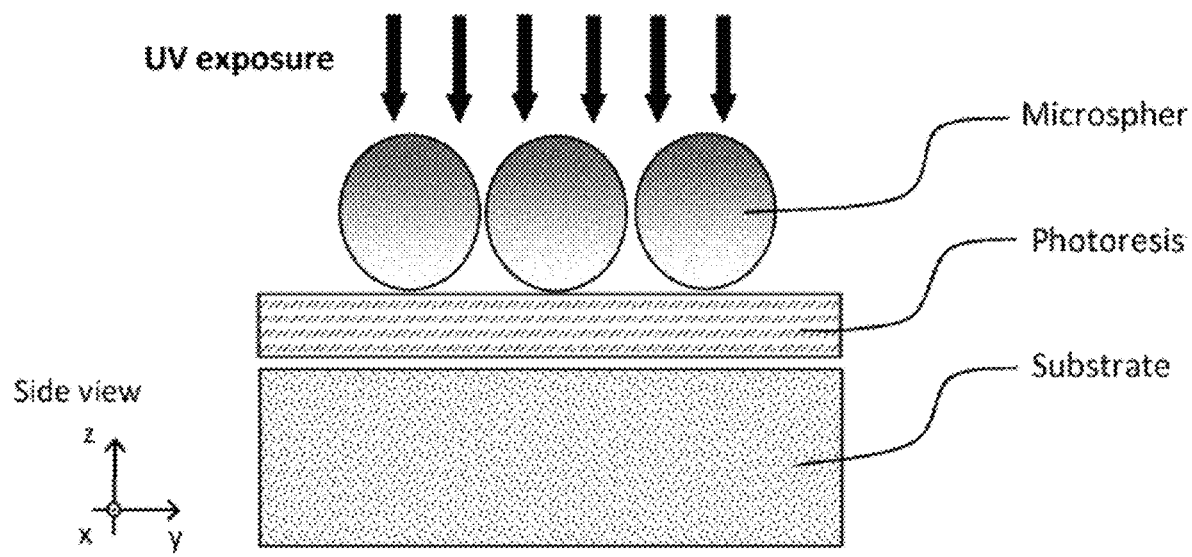
FIG. 1 presents a schematic illustration of the NSP fabrication technique based of a monolayer of dielectric microspheres, which placed on top of a photoresist layer deposited on a substrate and illuminated by UV light from above.

The FIG. 1 presents a schematic illustration of the NSP fabrication technique based of a monolayer of dielectric microspheres, which is placed on top of a photoresist layer deposited on a substrate and illuminated by UV light from above.

Figure 2A:
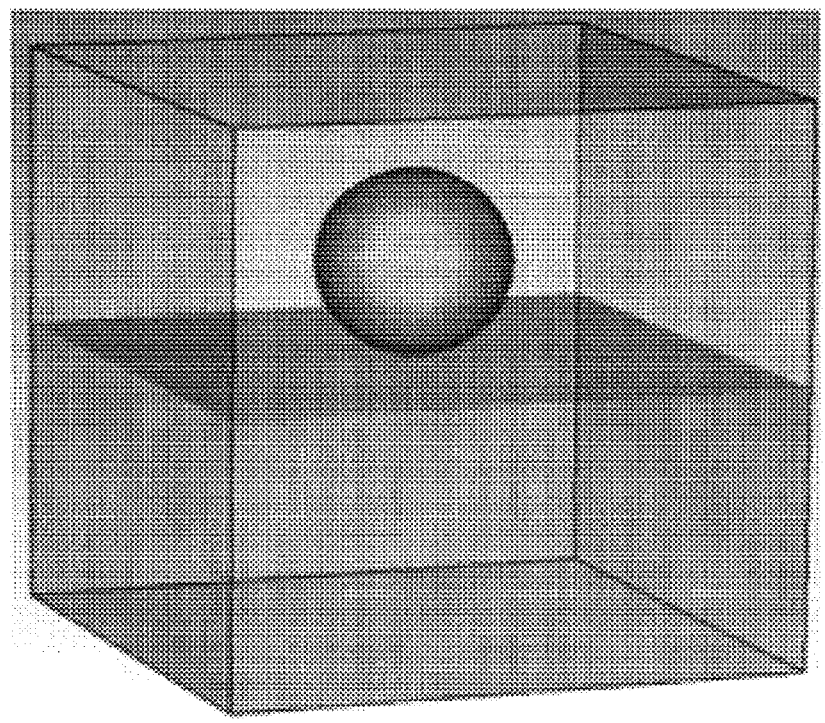
FIG. 2(a) is a CAD model of a dielectric microsphere ($n_1$=1.5, R=500 nm) positioned on top of a thick photoresist layer ($n_2$=1.7) analyzed using a 3D-FDTD electromagnetic simulation software.
Figure 2B:
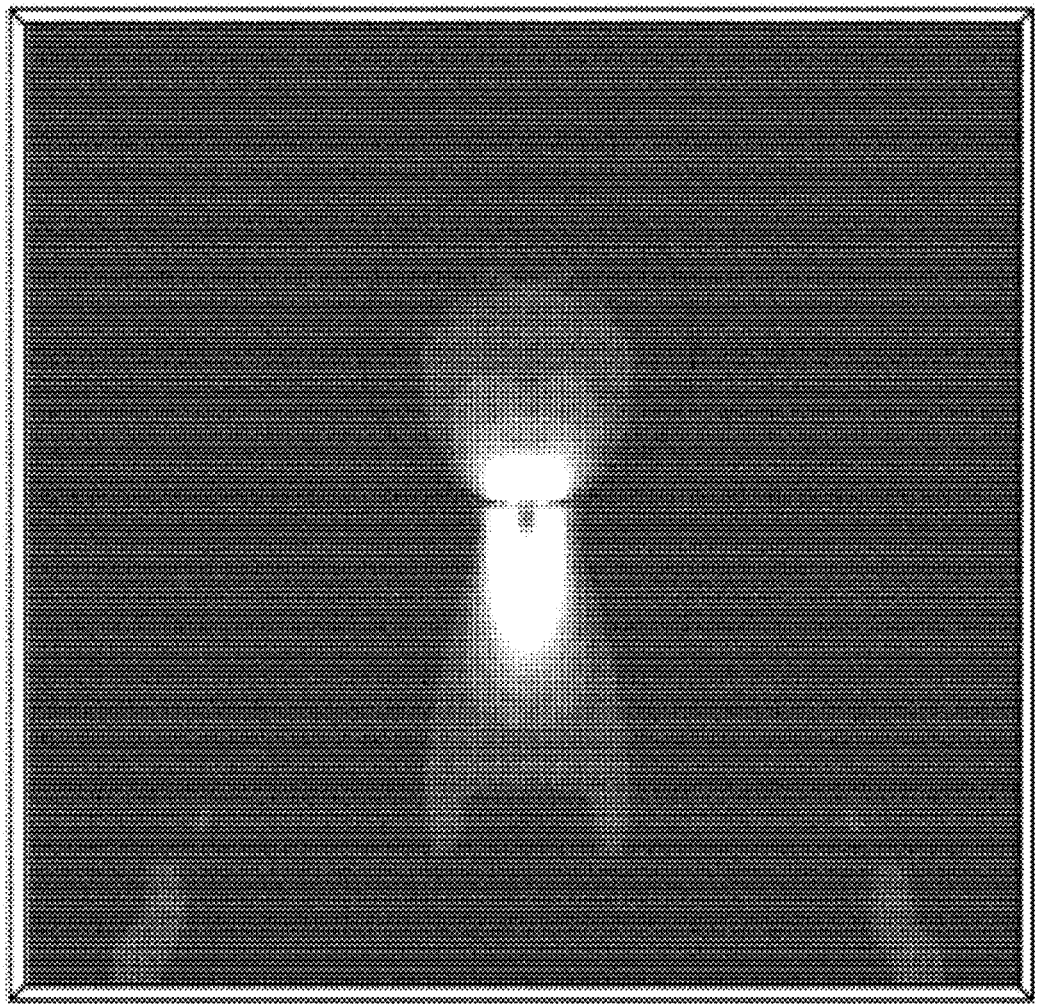
FIG. 2(b) presents a normalized field intensity in YZ-plane when illuminated by UV light ($\lambda$=365 nm) from above.
Figure 2C:
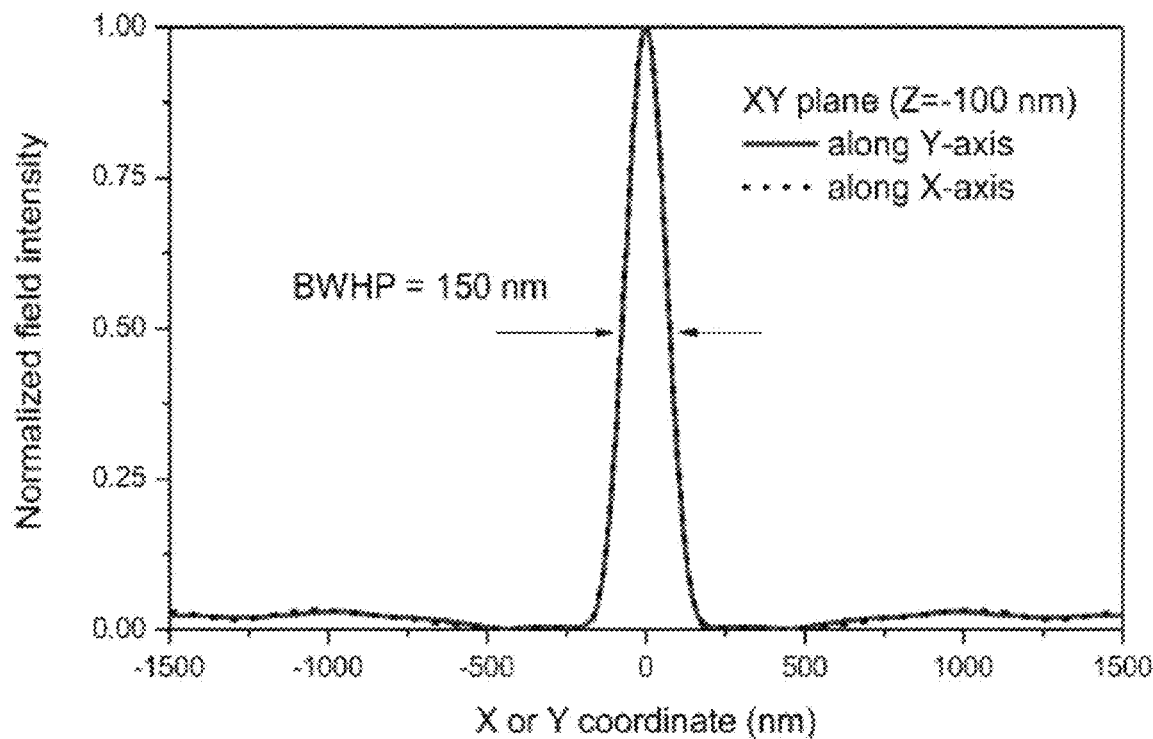
FIG. 2(c) presents a normalized field intensity distribution along X and Y axes at Z=−100 nm.
Figure 2D:
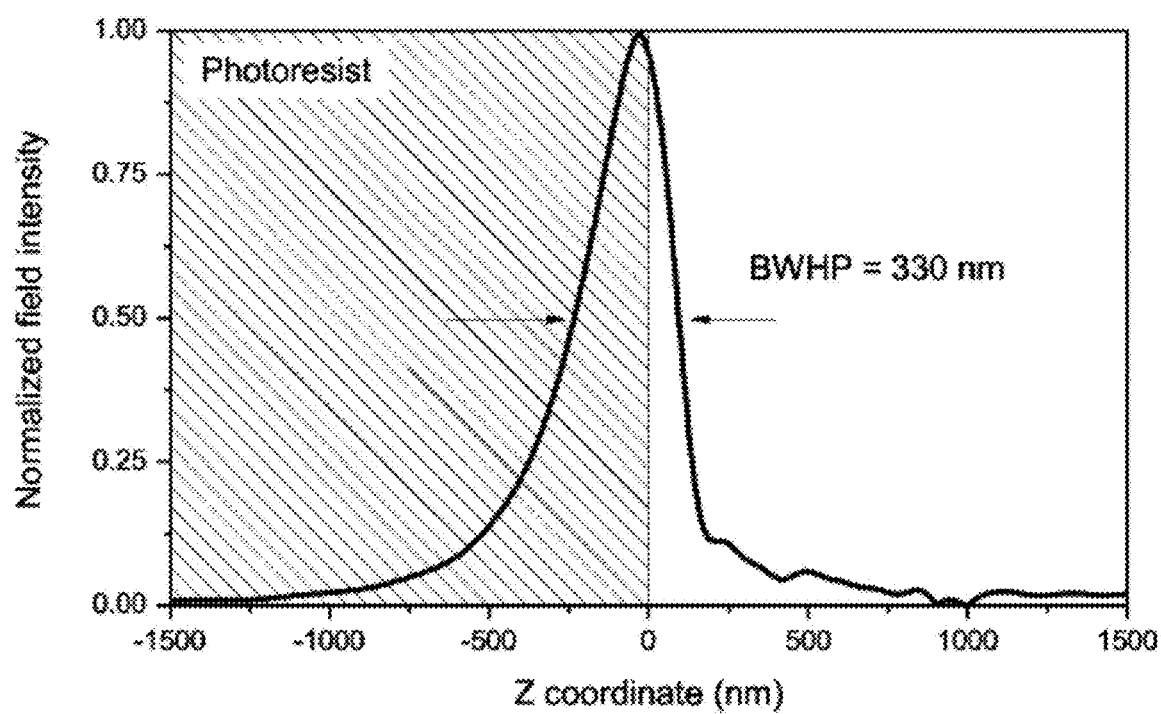
FIG. 2(d) presents a normalized field intensity distribution along Z-axis.

The FIG. 2(a) is a CAD model of a dielectric microsphere (n1=1.5, R=500 nm) positioned on top of a thick photoresist layer (n2=1.7) analyzed using a 3D-FDTD electromagnetic simulation software, FIG. 2(b) presents a normalized field intensity in YZ-plane when illuminated by UV light ($\lambda_0$=365 nm) from above, FIG. 2(c) presents a normalized field intensity distribution along X and Y axes at Z=−100 nm, and FIG. 2(d) presents a normalized field intensity distribution along Z-axis. It should be noted that Z=0 corresponds to the top surface of the photoresist layer.

Figure 3:
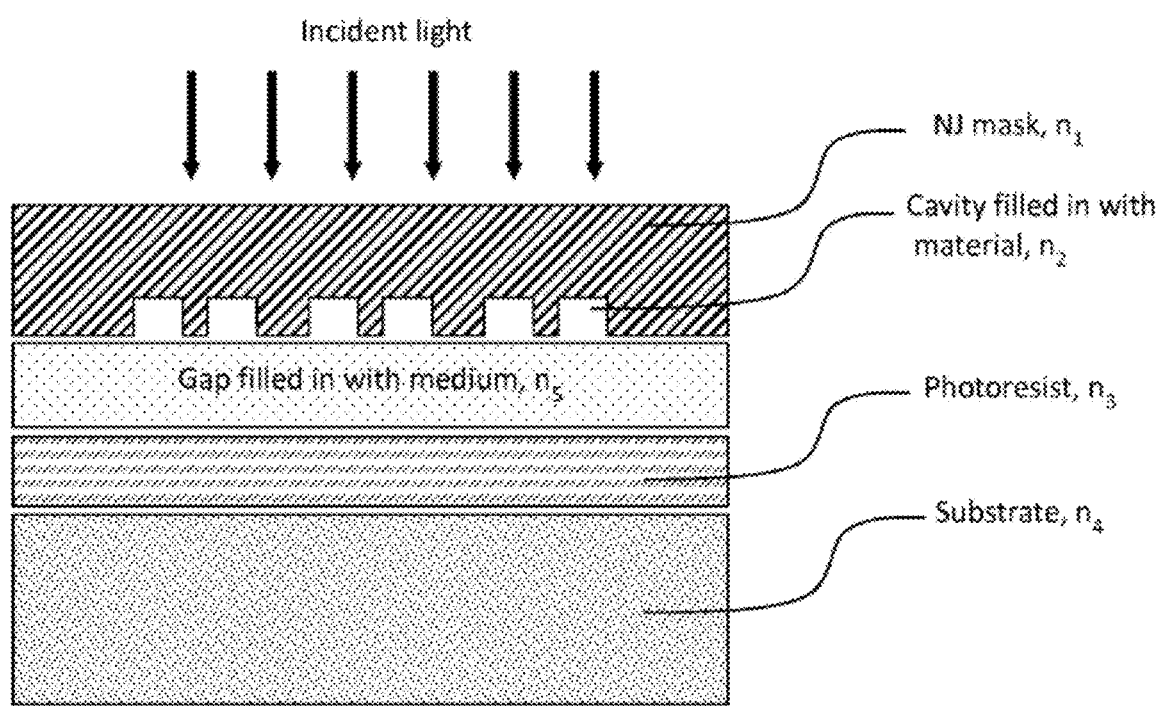
FIG. 3 presents a schematic illustration (side view) of the exposure phase of a photolithography fabrication technique with a photomask comprising nanojets generating elements according to one embodiment of the disclosure, and placed on top of a photoresist layer positioned on a substrate.

The FIG. 3 presents a schematic illustration (side view) of the exposure phase of a photolithography fabrication technique with a photomask comprising nanojets generating elements according to one embodiment of the disclosure, and placed on top of a photoresist layer positioned on a substrate.

Indeed, according to one embodiment of the disclosure, it is proposed to use a photomask (in a photolithography process or system) comprising elements or structures being able to generate nanojet beams as explained in the following. In one embodiment of the disclosure, these elements or structures correspond to nanojet-based focusing components.

In one embodiment of the disclosure, there is a gap between the photomask (noted Nanojet mask in FIG. 3) and the photoresist layer. In addition, such gap is filled with a medium that can be either a gas or a liquid. In a variant (not represented), the photomask is directly in contact with the photoresist layer (i.e. there is no gap). Therefore, the present technique can be used for both contact and proximity printing on the photoresist layer. It should be noted that in case of proximity printing, the photomask according to the present disclosure should be placed close enough to the photoresist layer, and the maximum or an optimal distance is to be determined in accordance with the length of the nanojet beam generated by the photomask.

According to one embodiment of the disclosure, it appears that diffraction of a plane electromagnetic wave on a dielectric object having an abrupt change level of its surface, also called a step, can result in the formation of condensed optical beams (so-called nanojets), that occur in a vicinity to the step, and are oriented towards the medium with higher refractive index value. The number of beams and shape of each individual beam can be controlled by the variation of the step size and shape of the step edge line, whereas the beam radiation angle and the field intensity enhancement in each individual beam can be controlled by the variation of the refraction index ratio at the boundary of the object in the vicinity of the step and the step base angle.

Unlike the well-known diffractive lenses whose focusing ability is predicted by the Fresnel theory, the nanojet beams are low-dispersive (they show no or small wavelength dependence for a same index ratio between the two materials). Moreover, the nanojet focusing component (or device) according to the present disclosure can produce multiple independent beams (having identical or non-identical shape), which is not possible with Fresnel diffractive lenses. These unique features make the nanojet-based focusing component (or device) according to the present disclosure attractive for photolithography techniques.

Indeed, according to one embodiment of the disclosure, it is proposed to use a photomask made up of a dielectric layer and comprising either cavities/steps as detailed in the following.

FIGS. 4 to 11 allow understanding the physical phenomena explaining the formation of nanojet beams according to the present disclosure.

Figure 4:
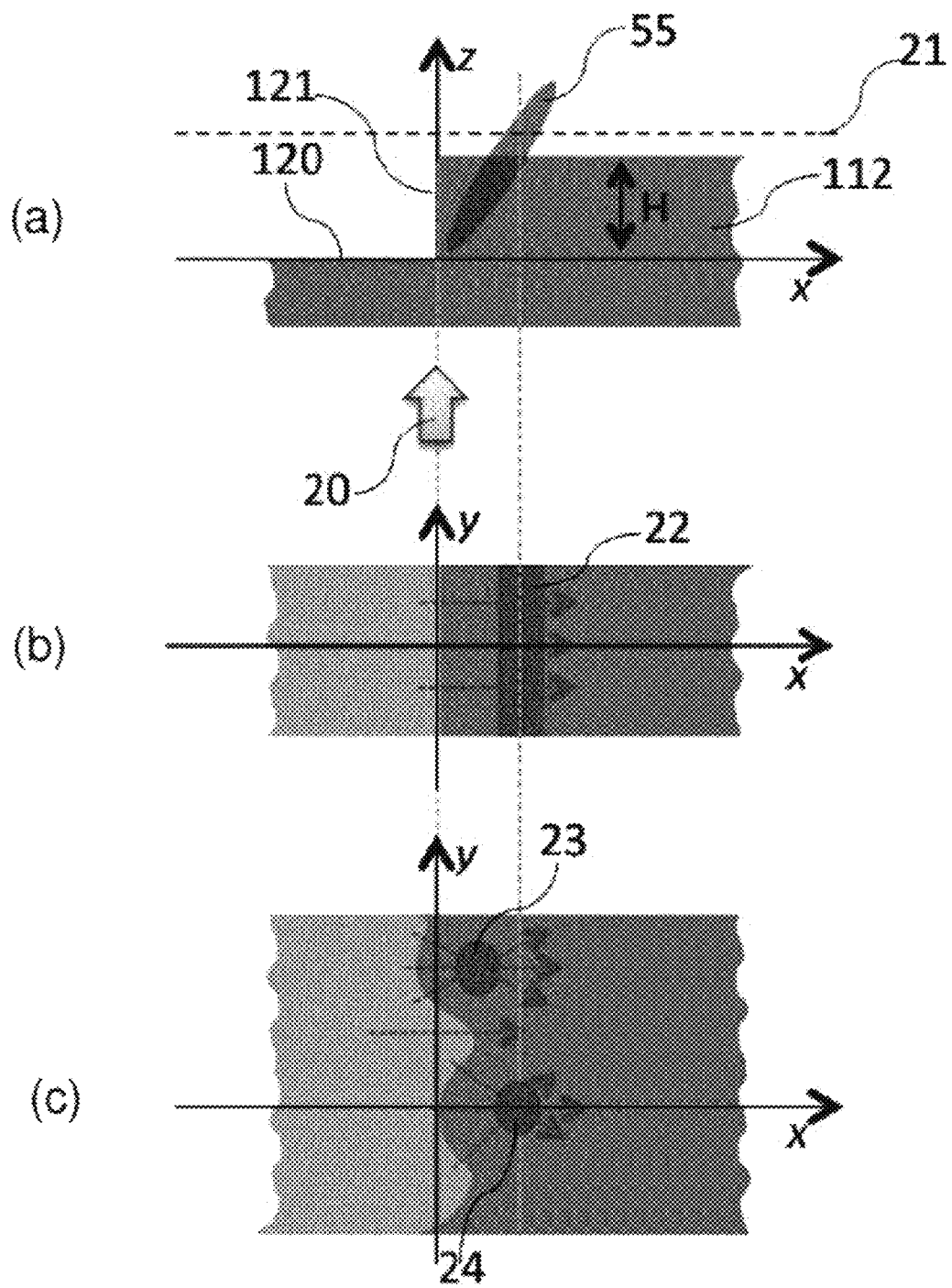
FIG. 4 illustrates a technique, where an abrupt change occurs in the level of the surface of a dielectric layer 112, thus forming a step in the layer.

FIG. 4 illustrates a technique, where an abrupt change occurs in the level of the surface of a dielectric layer 112, thus forming a step in the layer. FIG. 4(a) shows a side view of the dielectric layer 112. FIGS. 4(b) and 4(c) respectively show top views in case of a step with a straight (FIG. 4(b)) and curved (FIG. 4(c)) edge lines.

As shown in FIG. 4(a), the device is illuminated by a plane wave 20, incident on the device from below along z-axis with a propagation vector being orthogonal to the base surface of the dielectric layer 112. As schematically shown by the dashed arrows in FIGS. 4(b) and 4(c), a nanojet beam 55 originates from the base edge of the step, which comprises a horizontal part 120 and a lateral part 121 (which may also be tilted with respect to the z-axis forming an arbitrary base angle).

Spots referenced 22 to 24 indicate the corresponding hot spots in the field intensity distribution in the near zone formed in the imaging plane 21. The specific field intensity distribution with two hot spots 23, 24 observed in FIG. 4(c) is associated with the shape of the step edge line having two concave segments responsible for the formation of the two independent nanojet beams.

It should be noted that the boundary curvature of the cavity is a tool for changing the nanojet beam shape, position and field intensity enhancement level.

Figure 5:
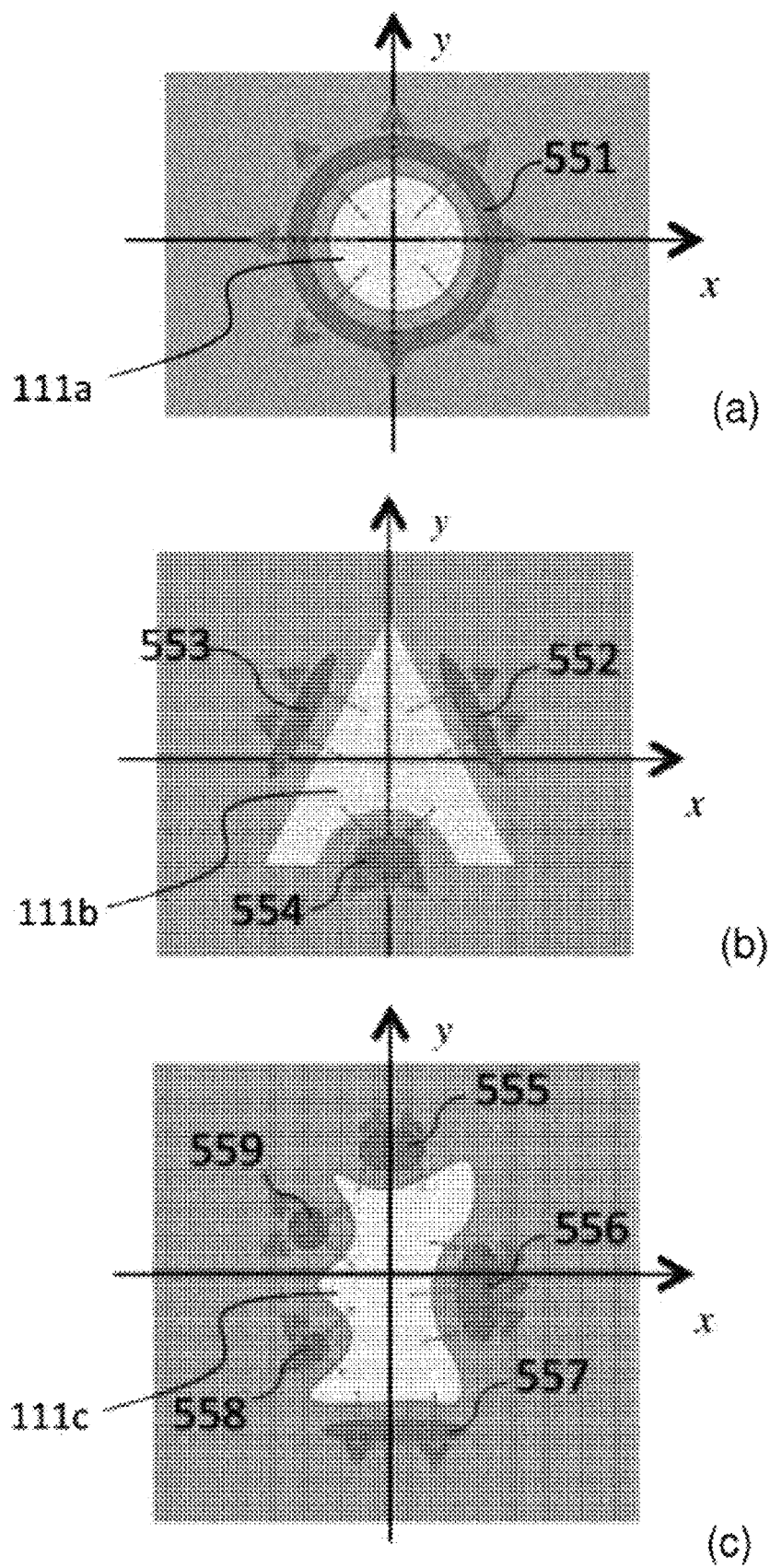
FIGS. 5(a) to 5(c) are schematic drawings of the field intensity distribution in the imaging plane for three exemplary cylindrical cavities with different cross-sections illuminated by a plane wave propagating along z-axis, i.e. from the plane of the figure.

FIG. 5, which presents a schematic drawing of the field intensity distribution in the imaging plane 21 for three exemplary cylindrical cavities with different cross-sections. More precisely, FIG. 5(a) shows a cavity 111a with a circular cross-section: the dashed arrows schematically show that nanojet beams originate from the base edge of this cavity 111a. The ring 551 indicates the hot spot in the field intensity distribution in the near zone formed due to the nanojet beams associated with different segments of the circular base edge line.

FIG. 5(b) shows a non-rotation-symmetric cavity 111b, whose cross-section in xy-plane is somehow triangular, but with one of the three edges of the triangle which is concave. Such a circa triangular cavity 111b creates three spots 552, 553 and 554, one of which (554) is enhanced, thanks to the concave edge.

FIG. 5(c) shows a cavity, which is arbitrary-shaped with five straight or concave segments. Spots 555 to 559 indicate the hot spots in the near-field distribution formed due to the nanojet beams originating from the base edge of the step, as schematically shown by the dashed arrows. The specific field distribution with five hot spots observed in FIG. 5(c) is linked to the specific shape of the edge line having five straight or concave segments responsible for the formation of five independent nanojet beams.

Figure 6:
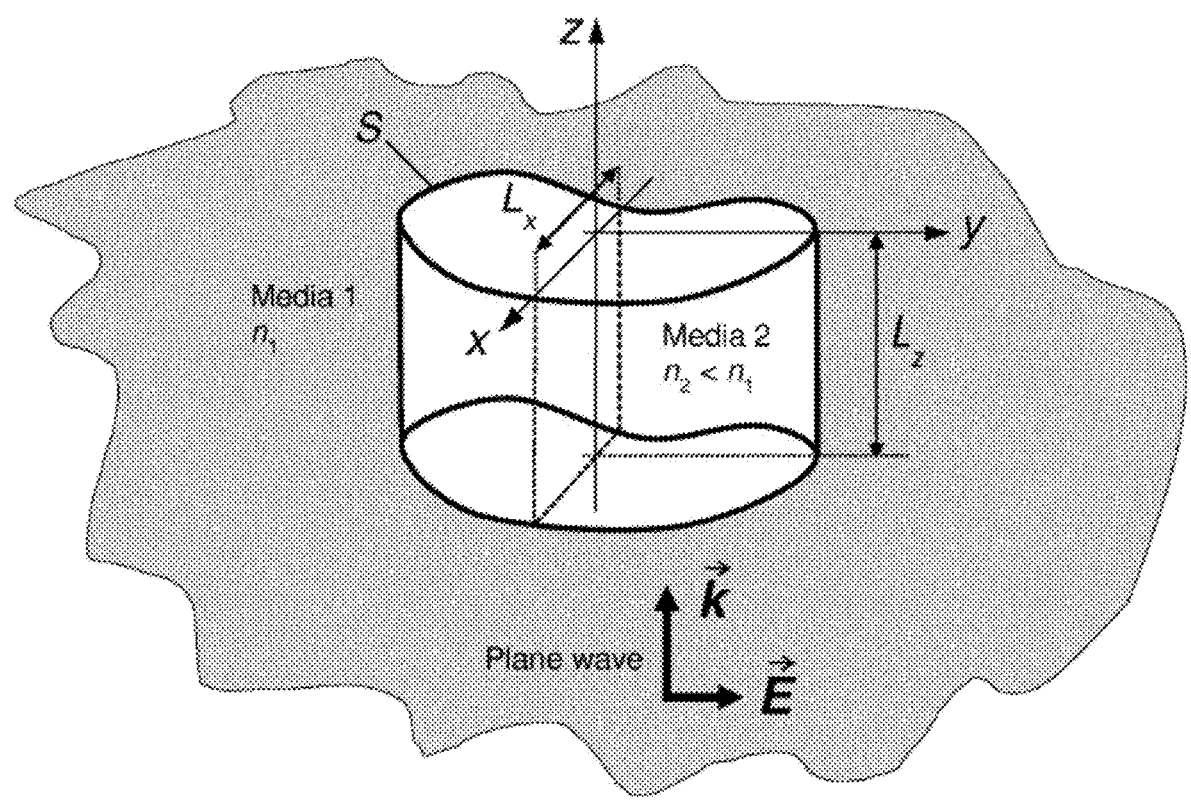
FIG. 6 illustrates the topology and notations of a cavity formed in a layer of dielectric material according to an embodiment of the present disclosure.

FIG. 6 illustrates an embodiment of the present disclosure, according to which the step formed at the surface of a layer of dielectric material is in fact the edge of a cavity 111 made in the layer of dielectric material 112. The present disclosure is of course not limited to such an embodiment, and any abrupt change of level at the surface of the dielectric material is sufficient for generating the physical phenomenon, which will be described hereafter. Such a step can indeed be considered as the edge of a cavity of infinite size.

It must be understood that, in case of a cavity, the focusing function is to be associated not with the entire structure, but with an elementary segment of the step discontinuity. The other segments of the step discontinuity will contribute to the formation of the same or other nanojet beams that may form all together (i) a wide uniform "blade like" nanojet beam as in case of an infinite step (FIG. 4(b)), or (ii) a spot or ring in case of an arbitrary-large circular cylindrical cavity (FIG. 5(a)), or (iii) an arbitrary number of localized beams of different shapes produced by a curvilinear edge of an arbitrary-shaped cavity (FIGS. 5(b) and 5(c)).

For sake of simplicity, we therefore focus hereafter on the example of a cavity 111 formed in the layer of dielectric material 112, like the one illustrated in FIG. 6.

As may be observed, such a cavity is cylindrical, with a cross-section of arbitrary shape. By cylindrical cavity, it is meant here, and throughout this document, a cavity which shape is a cylinder, i.e. a surface created by projecting a closed two-dimensional curve along an axis intersecting the plane of the curve. In other words, such a cylinder is not limited to a right circular cylinder but covers any type of cylinder, notably, but not exclusively, a cuboid or a prism for example.

The cavity may also have the form of a cone. Its main axis may be orthogonal to the surface of the bottom of the cavity, or be tilted. Due to the fabrication tolerance, the cavities may also have imperfect shapes, and it must be understood, for example, that cavities targeted to be shaped as cylinders, may become cone-shaped cavities with S-shape cross-sections during the manufacturing process.

More generally, such cavities are formed as cylinders or cones with an arbitrary cross-section, which can be adapted (optimized) in order to produce a desired near-field pattern, i.e. a desired field intensity distribution in the xy-plane (typically orthogonal to the incident wave propagation direction). This pattern may have one or multiple hot spots with identical (or different) field intensity level.

Non-symmetric cavities are also possible. For example, a cavity which cross-section in the xy-plane is triangular will create three spots. One of them can be enhanced if the corresponding face is concave, as will be explained in greater detail in relation to the figures.

FIG. 6 gives some notations, which will be used hereafter in the document. As may be observed, the cavity is immersed in a host medium Media 1 noted 112 of refractive index $n_1$, and is filled with a material (air, gas, dielectric, polymer material . . . ) Media 2 of refractive index $n_2$, such that $n_2 < n_1$.

For example, the cavity can have a form of a circular cylinder filled in with vacuum ($n_2=1$) and embedded in a homogeneous non-dispersive dielectric medium with an example refractive index $n_1=1.49$ and illuminated by a linearly-polarized unit-amplitude plane wave $E_y=1$ (V/m) propagating in the positive z-axis direction (see FIG. 6 for notations).

Figure 7:
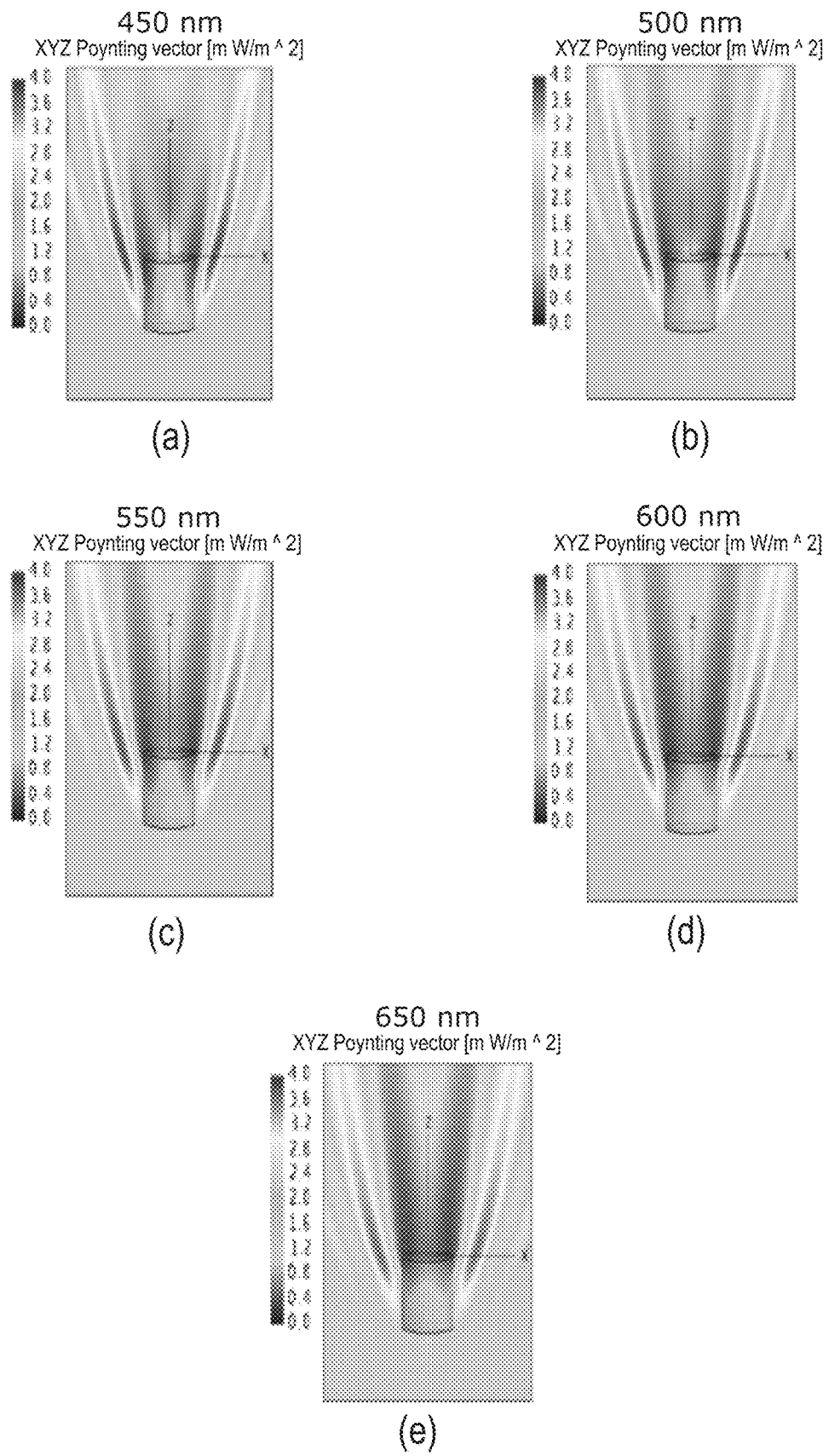
FIGS. 7 (a) to 7 (e) illustrate the formation of a nanojet beam by the hollow cylindrical cavity of FIG. 6, having a circular cross-section, when illuminated by a plane wave at different wavelengths ($n_1$=1.49, $n_2$=1)

FIG. 7 illustrates the formation of a nanojet beam by such a cavity when illuminated by this plane wave. More precisely, FIGS. 7(a) to 7(e) each correspond to a different wavelength of the incident electromagnetic wave, namely $\lambda_0=450$, 500, 550, 600 and 650 nm, and show near-field maps in the XZ-plane plotted in terms of the power density characterized by the time average Poynting vector defined as:

$$P = E_m^2/2\eta \approx 1.3\ n\ E_m^2\ \left[\frac{mW}{m^2}\right], \quad \text{(equation 1)}$$

where $E_m$ is the amplitude of the E-field, $\eta$ is the wave impedance in a host medium and n is the host medium refractive index. Note that according to equation (1), the power density value associated with a unit-amplitude plane wave propagating in a dielectric host medium with a refractive index n is equal $$P_0 \approx 1.3n\ \left[\frac{mW}{m^2}\right].$$

Hereafter, this value is considered as a reference for the definition of the relative field intensity enhancement (FIE) achieved using different types of nanojet elements embedded in the corresponding host media:

$$FIE=P/P_0[a.u.] \quad \text{(equation 2)}$$

where P is the simulated power density characterized by the time average Poynting vector and $P_0$ is the reference power density of the unit-amplitude plane wave propagating in the same host medium.

Figure 8:
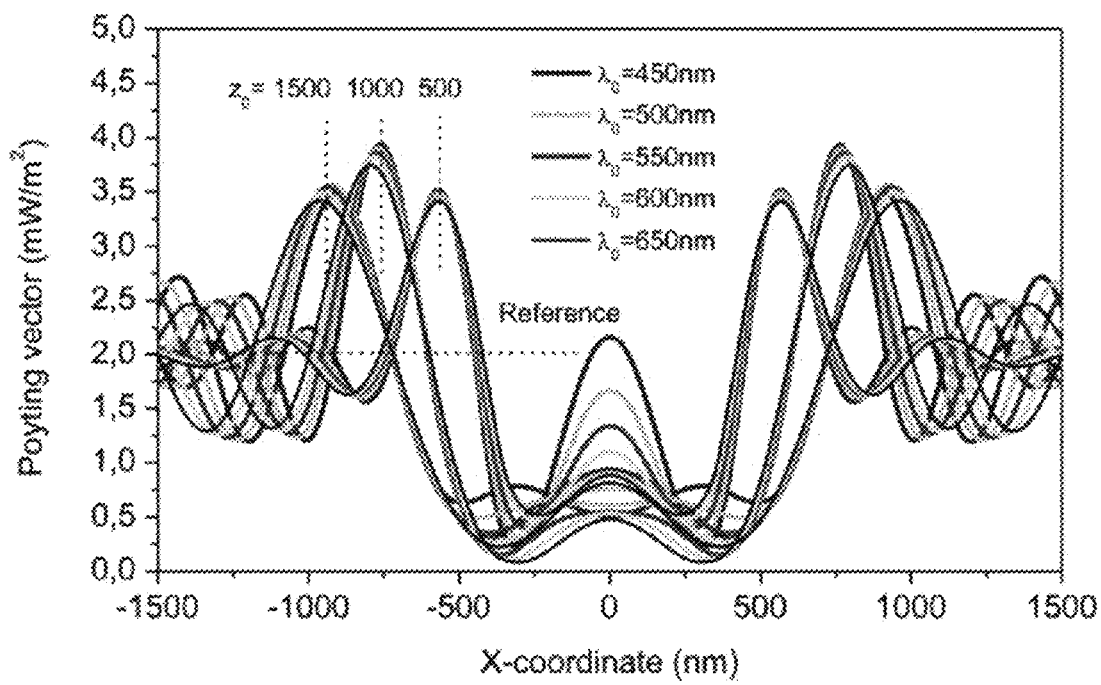
FIGS. 8 and 9 provide an analysis of the nanojet beam radiation angle of FIGS. 7(a) to 7(e)
Figure 9:
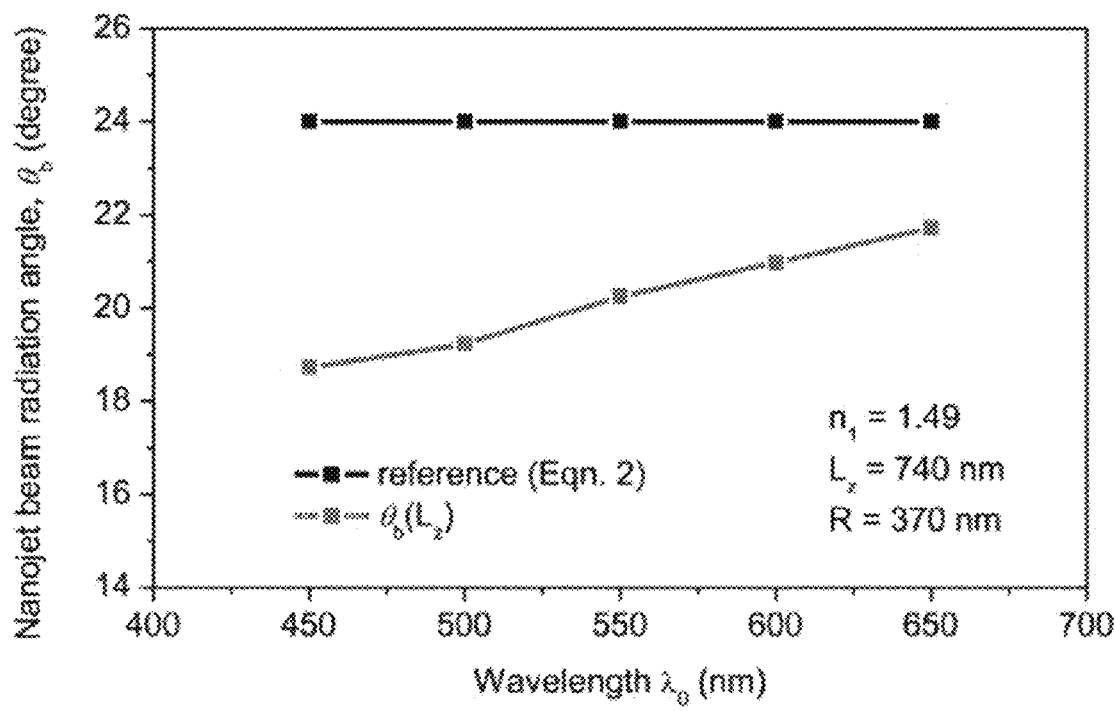

As may be observed in FIG. 7, the shape of the nanojet beam and its direction remain stable in a wide wavelength range. The detailed analysis of the nanojet beam radiation angle is reported in FIGS. 8 and 9. FIG. 8 illustrates the Poynting vector in the XZ-plane at three different planes defined as $z=z_0-L_z$, for the five different wavelengths of FIG. 7. FIG. 9 illustrates the nanojet beam radiation angle calculated based on the positions of maxima in FIG. 8 as a function of wavelength.

These data extracted from near-field maps reveal that the variation of the nanojet beam radiation angle does not exceed 3° for the wavelength range from at least 450 to 750 nm. As it is seen in FIG. 8, the major contribution to the angle variation comes from the beam tilt above the cylinder ($z_0=1500$ nm, where $z_0$ is a relative position of the imaging plane defined with respect to the cavity bottom, i.e. $z_0=z+L_z$), whereas the beam shape (at $z_0=500$ nm) remains stable for the entire wavelength range. Such a behavior is not typical for Fresnel-type diffractive lenses and thus requires detailed explanations.

The origins of the nanojet beams can be explained by the combination of three electromagnetic phenomena, which occur in the vicinity of the base edge of the hollow cavity (or more generally in the vicinity of the abrupt change of level in the surface of the dielectric material), namely:

diffraction from the index-step discontinuity associated with the base 120 of the cavity (or, more generally with the surface of lower level of a step formed in the host medium), refraction of the diffracted wave at the vertical edge 121 of the cavity (or more generally on the lateral surface of the step), and interference of the refracted wave and the incident plane wave outside the cavity (or more generally in the host medium).

Figure 10:
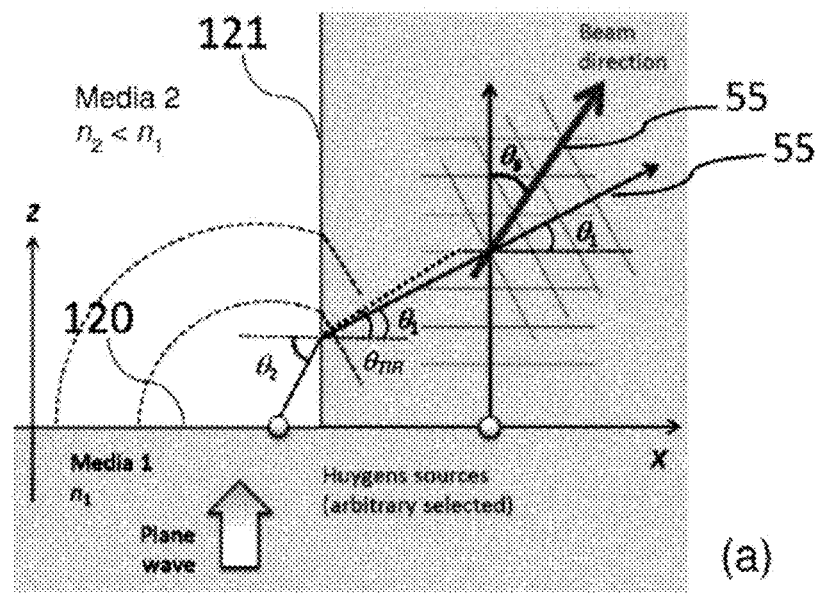
FIGS. 10(a) and 10(b) illustrate the complex electromagnetic phenomenon underlying at least some embodiments of the present disclosure.
Figure 10:
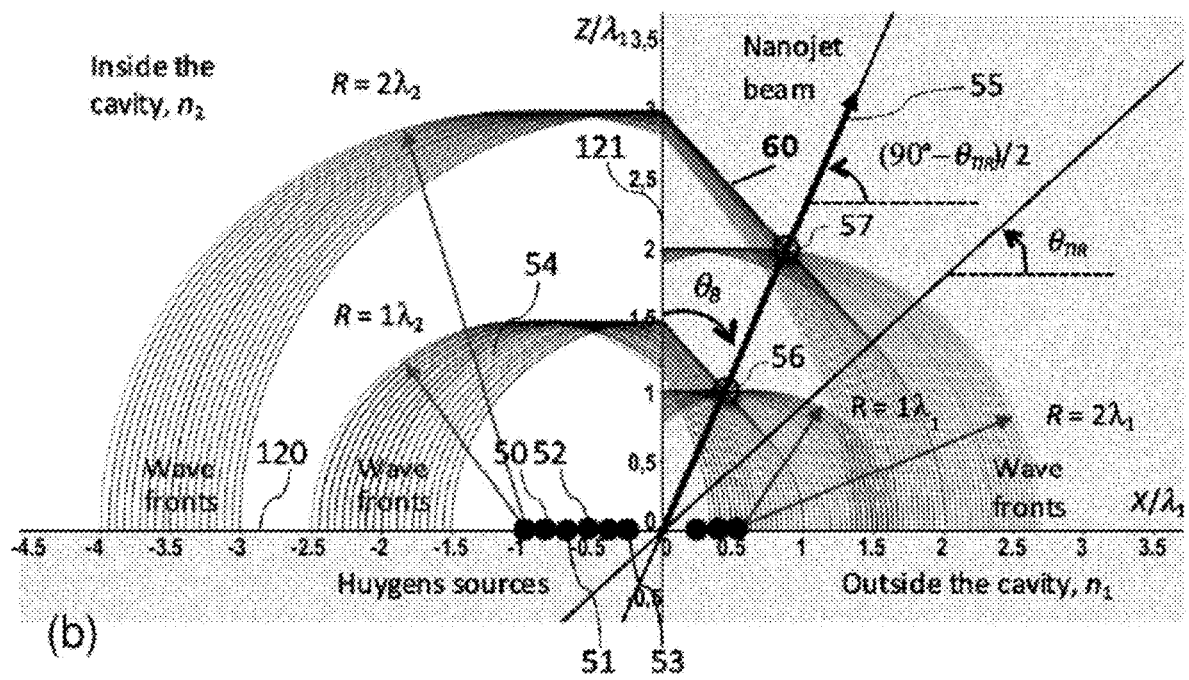
Figure 11:
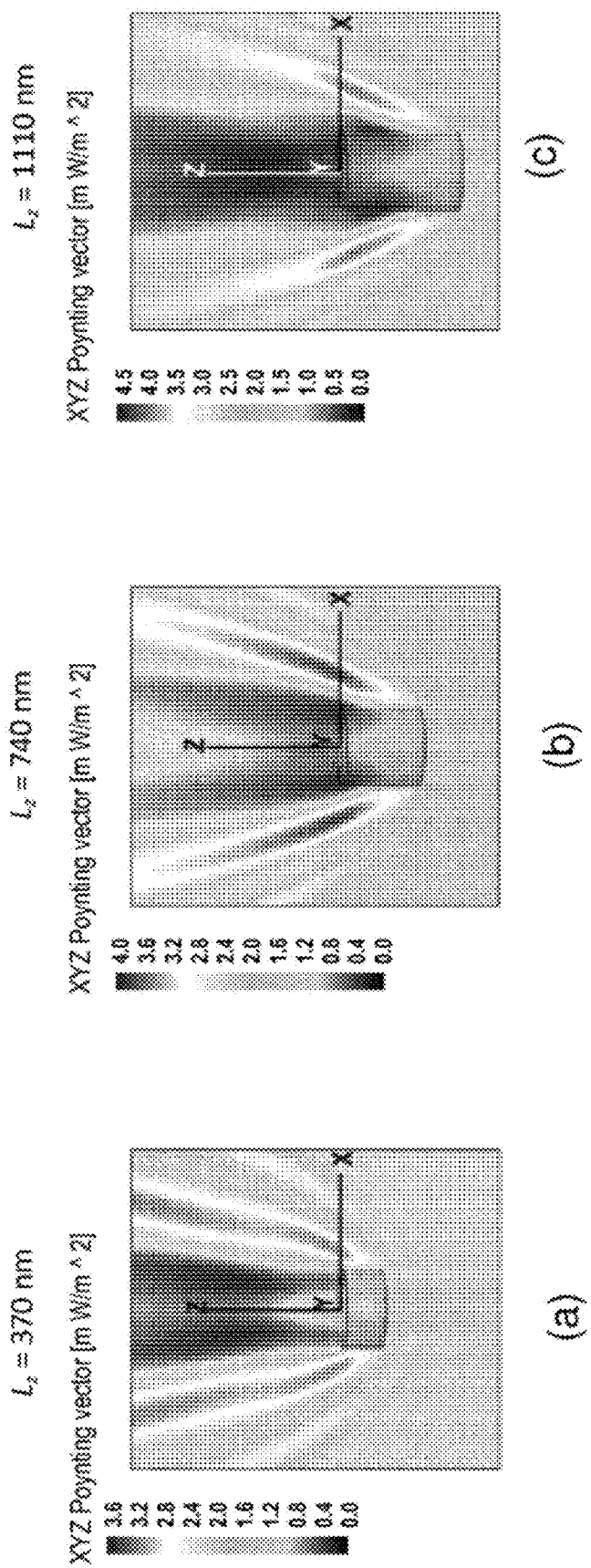
FIGS. 11(a) to 11(c) illustrate near-field maps of the nanojet beam produced by hollow cylindrical cavities of different heights when illuminated by a unit-amplitude plane wave from below according to embodiments of the present disclosure ($n_1$=1.49, $n_2$=1)

A schematic drawing illustrating these three phenomena is given in FIG. 10. As in FIGS. 7, 8 and 9, we assume that host media is an optically-transparent non-dispersive dielectric material with a refractive index $n_1=1.49$ (e.g. plastic or glass) and the cavity is filled with vacuum or air, $n_2=1$. The incident plane wave arrives from below in the diagram.

The key elements of the complex electromagnetic phenomena illustrated in FIGS. 10(a) and 10(b) are the following:

The incident plane wave induces equivalent currents at the dielectric-air boundary 120 associated with the cavity base (or more generally when reaching the step of index in the host medium induced by the abrupt change of level in its surface);

These induced currents are considered as Huygens secondary sources 50 to 53;

In line with the diffraction theory, the spherical waves 54 radiated by the Huygens sources cause some power leakage towards the 'shadow region', i.e. beyond the lateral boundary 121 of the cavity;

While crossing the lateral (vertical) boundary, the waves radiated by the Huygens sources experience refraction that causes a tilt of the refracted wave on a certain angle in accordance with the Snell-Descartes's law.

In FIG. 10(b), we can notice that outside the cavity the wave fronts coincide for different Huygens source positions along the cavity base line, thus creating a local field enhancement. The planar shape of these fronts evidences for the creation of a directive beam propagating out of the cavity.

Finally, outside the cavity the refracted wave is constructively interfering 56, 57 with the plane wave incident from below giving rise to the nanojet beam 55.

The nanojet beam creation is hence explained by phenomena that are low-dispersive in their nature, namely (i) edge diffraction, (ii) refraction of the wave at the interface of two dielectric media, and (iii) interference. This explains why the shape of the beam and its radiation angle remain stable versus wavelength, as may be observed in FIGS. 7(a) to 7(e).

Moreover, the nanojet beam radiation angle is defined by the Snell's law and, thus, is only a function of two parameters:

ratio between the refraction indexes of the host media and cavity materials, and the base angle of the cavity. For sake of simplicity, in the foregoing, we only consider a cavity with the base angle equal 90° thus having a cylindrical shape with vertical edges.

Last, the nanojet beam-forming phenomenon is associated with the edge (not a full aperture) of the cavity and occurs in the 2-D vertical plane orthogonal to the cavity cross-section (see FIG. 6 for notations).

As follows from FIG. 10(b), the main contribution to the formation of the planar wave front of the refracted wave outside the cavity comes from the Huygens sources 50-53 located close to the lateral edge 121 of the cavity. Because of this, the refraction angle of the wave radiated outward the cavity is close to the critical angle for the wave incident on the same boundary from outside (FIG. 10(a)):

$$\theta_1 \approx \theta_{TIR} \quad \text{(equation 3)}$$

where $\theta_{TIR} = \sin^{-1}(n_2/n_1)$ is the critical angle for a diopter with indices $n_1$ and $n_2$.

The nanojet beam 55 is finally created as a result of the interference between the refracted wave and the plane wave incident from below. Thus, the angle of radiation of the nanojet beam ($\theta_B$) is defined by a vector sum of the two waves as schematically shown in FIG. 10(a). These considerations lead one to the following approximate formula for the radiation angle of the nanojet beam:

$$\theta_B \approx \left(\frac{\pi}{2} - \theta_{TIR}\right)/2 \quad \text{(equation 4)}$$

According to equation (4), in the case of a host medium with index $n_1=1.49$ ($\theta_{TIR}=41.8°$), the nanojet beam radiation angle should be $\theta_B \sim 24°$ that is slightly larger than observed in the full-wave simulations (see FIG. 9). This difference is explained by the assumptions made in the qualitative analysis. First, this analysis does not take into account the difference in the amplitude of the diffracted/refracted wave and the incident plane waves. Second, it does not take into account the rays launched by the Huygens sources located close to the cavity edge from outside that experience the total internal reflection on the cavity lateral edge. Being totally reflected, these rays also contribute to the formation of nanojet beam. Note that these two effects are related to the total internal reflection phenomenon and thus cannot be accurately characterized using Snell/Fresnel model. Nevertheless, these both effects (i) depend on the ratio of refraction indexes of the two media and (ii) result in reducing the nanojet radiation angle. Thus, the actual nanojet radiation angle can be smaller than that predicted by equation (4).

FIGS. 10(a) to 10(c) illustrate near-field maps of the nanojet beam produced by cylindrical cavities ($n_1=1.49$, $n_2=1$, R=370 nm) of different heights ((a) H=$L_z$=370 nm, (b) H=$L_z$=740 nm, (c) H=$L_z$=1110 nm) when illuminated by a unit-amplitude plane wave from below. As may be observed, the nanojet phenomenon is well pronounced for the cavity size varying from about one to a few wavelengths in the host medium, namely $\frac{1}{2}\lambda_1 < L_z < 3\lambda_1$.

The minimum height is needed to form the planar wave front 60 illustrated in FIG. 10(b) that gives rise to the nanojet beam. However, the height of the cavity (or the height of the step) should not be too large as compared to the length of the nanojet beam, in order for it to be useful outside the focusing component or device.

As shown on FIGS. 11(a) to 11(c), the length of the nanojet beam can vary from a few to several wavelengths in the host medium depending on the cavity shape and size.

Based on the 2-D ray-tracing analysis of FIG. 10(b), the main contribution in the formation of the nanojet beam comes from the feeds located close to the cavity lateral surface (or to the lateral part of the step). The corresponding 'effective aperture' responsible for the formation of the nanojet beam is estimated as about one half of the wavelength in the medium inside the cavity ($\frac{1}{2}\lambda_2$) that is to be counted from the lateral edge inward the cavity. For the cavity having arbitrary shape, this aperture is to be defined along the line orthogonal to the cavity edge line, S in a plane orthogonal to the incident wave propagation direction (see FIG. 6).

In 2-D case (which may correspond to any vertical cross-section, e.g. in xz-plane), the local field intensity enhancement (FIE) achieved thanks to the nanojet beam formation is about a factor of 2 compared to the incident plane wave (see formula (2) for the definition). A larger FIE can be achieved by modifying the shape of the cavity cross-section and, in particular, the shape of the cavity edge line 5, as will be explained hereafter in greater details.

The nanojet beam width at half power (BWHP) can vary from about $\frac{1}{2}\lambda_1$ (that is order of the diffraction limit) to several wavelengths and more depending on the shape of the cavity.

FIGS. 12(a) to 12(d) show nanojet beams produced by a hollow cylindrical cavity ($n_1=1.49$, $n_2=1$, $L_z=740$ nm, R=370 nm) under different angles of incidence of the unit-amplitude plane wave in XZ-plane, namely θ=0° in FIG. 12(a), θ=10° in FIG. 12(b), θ=20° in FIGS. 12(c) and θ=30° in FIG. 12(d).

The symmetry of the near-field patterns in the XY-plane (see FIG. 12(a)) evidences that the beam shape and radiation angle remain nearly constant for both TE (Transverse Electric) and TM (Transverse Magnetic) polarizations of the incident wave.

Figure 12:
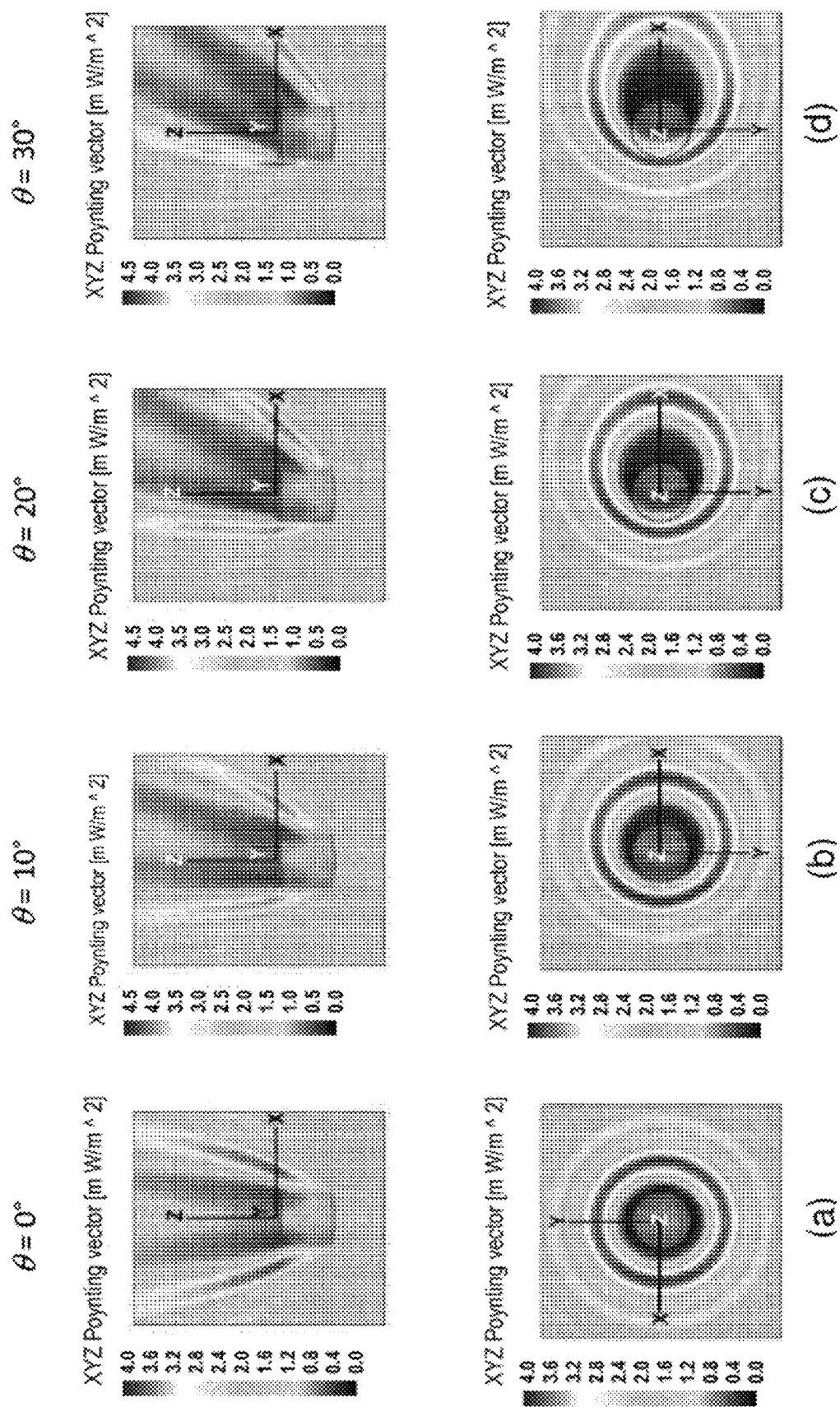
FIGS. 12(a) to 12(d) show nanojet beams produced by a hollow cylindrical cavity under different angles of incidence of the unit-amplitude $E_y$ plane wave in XZ-plane ($n_1$=1.49, $n_2$=1)

Moreover, in case of an incline incidence, it may be observed in FIG. 12 that the beam radiation angle changes in correspondence to the angle of incidence of the plane wave. The shape of the beam and field intensity enhancement remain nearly constant for incidence angle up to about $\theta_B$.

Figure 13:
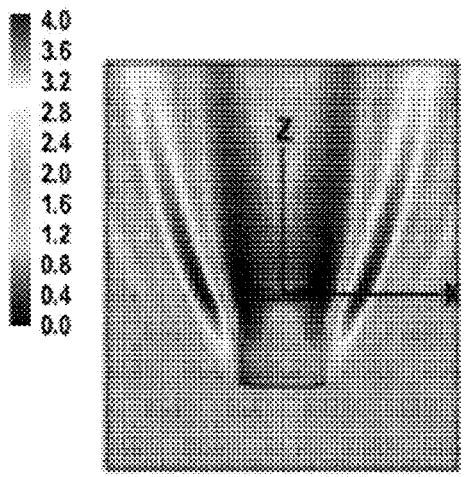
FIGS. 13(a) and 13(b) illustrate the nanojet beams phenomenon as observed for different host media according to embodiments of the present disclosure.
Figure 13:
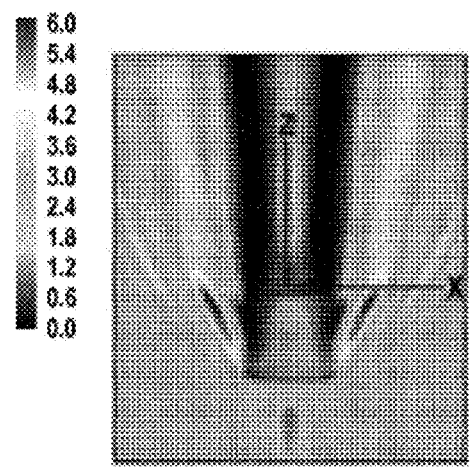
Figure 13:
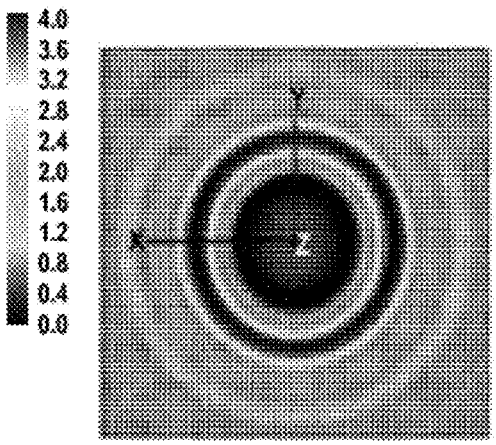
Figure 13:
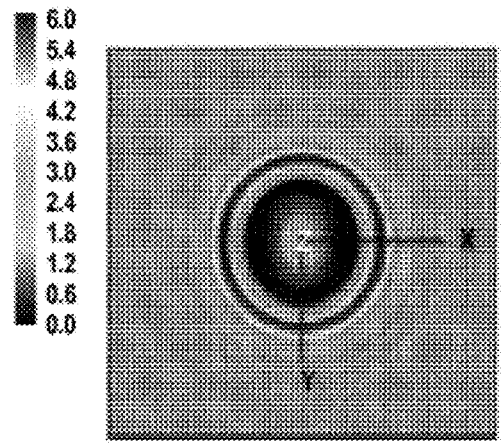

FIG. 13 illustrates the nanojet beams phenomenon as observed for different host media, including standard optical plastics and standard or doped glass. Such nanojet beams are produced by a hollow circular cylindrical cavity having the same physical dimensions ($n_2=1$, $L_z=740$ nm, R=370 nm) but embedded in a host medium of refractive index $n_1=1.49$, in FIG. 13 (a) and $n_1=2.0$, in FIG. 13(b).

The understanding of the nanojet formation phenomena illustrated through FIGS. 4 to 13 allows designing various devices, which can be used as focusing components, beam-forming components, or more generally components (or device) for forming any desired field intensity distribution in the near zone. Such components may be used for transforming an incident plane wave into one or multiple independent beams, or, conversely, for transforming an incident wave beam (whatever its wavelength) into a locally plane wave, in accordance with the symmetrical path properties of electromagnetic waves.

As explained above in the present disclosure, the formation of the nanojet beams is associated with the lateral part of the step in the layer of dielectric material, or with the lateral edge of the cavity, but not its full aperture. By optimizing the shape of the cross-section of the cavity S, it is possible to control the shape of the nanojet beam(s) produced by this cavity.

Figure 14:
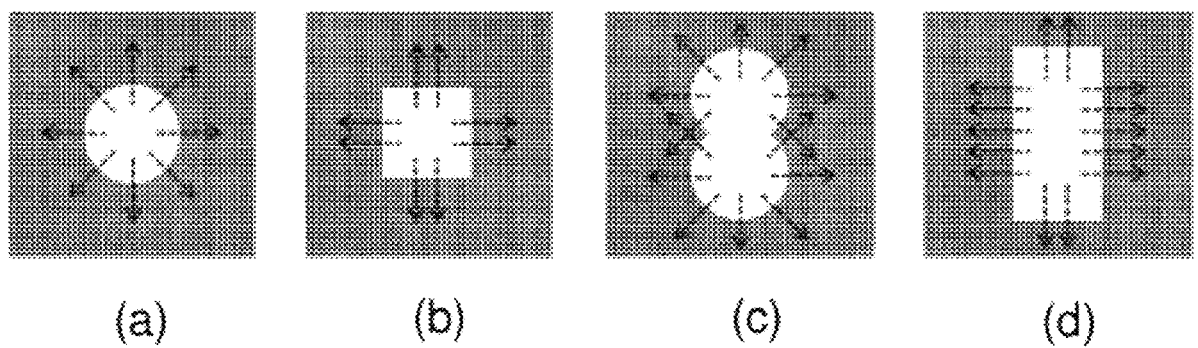
FIG. 14 shows four exemplary cylindrical cavities each having a different shape of its cross-section boundary, namely: (a) circular, (b) square, (c) 8-shape, and (d) rectangular, according to embodiments of the present disclosure.
Figure 15:
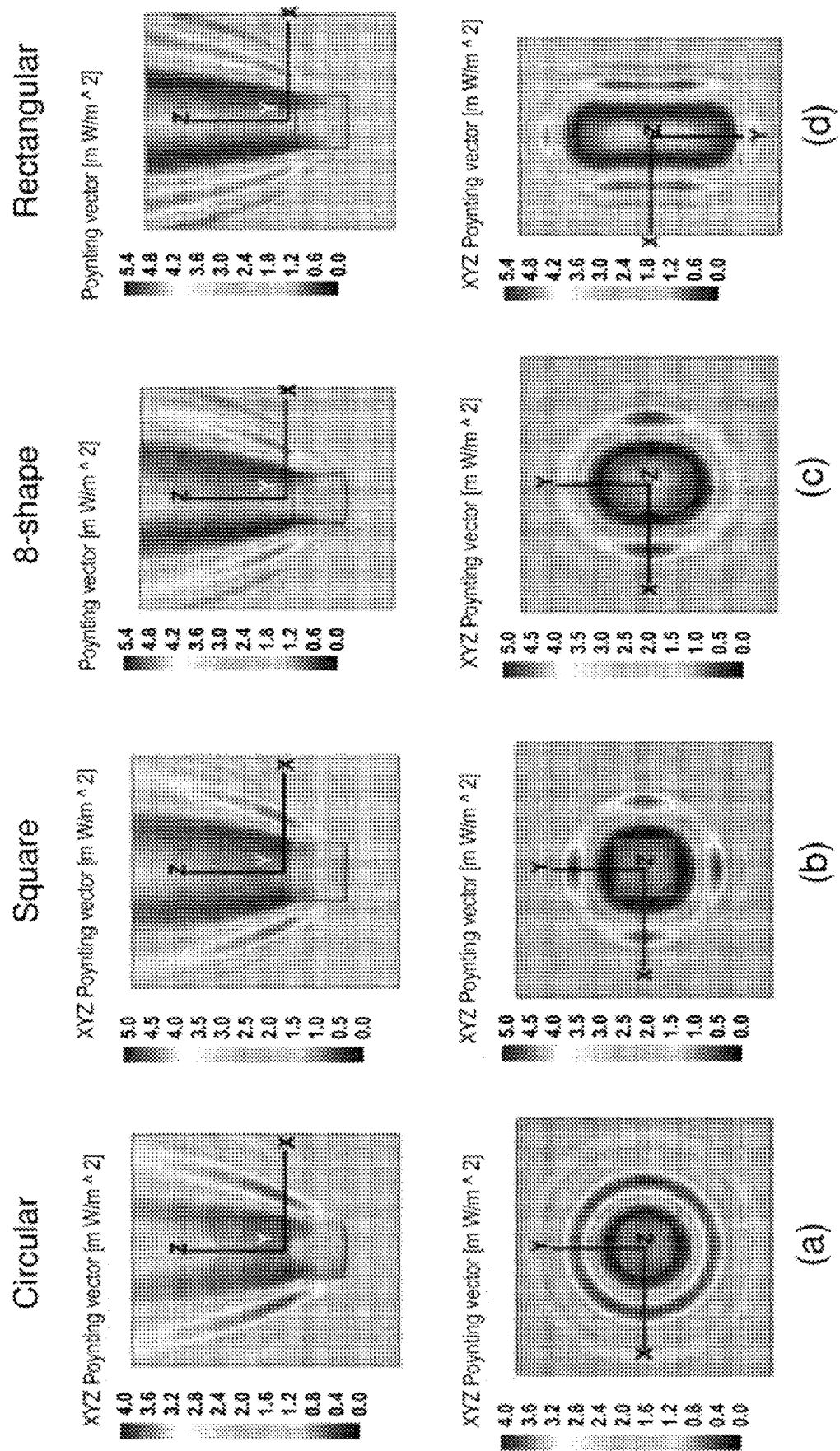
FIGS. 15(a) to 15(d) show the corresponding simulated near-field maps for each cavity of FIG. 14—top row: views from the side, bottom row: views from above.

FIG. 14 shows four exemplary cylindrical cavities having each a different shape of the cross-section boundary, namely: (a) circular, (b) square, (c) 8-shape, and (d) rectangular. The dashed arrows schematically show some vertical cut planes and directions of the generated nanojet beams when these cavities are illuminated by a plane wave propagating along z-axis, from the plane of the figures. These cut planes are defined with respect to the direction of the normal vectors defined at the corresponding points of the cavity cross-section boundary. The corresponding simulated near-field maps for each cavity are shown in FIGS. 15(a) to 15(d), which illustrate the power density distribution in xz-plane (y=0) and xy-plane ($z=z_0$) for hollow cavities, having same height and radius but different cross-section shapes ($L_z=L_x=2R=740$ nm), illuminated by a unit-amplitude plane wave propagation in the positive z-axis direction: (a) circular, (b) square, (c) 8-shape, (d) rectangular. The spots 101 to 104 in the xy-plane identify the nanojet beams, whose shapes and positions are well in line with the predictions given in FIG. 14 (these near-field maps are computed at arbitrary-selected xy-plane, defined with respect to the cavity base plane).

In particular, FIG. 15(a) shows that the axially-symmetrical circular cavity produces a diverging conical beam, whose cross-sections in the vertical (xz) and horizontal (xy) planes are shown in FIG. 15(a) top and bottom figures, respectively. It is interesting to note that this conical beam is nearly-symmetrical (see the near-field pattern in horizontal xy-plane), which is an evidence for the polarization-insensitive behavior of such component (or device). The field intensity enhancement observed in this configuration is a factor of two, i.e. FIE≈2 a.u. (defined in accordance with equation 2).

FIGS. 15(b) and 15(c) show how the transformation of the cavity cross-section, S, from the circular shape to rectangular and 8-shape causes the formation of multi-beam near-field patterns with four (referenced 104) and two (referenced 103) nanojet beams, respectively. This beam-forming effect is related to the transformation of the boundary segments from a convex shape to a planar shape and then to concave shape, respectively. The beams observed in FIGS. 15(b) and 15(c) have a radiation angle similar to the one of the conical beam produced by the circular cylinder (FIG. 15(a)). At the same time, the width of the beams in terms of the azimuth angle is different. The larger the internal angle of the concave segment of the cavity cross-section boundary, S, the narrower the beam and the higher the field intensity. In particular, the FIE for the two cavities presented in FIGS. 15(b) (square shape) and 15(c) (rectangular shape) is equal to ~2.5 a.u. and ~2.8 a.u., respectively.

Finally, FIG. 15(d) shows a wide blade-like nanojet beam generated by the hollow rectangular cavity. This example demonstrates the possibility to form wide beams that can be of interest for certain applications requiring uniform illumination of narrow shaped areas.

The boundary curvature of the cavity is hence a tool for changing the nanojet beam shape, position and field intensity enhancement.

The same approach can be used to build more complex components with symmetrical or non-symmetrical cross-sections producing an arbitrary number of identical or different nanojet beams, as depicted in FIG. 5.

However, the nanojet focusing components (or devices) previously described in FIGS. 4 to 15 have some constrains related to the limited field intensity enhancement and fixed radiation angle of the nanojet beam that need to be improved in order to make the nanojet elements or components (also named nanojet lenses or devices) capable of reproducing the focusing functions of their conventional analogs, such as refractive and diffractive micro elements.

In one embodiment of the disclosure, it is proposed to transform the configuration of the cavity in such a way that all the nanojet beams, originating from different segments of the cavity cross-section boundary, recombine and contribute to the formation of a single high-intensity nanojet beam located on the axis of symmetry of the cavity and oriented along this axis, i.e. with no tilt compared to the incident plane wave.

Figure 16:
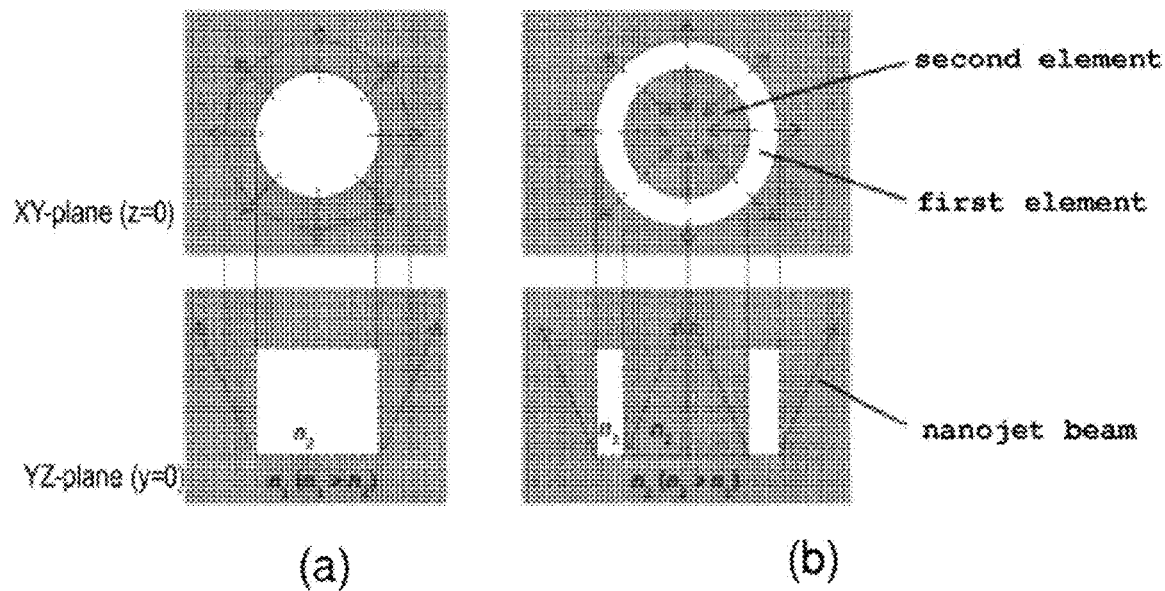
FIG. 16 presents a schematic drawing and compares a cavity composed of a single-core hollow cylinder (FIG. 16(a)) and a double-layer ring-type structure with a core filled in with the host medium according (FIG. 16(b)) to one embodiment of the disclosure. The arrows schematically indicate propagation directions for the nanojet beams originating from different segments of the cavities base edge lines.

In order to achieve this, it is proposed to use a device comprising at least one layer of a dielectric material comprising at least partially a first element (for example having the shape of a cylinder or a cuboid as depicted in FIG. 16(a)), such first element having a first refractive index value, such first element comprising at least partially a second element (for example having the shape of a cylinder, or other shapes as depicted in FIG. 27), such second element having a second refractive index value greater than the first index value, and wherein the second element comprises at least a base surface, defined with respect to an arrival direction of an electromagnetic wave, and wherein the at least a base surface comprises at least two opposite edge line segments (see for example the FIG. 32) whose shape (for example the curvature) and associated base angles between the at least a base surface and a lateral surface of the second element, in a vertical plane with respect to said at least a base surface, control a shape of at least one focused beam (see for example the FIG. 32).

It should be noted that the intensity of the at least one focused beam is defined by the length of the two corresponding edge line segments of the at least a base surface.

As schematically shown in FIG. 16(b), the desired effect can be achieved by exchanging the index values inside and outside the cylinder. The additional advantages of the proposed ring-type structure include the natural solutions of the problems related to setting the element in space (that is a critical drawback of the microspheres) and its possible fabrication using standard optical materials and established planar microfabrication technologies.

Figure 17:
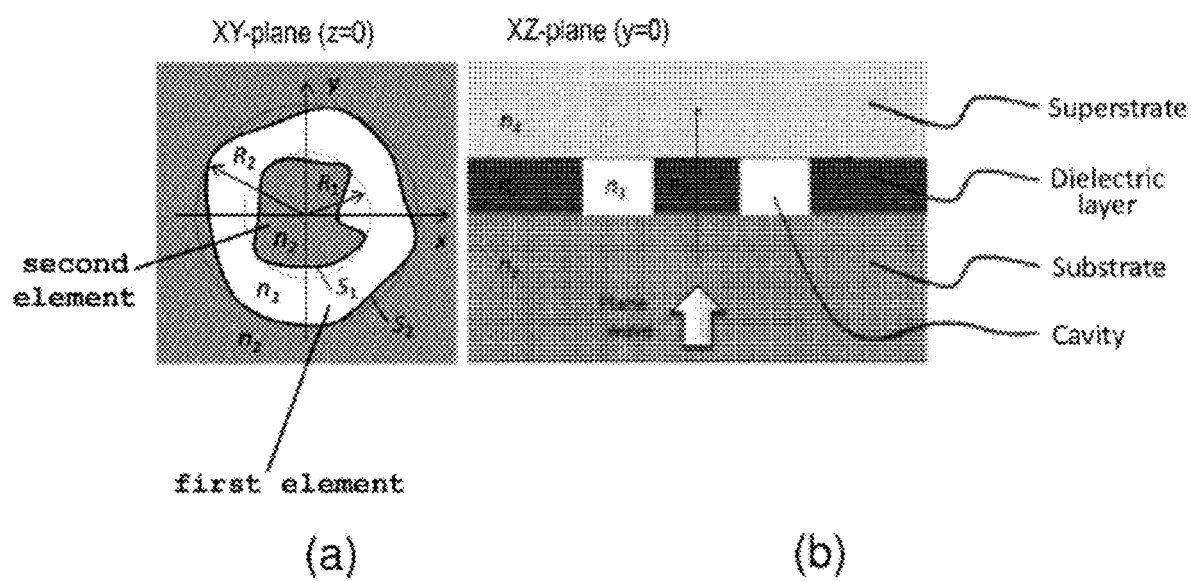
FIGS. 17 (a) and (b) present the topology and notations of the ring-type nanojet elements/components according to one embodiment of the disclosure, that can be used in a photomask in a photolithography system.

A general topology of the ring-type nanojet component is illustrated in FIGS. 17 (a) and (b). It has a form of a double-layer cylinder with an arbitrary cross-section embedded in a homogeneous non-dispersive dielectric host medium. Hereafter, we assume that the core of the cylinder has refractive index $n_2 > n_1$ and that it is made of a material having the same refractive index as the host media, $n_2 = n_3 = n_4$.

For instance, the host media may have a refractive index similar to the one of glass or plastic in the optical range (e.g. $n_2 = 1.49$) with a ring-type cavity filled in with vacuum or air, $n_1 = 1$.

In principle, the cylinder cross-section boundaries $S_1$ (core cylinder) and $S_2$ (external cylinder) can have any shape (symmetrical or non-symmetrical). The impact of the size and shape of each boundary is investigated later in the description. In one embodiment of the disclosure, the cylindrical structures could be oblique and/or truncated and/or comprise a rounded top surface.

Hereafter, we consider cylindrical structures with vertical edges parallel to z-axis and top/bottom surface parallel to xy-plane. However, as mentioned previously, some conical and prismatic structures with arbitrary base angles can also be used. The variation of the base angles associated with different segments of the base edge line can be used to produce nanojet beams with different radiation angles. This option is not discussed here, but one skilled in the art could handle that question according to the teachings of the present disclosure.

In one of its embodiments, the ring-type nanojet element can be implemented in a form of a double-layer circular cylinder. In the following analysis, we assume that its core is filled in with a material same as the host medium ($n_2 = n_3 = 1.49$ for instance) and the outer shell (the cavity) is filled in with vacuum or air ($n_1 = 1$).

Under the above assumption (i.e. double-layer circular cylindrical shape and pre-selected host medium material), configuration of a ring-type nanojet element is controlled by three parameters, namely: its height along z-axis ($L_z$) and radii of the two cylindrical layers ($R_1$ and $R_2 = R_1 + W$, where W is the width of the ring).

Focal Length

Figure 18:
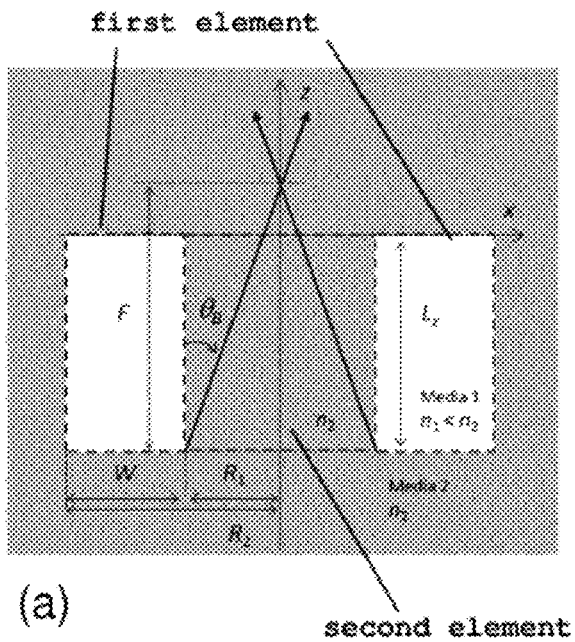
FIG. 18 presents a ring-type nanojet element according to one embodiment of the disclosure ($n_1$=1, $n_2$=1.49): (a) Side view and notations, (b) Power density distribution along z-axis for the element with dimensions $L_z$=740 nm, $R_1$=370 nm, W=500 nm, (c, d) Power density distribution in the xz (y=0) and xy (z=80 nm from top surface) planes.
Figure 18:
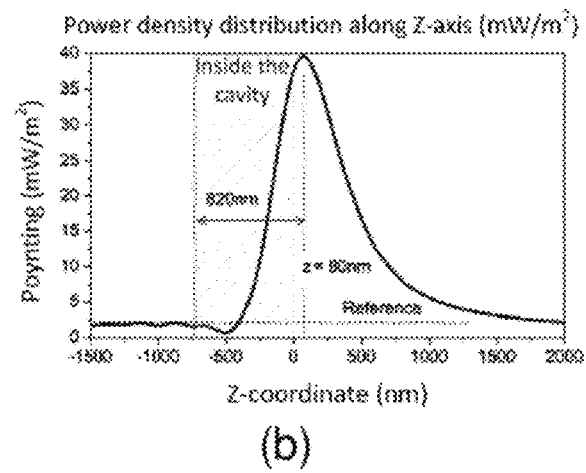
Figure 18:
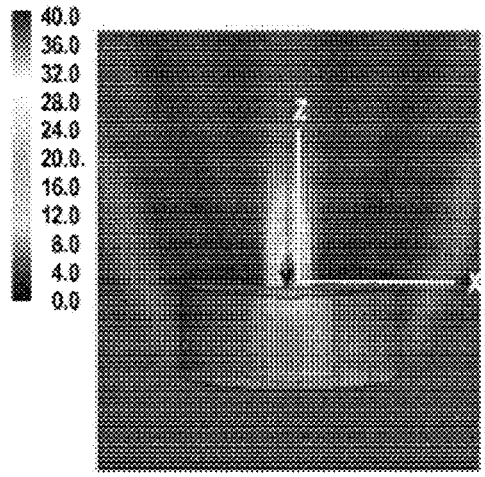
Figure 18:
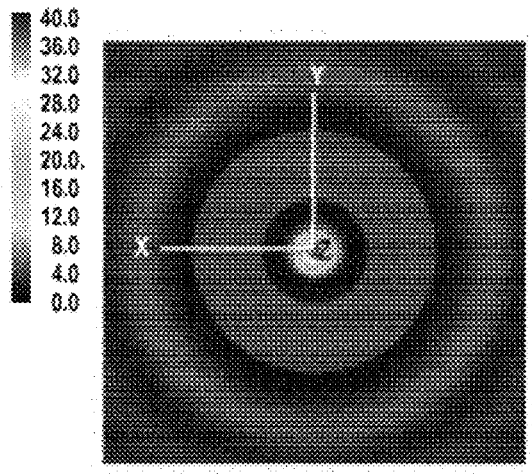

In a first approximation, the focal length of the ring-type nanojet element can be derived as a function of the core radius, $R_1$ and nanojet beam radiation angle, $\theta_B$, defined by equation (4). Under assumption that the nanojet radiation angle remains constant for any combination of the ring-type element height and radii, the focal length of the ring-type element can be estimated as:

$$F \approx R_1 / \tan(\theta_B), \quad \text{(equation 5)}$$

where F is the distance from the element bottom to the point with maximum field intensity (FIG. 18 (a)).

According to equation (5), in case of a hollow ($n_1 = 1$) ring-type nanojet element embedded in a host medium with a refractive index $n_2 = 1.49$, ($\theta_{TIR} \approx 42°$), the focal length is estimated as $F \approx 2.25 R_1$.

Figure 19:
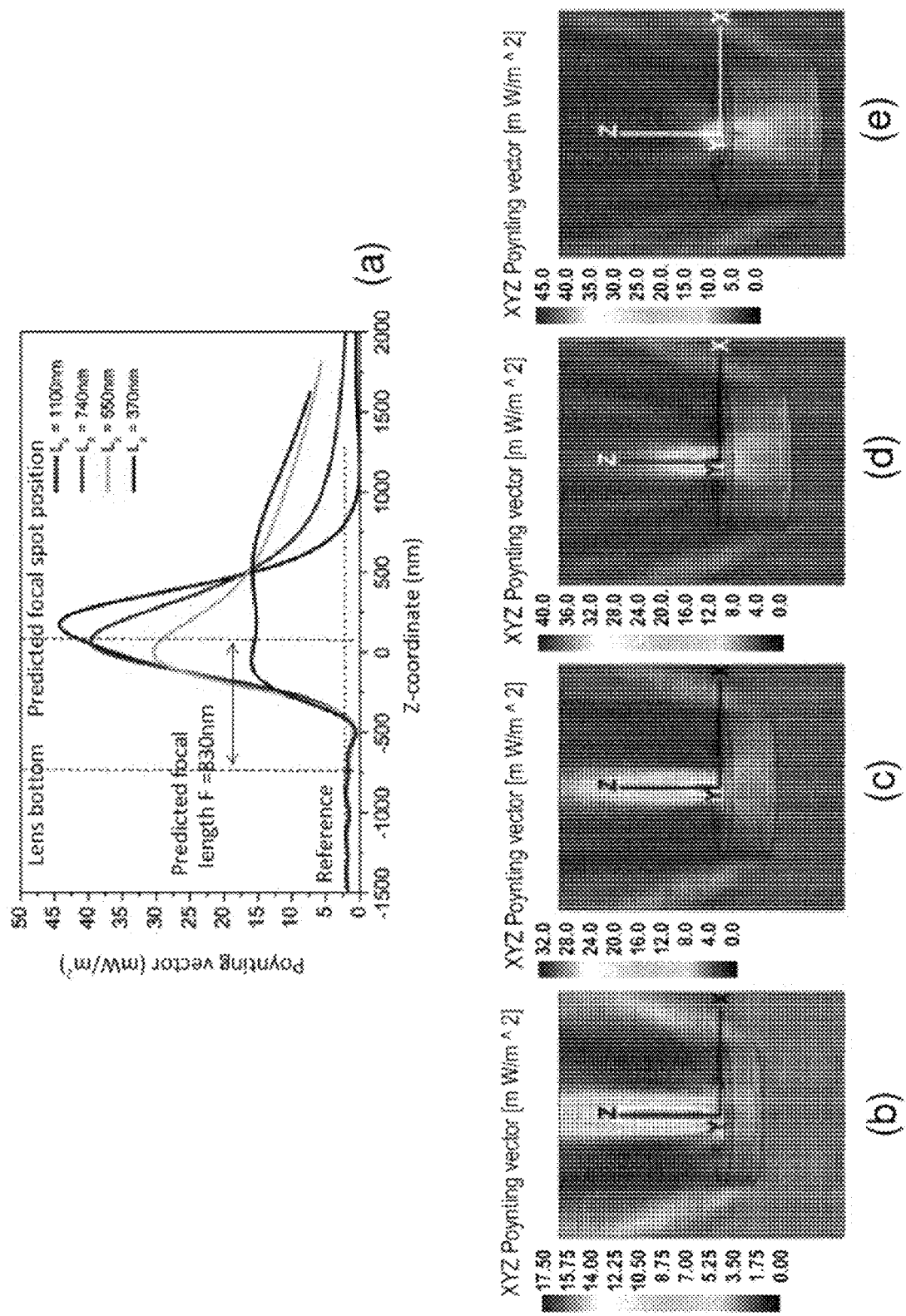
FIG. 19 presents near-field characteristics of the ring-type nanojet element according to one embodiment of the disclosure, with dimensions $R_1$=370 nm, W=500 nm, refractive indexes $n_1$=1, $n_2$=1.49, and variable height illuminated by a unit-amplitude plane wave with $\lambda_0$=550 nm: (a) Power density distribution along z-axis, (b-e) Power density distribution in xz (y=0) plane for the element height of $L_z$=370, 550, 740, and 1100 nm.

As may be seen in FIG. 19, the actual value of the focal length (defined based on the position of a point with a maximum field intensity value) and the length of the nanojet beam can vary depending on the size and shape of the ring-type cavity. The family of four curves in FIG. 19(a) represents the power density distribution along z-axis for the ring-type element having a fixed ring dimensions ($R_1 = 370$ nm, $W = 500$ nm) but different height along z-axis, defined by parameter $L_z$. For an element with a height smaller (or larger) than the focal length, the hot spot is observed closer (or further) than expected, with the best agreement observed for the element with height close to the focal length $L_z \sim F$. Note that all curves in FIG. 19(a) are superimposed in such a way that the element base position coincides for all configurations).

The increase of the beam length observed in FIG. 19 (a) is explained by the interplay between the nanojet and Fresnel-type focusing mechanisms. The contribution of the latter becomes noticeable because of the insufficient height of the cavity, which prevents formation of the nanojet beam (evidenced by a roughly twice smaller value of the peak power density).

Angle of Incidence

Figure 20:
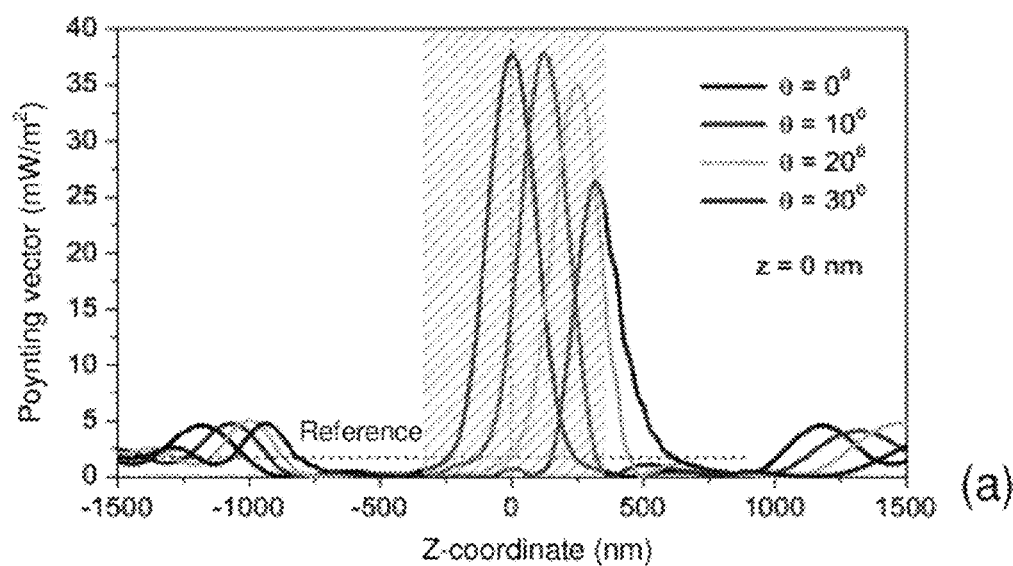
FIG. 20 presents the power density distribution for the ring-type nanojet element according to one embodiment of the disclosure, with dimensions $L_z$=740 nm, $R_1$=370 nm, W=500 nm and refractive indexes ($n_1$=1, $n_2$=1.49) illuminated by a unit-amplitude plane wave with $\lambda_0$=550 nm under different incident angles: (a) along the x-axis (y=z=0), (b-e) in xz-plane for incident angles of 0°, 10°, 20°, 30°, respectively.
Figure 20:
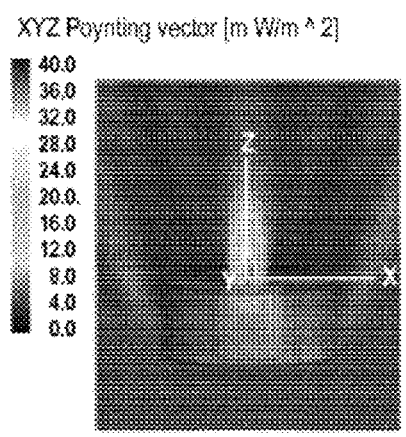
Figure 20:
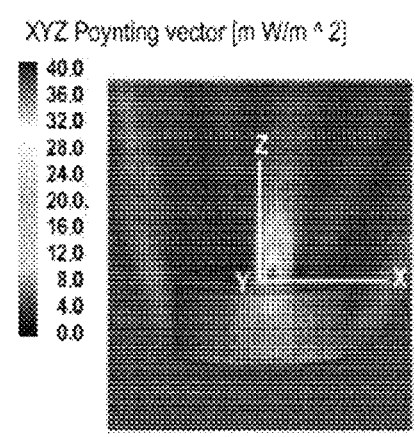
Figure 20:
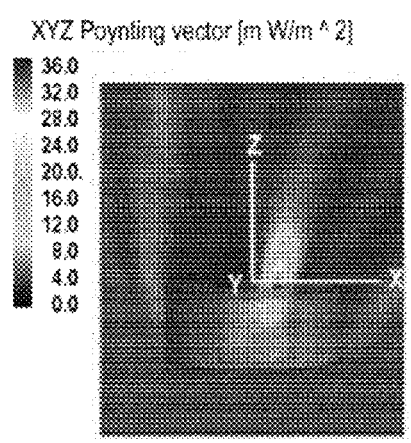
Figure 20:
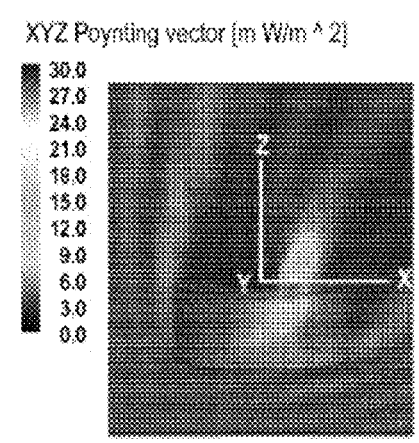

In case of an incline illumination, the nanojet beam angle tilts proportionally to the tilt of the incident wave propagation direction (see the FIG. 20).

Ring Width, W

The width of the ring-type cavity can alter characteristics of the nanojet beam. In particular, it can affect the focal length and beam shape of the ring-type nanojet element.

Although the nanojet beam formation is associated with the base edge of the cavity, there exists a finite-size effective aperture responsible for its formation (see dashed lines in FIG. 16(b)). This aperture extends to about one half of the wavelength in corresponding media on both sides from the lateral surface of the core cylinder. Thus, a minimum recommended width of the ring-type cavity is estimated as $W \leq \frac{1}{2} \lambda_1$, where $\lambda_1 = \lambda_0 / n_1$.

An oversized ring can also affect the nanojet beam formation because of two phenomena associated with the overall size of the ring-type cavity, namely: (i) internal reflections inside the ring-type cavity and (ii) Fresnel-type focusing effect associated with the diffracted waves originating from the top surface of the ring-type cavity. Empirical analysis suggests the upper limit of the width such as $W \approx 3\lambda_1$. For larger rings, the contribution of the ring can become dominant, thus masking the nanojet phenomenon. However, if needed (e.g. for technological needs), the ring width can be enlarged rather arbitrarily without spoiling the nanojet phenomenon (FIG. 21(a)).

Moreover, for each size (height and radius) of the core cylinder, the size of the ring-type cavity can be optimized in order to:

increase the field intensity in the hot spot (FIG. 21),
change the length of the nanojet beam (FIG. 22).

Note that the effects related to the height and width of the ring-type are more narrowband than the nanojet beam phenomenon (FIGS. 23 and 24).

Figure 21:
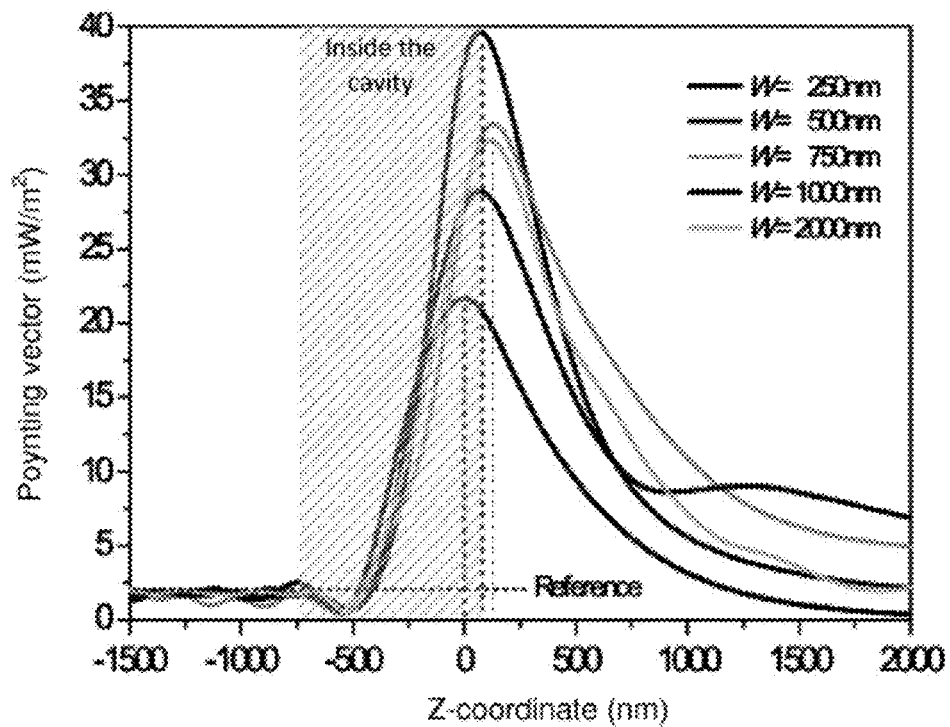
FIG. 21 presents different nanojet beams produced by ring-type element, according to one embodiment of the disclosure, with dimensions $L_z$=740 nm, $R_1$=370 nm, refractive indexes ($n_1$=1, $n_2$=1.49) and variable width of the ring illuminated by a unit-amplitude plane wave with $\lambda_0$=550 nm: (a) power density distribution along z-axis, (b) maximum value of the power density along z-axis (curve referenced 190, left axis) and focal distance (curve referenced 191, right axis) versus width of the ring, (c-f) power density distributions in the xz-plane for W=250, 500, 750, and 1000 nm.
Figure 21:
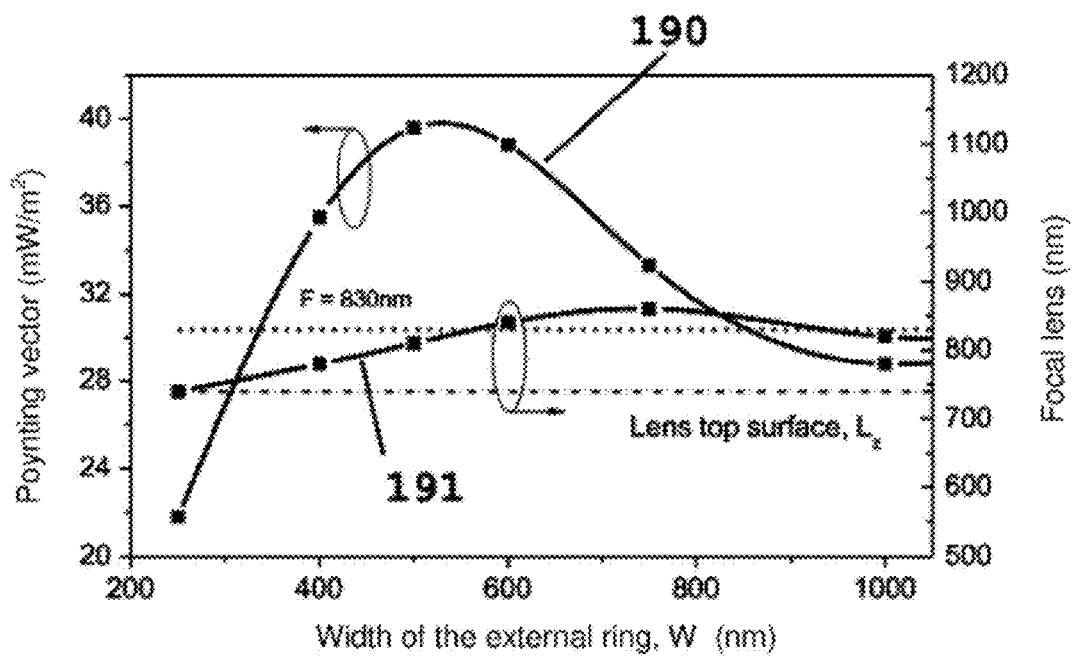
Figure 21:
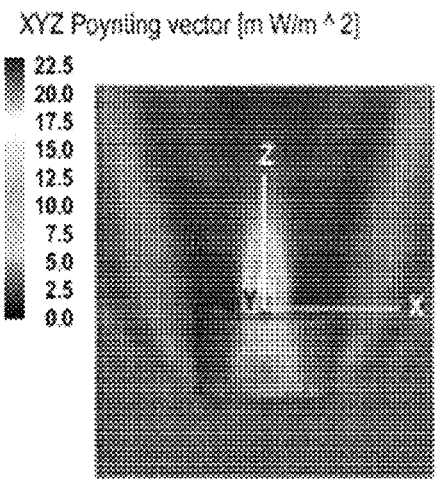
Figure 21:
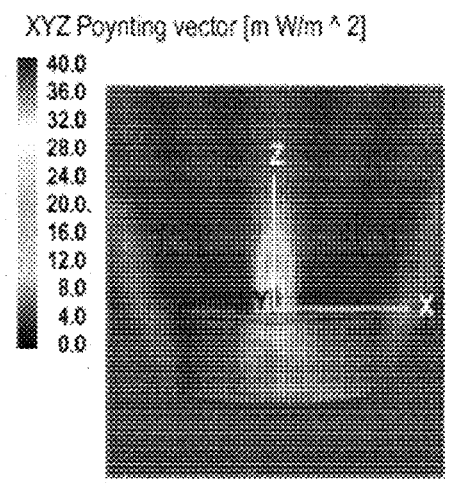
Figure 21:
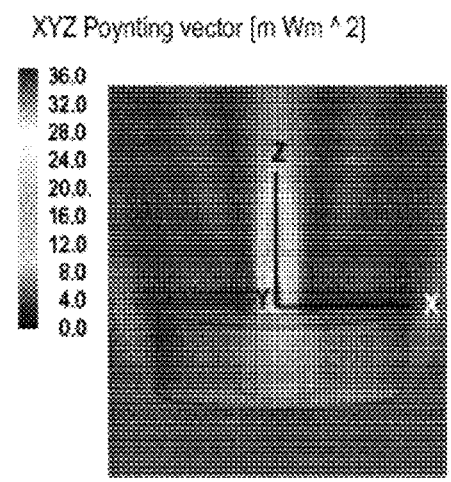
Figure 21:
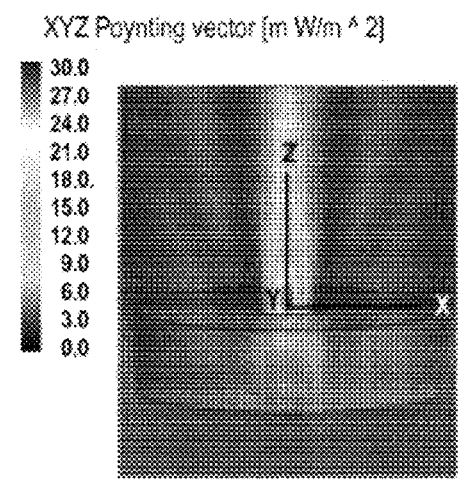

Field Intensity Enhancement by Combining the Nanojet and Fresnel Focusing Effects The impact of the ring width on the maximum field intensity in the hot spot of the ring-type nanojet element is illustrated in FIG. 21. Here, in FIG. 21 (a), one can see the power density distribution along z-axis for the element with a fixed core size ($L_z = 740$ nm, $R_1 = 370$ nm) and variable width of the ring. For convenience, the maximum values of the power density observed for different width of the ring are plotted in FIG. 21 (b) together with the hot spot position. The corresponding near-field patterns are given in FIGS. 21 (c)-(f). As we can see, the maximum power density of ~40 mW/m² is achieved for the ring width $W \approx 500$ nm (i.e. about one wavelength inside the cavity). According to equation (2), the corresponding field intensity enhancement is FIE$\approx$20 a.u. that is 10 times higher than that observed for the hollow cylindrical cavity 111 reported in FIG. 7.

Length of the Nanojet Beam

The impact of the ring width on the length of the nanojet beam is illustrated in FIG. 22. Here, a small height of the element prevents effective generation of the nanojet beams that is evident by a much lower field intensity compared to larger size elements reported FIG. 21. Because of this, the contribution of the Fresnel-type focusing mechanism becomes comparable to the nanojet phenomena. As a result, a longer beam with two maxima along z-axis is created.

Bandwidth of the Nanojet and Fresnel-Type Beam Forming Effects

The difference in the physical mechanisms behind the nanojet and Fresnel-type focusing mechanisms results in a different bandwidth of these two phenomena.

The well-known Fresnel type focusing is based on the interference of the diffracted waves originating from the top surface of the ring cavity. Interference of the waves produced by different segments of the ring top surface can lead to the formation of multiple hot spots and beams corresponding to different diffraction orders. Thus, the radiation direction of these beams, as well as positions of the hot spots, strongly depend on the wavelength of the incident wave. On the opposite, the nanojet beams are created independently at each segment of the cavity base edge line. Because of these, the position and shape of the nanojet beam created on the optical axis of the ring-type element as a result of recombination of nanojet beams produced by different segments of the cavity base edge line, is less sensitive to the incident wave wavelength.

The difference in the dispersive behavior of both types of the focusing mechanisms is illustrated in FIGS. 23 and 24. In FIG. 23, element dimensions correspond to the case, when its behavior is defined by a superposition of the Fresnel type and nanojet phenomena (this configuration corresponds to the one studied in FIG. 22($e$)). Because of this, a significant variation of the nanojet beam length is observed versus wavelength. On the opposite, in FIG. 24, element dimensions are selected so that the beam shape is well preserved for the entire wavelength range (this configuration corresponds to the one studied in FIG. 21($d$)). Such a behavior evidences for the dominant role of the nanojet effect in the formation for the beam.

External Ring Shape, $S_2$

The external shape of the ring can be selected rather arbitrarily.

As we can see in FIG. 25, the variation of the shape of the ring external boundary of the ring (defined by 52) produces only a minor impact on the nanojet beam. For instance, the transformation of the external cylinder cross-section from circular to rectangular results only in a minor decrease (~10%) of the field intensity in the focal spot, whose position remained nearly unchanged for both configurations.

A larger impact can be expected for certain configurations of ring-type elements, when its performance is defined by an interplay of the Fresnel-type and nanojet phenomena (not shown).

Core Size, $R_1$

The core size is a key parameter of the ring-type nanojet element. This parameter determines the hot spot position along z-axis and peak field intensity in the nanojet beam region.

The radius of the core cylinder defines the length and curvature of the edge line and thus the total effective aperture of the nanojet element. The longer the edge, the more power is trapped and guided towards the nanojet beam, thus increasing the field intensity in the focal spot. In case when the core, substrate, and superstrate are of the same material ($n_2=n_3=n_4$, see FIG. 17 for notations), a linear increase of the field intensity versus the core cylinder radius is observed (FIG. 26). In case of a ring-type element structure comprising a stack of several layers of different materials, internal reflections inside the core can appear and alter the nanojet beam formation conditions. The larger the index ratio and the larger the core dimensions, the stronger is a possible impact of internal reflections (i.e. the larger the number of resonant modes that can be supported inside the core cylinder and the higher the quality factors of some of these modes).

Optimal Combination of the Element Height and Radius & Impact of the Host Media Material The optimal ratio between the core height and radius as well as the estimated FIE due to the nanojet focusing effect, is a function of the index ratio between the element core and cavity materials. The full wave analysis of the ring-type nanojet element with a hollow ring ($n_1=1$) embedded in an unbounded host medium with refractive index $n_2=1.49$ revealed that maximum field intensity is achieved for $L_z/R_1 \approx 2$ (FIG. 26($a$)). The corresponding field intensity enhancement is estimated as FIE~18 $R_1/\lambda_1$ [a.u.] (valid at least for $\frac{1}{2} < R_1/\lambda_2 < 2$). In case of $n_1=2.0$, the optimal ratio is defined as $L_z/R_1=1.4$ (FIG. 26($b$)). The corresponding field intensity enhancement is estimated as FIE~16 $R_1/\lambda_1$ [a.u.] (valid at least for $\frac{1}{2} < R_1/\lambda_2 < 3$).

Core Shape, $S_1$

The shape of the core cylinder can be selected rather arbitrarily and optimized in order to provide a desired shape and size of the nanojet beam (FIGS. 27 and 28).

Figure 30:
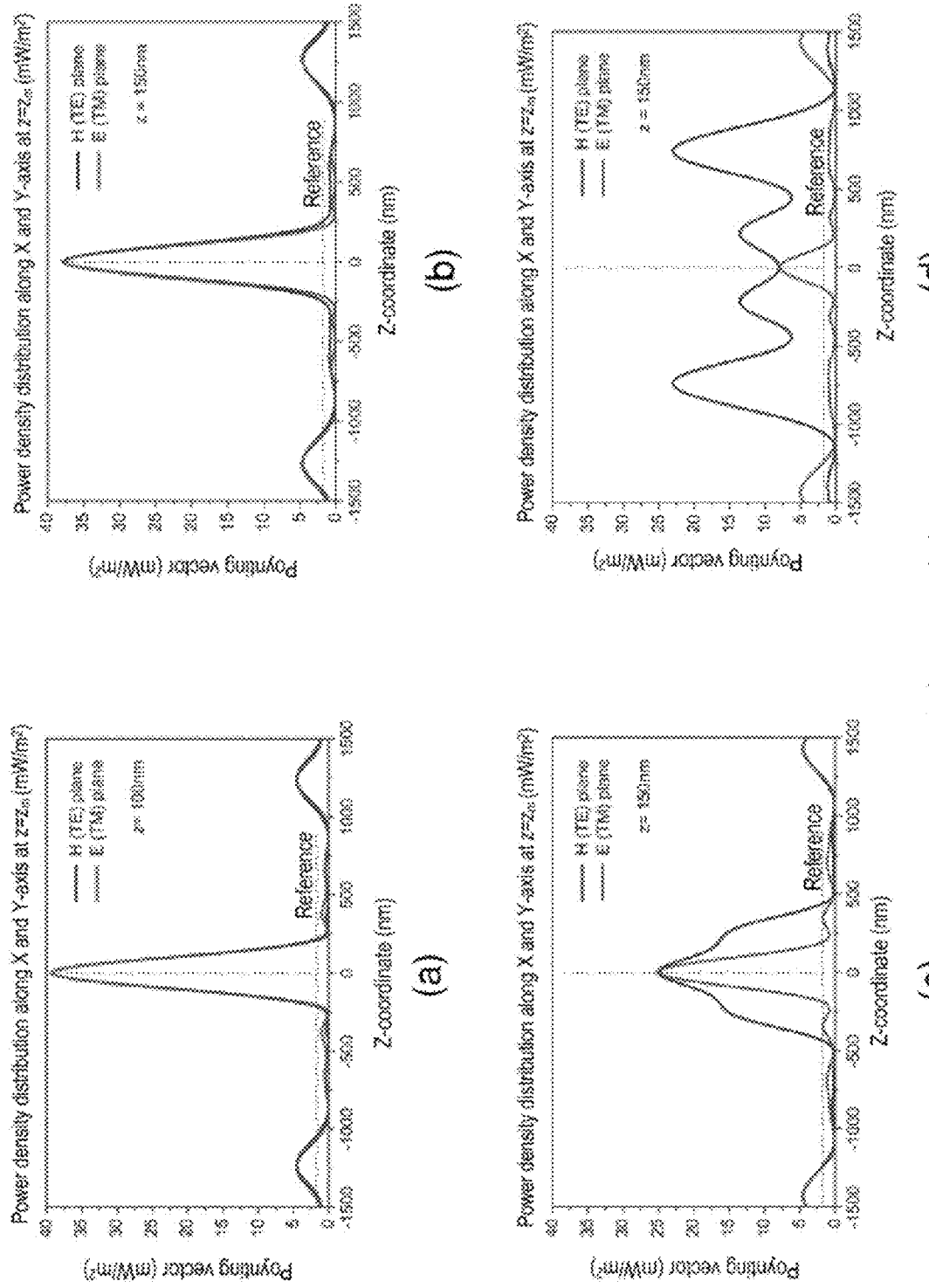

Modification of the core shape of the ring-type nanojet element enables one to modify the partial contributions of the nanojet beams associated with different segments of the core base edge line. A few exemplary embodiments of the ring-type nanojet element with cores of a different shape are illustrated in FIG. 27. The beams contributing to the formation of the central nanojet beam are shown schematically by dashed lines. The corresponding power density distributions for each configuration are shown in FIGS. 28-30. As we can see in FIGS. 28($a$) and 28 ($b$), the transformation of the core cylinder cross-section from a circle to square has only a minor (~10%) impact on the maximum value of the power density in the hot spot (best seen in FIG. 29), whereas the hot spot position and beam symmetry are well preserved for both circular and square configurations (FIGS. 30($a$) and 30($b$)). As we can see in FIGS. 28 ($c$) and 28 ($d$), the transformation of the circular core into a more complex 8-type and bar-type shapes results in the formation of asymmetric beams, whose shape reproduces the shape of the core. Apart from the nanojet beam width and length, the transformation of the core shape also affects the maximum power density in the hot spot of the nanojet beam (FIG. 29). As expected, the maximum value is observed for the circular core (thanks to its symmetry) and the lowest for the element with a bar-type rectangular core. The cross-sectional views of the beams for each configuration are shown in FIG. 30.

FIG. 31 presents a schematic drawing of a use scenario of a nanojet focusing component (or device for forming at least one focused beam in a near zone) according to one embodiment of the disclosure.

In such embodiment, an emitting element (being a light illumination unit) referenced 280 can be any source of the electromagnetic radiation (e.g. light, even UV light) positioned in the near or far zone. The electromagnetic waves, generated by the emitting element 280, can reach the nanojet focusing element referenced 281 (being part of a device for forming at least one focused beam in a near zone or being such device for forming at least one focused beam in a near zone) via free space propagation or through an optical projection unit comprising a set of lenses and/or mirrors and/or other optical components.

The nanojet focusing element 281 can generate nanojet beams in response to the receiving of electromagnetic waves that can be used to create geometric patterns on a photoresist layer element. The photoresist layer element should be located within a certain distance $D \leq R_{max}$ from the nanojet focusing element 281. The optimal distance depends on the focal length and the nanojet beam shape. It can vary from 0 to a few wavelengths. The value of $R_{max}$ is to be defined depending on the specifications for the systems functionality that can be formulated, for instance, in terms of an acceptable field intensity enhancement. A typical value of $R_{max}$ is estimated as 3 to 10 wavelengths.

In one embodiment of the disclosure, the nanojet focusing element 281 is a photomask used in a photolithography process.

It should be noted that, in one embodiment of the disclosure, the nanojet focusing element 281 comprises a multi-layer structure with "cavity(ies)" on one or both surfaces of the sealed substrates. In some configurations, these structures can be directly attached to either the receiving and/or emitting elements.

In one embodiment of the disclosure, the emitting element 280 is a laser.

It should be noted, that in one exemplary embodiment, the ring-type nanojet element previously mentioned can be fabricated in a form of a multi-layer structure comprising three layers, namely: (i) glass plate, (ii) thin film with perforated apertures made of an optically transparent photoresist or phase change material, and (iii) another glass plate such as another thin film of glass.

It should be noted that a photomask according to one embodiment of the disclosure can be fabricated, for instance, via a direct laser beam writing method, replication, or molding. The manufacturing processes of a photomask are given as mere examples, in order to highlight the fabrication feasibility of the device according to the present disclosure, using established microfabrication methods. However, some other manufacturing methods may also exist, or be better suited for a mass production.

FIG. 32 presents two different views of a second element according to one embodiment of the disclosure.

These views present at least three parameters associated with said second element that can control the shape and the orientation of the focused beam: the length and the curvature of the edge line segment associated with the base surface, and also the values of the base angles associated with opposite edge line segments.

FIG. 33 presents a 3D view of a second element according to one embodiment of the disclosure, representing two pairs of opposite edge line segments contributing to the formation of two independent nanojet beams. In case of $L_1 \approx L_2$, the two nanojet beams can recombine in a single beam having a more complex shape (e.g. see FIG. 28(*c*)). In case of $L_1 \ll L_2$, the nanojet beam (2) may appear at a longer distance from the top surface of the element and have a much lower field intensity value than for nanojet beam (1). For instance, such a situation may occur for $L_2 > 5\lambda$, where $\lambda$ is a wavelength in the host medium (i.e. inside the cavity).

FIG. 34 presents the intersection of a part of the device according to the disclosure by a plane that is parallel to the propagation of an incident electromagnetic wave (and more precisely with a normal incident electromagnetic magnetic wave with regards to the bottom of dielectric layer).

FIGS. 35 (*a*)-(*d*), present different resulting intersections of a part of the device according to the disclosure, by a plane that is parallel to the propagation of an incident electromagnetic wave (and more precisely with a normal incident electromagnetic magnetic wave with regards to the bottom of dielectric layer).

It should be noted that the nanojet beams generated thanks to the interference of the two parts of the wave fronts of the incident wave propagating through the base of the first and second elements recombine all together inside the second element giving rise to a focused nanojet beam. In case of a normal incidence of the plane wave, for an element having symmetrical cross-section and equal values of the previously mentioned base angles associated with opposite base edge line segments, a symmetrical nanojet beam is created on the optical axis of the element with an orientation along this axis. It should be noted that, in case of an oblique incidence of the plane wave, the beam is tilted proportionally.

One skilled in the art, by varying the shape and size of the first and second elements and, in particularly, by varying the shape of the base edge line and associated base angles, could control the shape, position, and radiation angle of the nanojet beam(s). Hence, it is possible to control the focusing and beam forming characteristics of the nanojet focusing device according to selected parameters.

FIG. 36 presents schematic drawings of the nanojet beams produced by a device (or ring-type nanojet element), according to one embodiment of the disclosure, that is illuminated by a plane wave: (a) which is incident from below, along z-axis, (b) which is incident from left, along x-axis. The arrows from the first element indicate the nanojet beams. FIG. 36(*c*) presents the power density distributions in xz-plane when the device according to one embodiment of the disclosure (i.e. comprising the ring structure) is illuminated from the left (along x axis).

It should be noted that in the case the plane wave is incident from left, the at least one base surface of the second element previously mentioned correspond to the lateral surface of a cylinder in the common sense with the at least two edge line segments being parts of the cylinder top and bottom edge lines However, one skilled in the art would understand this change of common sense.

Figure 37:
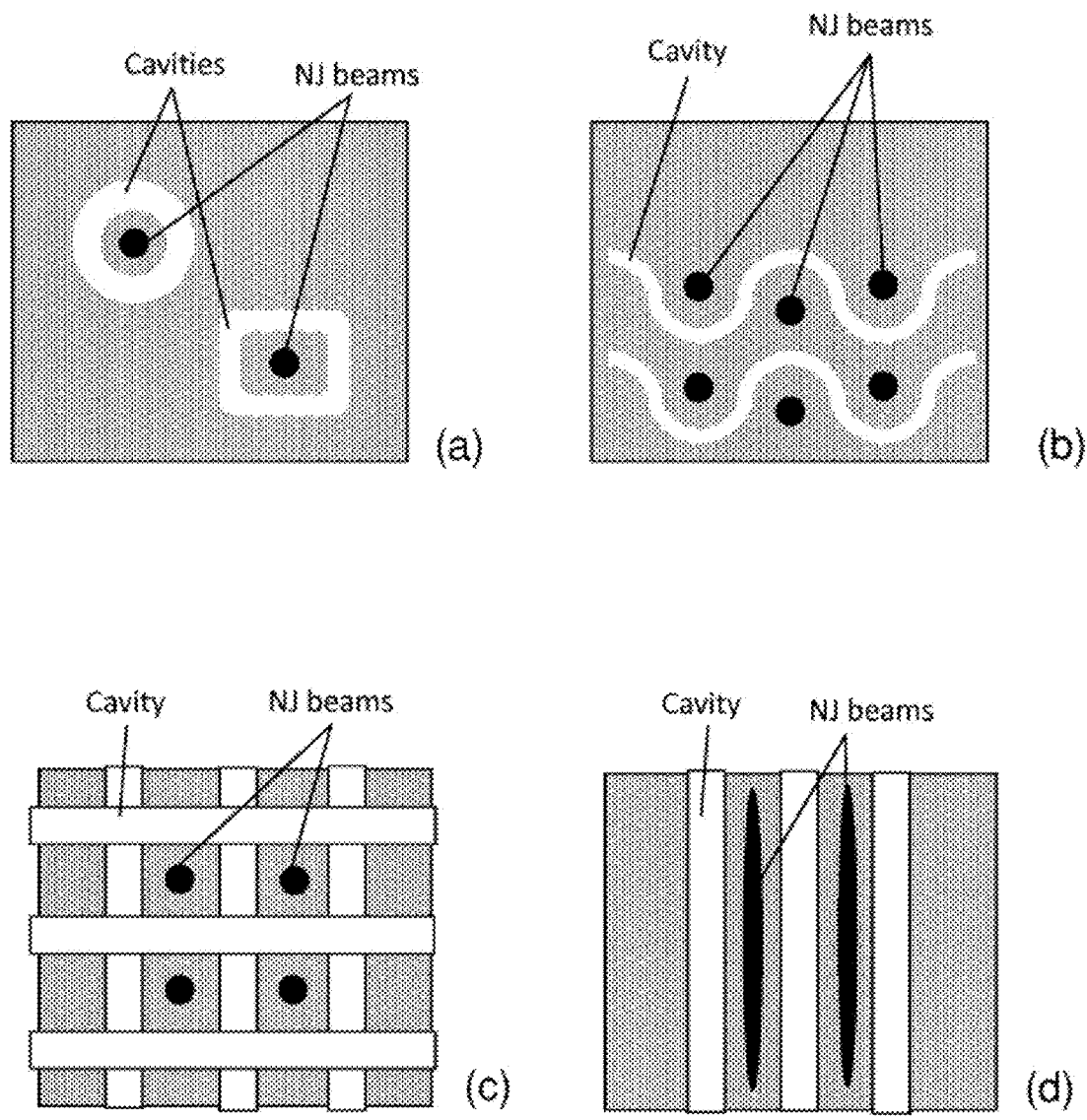

The FIGS. 37(*a*)-(*c*) present some examples of NJ microstructures architectures (from above): (a) ring-type, (b) curved strips, (c) grid, (d) regular or periodic grooves.

The FIG. 38(*a*) present a CAD model of a hollow ring-type NJ element having a form of a double-layer circular cylinder (R1=300 nm, R2=700 nm, H=500 nm) created in glass plate (n1=1.5 nm) placed on top of a photoresist layer (n2=1.7), FIG. 38(*b*) presents a normalized field intensity in YZ-plane when illuminated by a plane wave ($\lambda$=365 nm) from above, FIG. 38(*c*) presents a normalized field intensity distribution along X and Y axes at Z=−100 nm, and FIG. 38(*d*) presents a normalized field intensity distribution along Z-axis. The FIG. 39 presents (a) a normalized field intensity in XZ-plane for the ring-type NJ microlens illuminated by a plane wave ($\lambda$=365 nm) with 20° incidence angle defined with respect to the vertical axis, and (b) a normalized field intensity distribution along X-axis at Y=0 nm, Z=−100 nm for two different incident angles of the plane wave, 0° and 20°. Parameters of the structure are the same as in FIG. 38.

Hence, the photomask according to the present technique enables the manufacturing of complex patterns on a photoresist layer. Indeed, as explained in the previously mentioned article "*Photonic Jet and its Applications in Nano-Photonics*" by Hooman Mohseni, it is also possible to change the orientation of photoresist layer and the mask according to the present disclosure in a same way as the one detailed in FIG. 1(*a*) of this mentioned article. Due to the flexibility (in term of orientation of the generated nanojet beams) induced by the nanojet focusing element, the photomask according to the present technique allows to obtain more complex patterns on the photoresist layer compared to the photomask comprising only nano- (or micro-) spheres.

FIG. 40 presents an example of a photolithography device according to one embodiment of the disclosure.

Such photolithography device referenced 3900 comprises a computing unit (for example a CPU, for "Central Processing Unit"), referenced 3901, and one or more memory units (for example a RAM (for "Random Access Memory") block in which intermediate results can be stored temporarily during the execution of instructions a computer program, or a ROM block in which, among other things, computer programs are stored, or an EEPROM ("Electrically-Erasable Programmable Read-Only Memory") block, or a flash block) referenced 3902. Computer programs are made of instructions that can be executed by the computing unit. Such photolithography device 3900 can also comprise a dedicated unit, referenced 3903, constituting an input-output interface to allow the device 3900 to communicate with other devices. In particular, this dedicated unit 3903 can be connected with an antenna (in order to perform communication without contacts), or with serial ports (to carry communications "contact"). Units 3901, 3902 and 3903 can exchange data through buses for example together.

In addition, the photolithography device 3900 comprises a light illumination unit referenced 3904 (that can be a laser or whatever unit that can generate a light in a photolithography context) than can be piloted by the computing unit 3901. In one embodiment of the disclosure, the photolithography device can comprise an optical projection unit referenced 3905 for guiding the light emitted by the light illumination unit 3904 to a photomask referenced 3906. The photomask 3906 comprises nanojets generating elements according to the present disclosure for generating geometric patterns/structures onto a photoresist layer referenced 3907.

FIG. 41 illustrates a specific embodiment of the present disclosure, according to which the focusing component is based on a 2×2 array of hollow cuboids embedded in a host medium. FIG. 41a illustrates the topology of such a component, while FIG. 41b provides simulation results of the time-averaged power distribution when the component is illuminated by a unit-amplitude plane wave propagating along z-axis ($n_1=1.49$, $L_x=L_y=L_z=2\lambda_1$, $S=0.5\lambda_1$).

The component (or photomask) of FIG. 41a comprises four hollow cuboids ($n_2=1$) 140 embedded in an optically transparent host medium 112 with refractive index $n_1>n_2$. For instance, this can be a glass, plastic (e.g. PMMA), or polymer (e.g. PDMS (Polydimethylsiloxane)).

A nanojet beam is generated on the axis of the 2×2 array of hollow ($n_2=1$) cuboids 140 embedded in a homogeneous dielectric medium 112 with a refractive index $n_1=1.49$ that is a typical value for glass and plastics in the optical range. Analysis shows that, by optimizing the size, shape and relative positions of the cuboids with respect to the host medium refractive index and wavelength of the incident plane wave, a nanojet beam can be generated with the beam full width at half power (FWHP) of $\sim\lambda/2n_1$ and FIE of at least a factor of 5.

FIG. 42 illustrates an alternate embodiment of a photomask, in which the hollow rectangular cuboids 140 are replaced with hollow cylinders 141, oriented along the plane wave propagation direction. As in FIG. 41, FIG. 42a illustrates the topology of such a component, while FIG. 42b provides simulation results of the time-averaged power distribution when the component is illuminated by a unit-amplitude plane wave propagating along z-axis ($n_1=1.49$, $L_z=2\lambda_1$, $R=\lambda_1$, $S=0.5\lambda_1$).

FIG. 43 illustrates yet another embodiment, in which a 2×2 array of hollow cylinders 141 is created at the boundary of the dielectric medium 112 and free space, e.g. on the surface of a glass or plastic plate. When illuminated by a plane wave from the media side, such a component (comprise in a photomask) produces a nanojet beam in free space close to the surface of the plate 112. This embodiment can be advantageous for applications that require an air gap between the focusing component and the object under test that is a typical scenario for optical data storage, microscopy, spectroscopy, and metrology systems.

As in FIG. 42, FIG. 43a illustrates the topology of such a component based on a 2×2 array of hollow cylinders created at the interface of the dielectric medium and free space, while FIG. 43b provides simulation results of the time-averaged power distribution when the component is illuminated by a unit-amplitude plane wave propagating along z-axis ($n_1=1.49$, $Lz=2\lambda_1$, $R=\lambda_1$, $S=0.5\lambda_1$).

FIG. 44 provides two additional exemplary embodiments based on single-periodic (FIG. 44a) and double-periodic (FIG. 44b) arrays of hollow cylinders 141 embedded in a host medium 112, and comprised in a photomask according to one embodiment of the disclosure. In both embodiments, the hollow cylinders form a number of regularly-spaced sub-arrays of 2×2 closely-positioned scatterers that act like the component illustrated in FIG. 42. Note that in case of FIG. 44b, each hollow cylinder 141 simultaneously contributes to the formation of four nanojets referenced 180.

The invention claimed is:

1. A photolithography device for generating structure on a photoresist substrate, the photolithography device comprising:
   a light illumination unit;
   a photomask;
   said photomask comprising at least one layer of dielectric material; and
   a medium having a refractive index lower than that of said dielectric material,
   wherein a surface of said at least one layer of dielectric material comprises at least one element capable of generating nanojet beams having at least one abrupt change of level forming a step and wherein at least a base and lateral part of said surface, with respect to said step and a direction of an electromagnetic wave from said light illumination unit, is in contact with said medium.

2. The photolithography device according to claim 1, wherein said step is formed by an edge of at least one cavity made in said at least one layer of dielectric material, and said cavity is at least partly filled in with said medium.

3. The photolithography device according to claim 2, wherein said at least one cavity is a through-hole in said at least one layer of dielectric material.

4. The photolithography device according to claim 2, wherein said at least one cavity belongs to at least one set of at least two cavities.

5. The photolithography device according to claim 2, wherein said at least one cavity is targeted to be cylindrical or cone-shaped.

6. The photolithography device according to claim 1, wherein said step is formed by an edge of at least one groove made in said at least one layer of dielectric material, and said groove is at least partly filled in with said medium.

7. The photolithography device according to claim 1, wherein a height H of said step is targeted to be such that $$H > \frac{\lambda_1}{2},$$

where $\lambda_1$ is a wavelength of said electromagnetic wave in said dielectric material.

8. The photolithography device according to claim 1, further comprising at least one layer forming a substrate abutting said layer of dielectric material.

9. The photolithography device according to claim 1, wherein said dielectric material belongs to the group comprising:
- glass;
- plastic;
- a polymer material.

10. The photolithography device according to claim 1, further comprising an optical projection unit for guiding light coming from said light illumination unit.

11. The photolithography device according to claim 10, wherein said optical projection unit comprises a set of lenses and/or mirrors.

12. The photolithography device according to claim 1, wherein said dielectric material is an optically transparent dielectric material.

13. The photolithography device according to claim 1, wherein said medium is either a solid or a liquid or a gas.

\* \* \* \* \*